(12) United States Patent
Yu et al.

(10) Patent No.: US 7,680,108 B2
(45) Date of Patent: Mar. 16, 2010

(54) DIGITAL BROADCASTING TRANSMISSION AND RECEPTION SYSTEMS FOR STREAM INCLUDING NORMAL STREAM AND TURBO STREAM AND METHODS THEREOF

(75) Inventors: Jung-pil Yu, Suwon-si (KR); Eui-jun Park, Seoul (KR); Yong-sik Kwon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 927 days.

(21) Appl. No.: 11/416,457

(22) Filed: May 3, 2006

(65) Prior Publication Data

US 2007/0091885 A1 Apr. 26, 2007

Related U.S. Application Data

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005.

(51) Int. Cl.
 *H04L 12/56* (2006.01)
(52) U.S. Cl. ................. 370/389; 370/476; 370/535; 375/240; 714/755
(58) Field of Classification Search ................ None
 See application file for complete search history.

(56) References Cited

U.S. PATENT DOCUMENTS

| 6,373,831 | B1 | 4/2002 | Secord et al. |
| 6,665,829 | B2 | 12/2003 | Eroz et al. |
| 6,910,170 | B2 | 6/2005 | Choi et al. |
| 6,958,781 | B2 * | 10/2005 | Fimoff ............... 348/555 |

7,111,221 B2 * 9/2006 Birru et al. ............... 714/755

(Continued)

FOREIGN PATENT DOCUMENTS

JP 2000-244424 9/2000

(Continued)

OTHER PUBLICATIONS

International Search Report mailed on Feb. 5, 2007, in International Application No. PCT/KR2006/004299.

(Continued)

*Primary Examiner*—Daniel J. Ryman
*Assistant Examiner*—Brian Roberts
(74) *Attorney, Agent, or Firm*—Sughrue Mion, PLLC

(57) ABSTRACT

A method for processing a dual transport stream (TS) which is multiplexed from a normal stream and a turbo stream is provided for a digital broadcasting transmission/reception system. The digital broadcasting signal processing method includes encoding a dual transport stream (TS) which is multiplexed from a normal steam and a turbo stream; interleaving the encoded dual transport stream (TS); turbo-processing by detecting the turbo stream from the interleaved dual transport stream (TS), encoding the detected turbo stream, stuffing the encoded turbo stream into the dual transport stream (TS), and compensating a parity corresponding to the encoded turbo stream; and trellis-encoding the turbo-processed dual transport stream (TS). Accordingly, the digital broadcasting reception performance can be improved in diverse environments.

28 Claims, 29 Drawing Sheets

U.S. PATENT DOCUMENTS

| | | | | |
|---|---|---|---|---|
| 2003/0079173 | A1* | 4/2003 | Birru | 714/792 |
| 2004/0028076 | A1* | 2/2004 | Strolle et al. | 370/466 |
| 2004/0057535 | A1* | 3/2004 | Strolle et al. | 375/340 |
| 2005/0097428 | A1* | 5/2005 | Chang et al. | 714/776 |
| 2005/0275573 | A1* | 12/2005 | Raveendran | 341/120 |

FOREIGN PATENT DOCUMENTS

| | | |
|---|---|---|
| JP | 2000-244841 | 9/2000 |
| JP | 2004-194265 | 7/2004 |
| WO | WO 02/03678 A2 | 1/2002 |
| WO | WO 2005/120062 A1 | 12/2005 |
| WO | WO 2006/101359 A1 | 9/2006 |

OTHER PUBLICATIONS

Written Opinion of the International Searching Authority mailed on Feb. 5, 2007, in International Application No. PCT/KR2006/004299.
International Search Report mailed on Feb. 5, 2007, in International Application No. PCT/KR2006/004322.
Written Opinion of the International Searching Authority mailed on Feb. 5, 2007, in International Application No. PCT/KR2006/004322.
International Search Report mailed on Feb. 6, 2007, in International Application No. PCT/KR2006/004319.
Written Opinion of the International Searching Authority mailed on Feb. 6, 2007, in International Application No. PCT/KR2006/004319.
U.S. Appl. No. 11/416,254, filed May 3, 2006, Jung-pil Yu et al., Samsung Electronics Co., Ltd.
U.S. Appl. No. 11/416,258, filed May 3, 2006, Yong-sik Kwon et al., Samsung Electronics Co., Ltd.
U.S. Appl. No. 11/503,970, filed Aug. 15, 2006, Jung-pil Yu et al., Samsung Electronics Co., Ltd.
U.S. Appl. No. 11/504,024, filed Aug. 15, 2006, Jung-pil Yu et al., Samsung Electronics Co., Ltd.
U.S. Appl. No. 11/504,027, filed Aug. 15, 2006, Jung-pil Yu et al., Samsung Electronics Co., Ltd.
U.S. Appl. No. 11/504,029, filed Aug. 15, 2006, Jung-pil Yu et al., Samsung Electronics Co., Ltd.
U.S. Appl. No. 11/504,030, filed Aug. 15, 2006, Jung-pil Yu et al., Samsung Electronics Co., Ltd.
U.S. Appl. No. 11/504,031, filed Aug. 15, 2006, Jung-pil Yu et al., Samsung Electronics Co., Ltd.
U.S. Appl. No. 11/504,038, filed Aug. 15, 2006, Jung-pil Yu et al., Samsung Electronics Co., Ltd.
U.S. Appl. No. 11/504,651, filed Aug. 16, 2006, Jung-pil Yu et al., Samsung Electronics Co., Ltd.
U.S. Appl. No. 11/504,724, filed Aug. 16, 2006, Jung-pil Yu et al., Samsung Electronics Co., Ltd.
U.S. Appl. No. 11/504,725, filed Aug. 16, 2006, Jung-pil Yu et al., Samsung Electronics Co., Ltd.
U.S. Appl. No. 11/504,726, filed Aug. 16, 2006, Jung-pil Yu et al., Samsung Electronics Co., Ltd.
U.S. Appl. No. 11/505,369, filed Aug. 17, 2006, Jung-pil Yu et al., Samsung Electronics Co., Ltd.
U.S. Appl. No. 11/505,894, filed Aug. 18, 2006, Eui-jun Park et al., Samsung Electronics Co., Ltd.
U.S. Appl. No. 11/508,144, filed Aug. 23, 2006, Jung-pil Yu et al., Samsung Electronics Co., Ltd.
U.S. Appl. No. 11/523,716, filed Sep. 20, 2006, Jung-pil Yu et al., Samsung Electronics Co., Ltd.
U.S. Appl. No. 11/692,509, filed Mar. 28, 2007, Hae-joo Jeong et al., Samsung Electronics Co., Ltd.

* cited by examiner

Interleaving Rule = {2,1,3,0}

FIG. 16B

| SYNC | PID | Turbo Data |
|------|-----|------------|
| SYNC | PID | Normal Data |
| SYNC | PID | Normal Data |
| SYNC | PID | Normal Data |

| SYNC | PID | Turbo Data |
|------|-----|------------|
| SYNC | PID | Turbo Data |
| SYNC | PID | Normal Data |
| SYNC | PID | Normal Data |

| SYNC | PID | Turbo Data | | |
|------|-----|-----------|------------|-------------|
| SYNC | PID | AF Header | Turbo Data | Normal Data |
| SYNC | PID | Normal Data | | |
| SYNC | PID | Normal Data | | |

| | 3 bytes | 2 bytes | 128 bytes | 182-128 bytes |
|---|---|---|---|---|
| 1 | PID | AF Header | Turbo data | Normal data |
| 2 | PID | | Normal data | |
| 3 | PID | | Normal data | |
| 4 | PID | | Normal data | |
| 5 | PID | AF Header | Turbo data | Normal data |
| 6 | PID | | Normal data | |
| 7 | PID | | Normal data | |
| 8 | PID | | Normal data | |
| 9 | PID | AF Header | Turbo data | Normal data |
| 10 | PID | | Normal data | |
| 11 | PID | | Normal data | |
| 12 | PID | | Normal data | |
| 13 | PID | AF Header | Turbo data | Normal data |
| 14 | PID | | Normal data | |
| 15 | PID | AF Header | reserved for PCR(6 bytes) | 171 bytes of Normal data |
| 16 | PID | | Normal data | |
| 17 | PID | AF Header | Turbo data | Normal data |
| 18 | PID | | Normal data | |
| 19 | PID | | Normal data | |
| 20 | PID | | Normal data | |
| 21 | PID | AF Header | Turbo data | Normal data |
| 22 | PID | | Normal data | |
| 23 | PID | | Normal data | |
| 24 | PID | | Normal data | |
| 25 | PID | AF Header | Turbo data | Normal data |
| 26 | PID | | Normal data | |
| 27 | PID | | Normal data | |
| 28 | PID | | Normal data | |
| 29 | PID | AF Header | Turbo data | Normal data |
| 30 | PID | | Normal data | |
| 31 | PID | | Normal data | |
| 32 | PID | | Normal data | |
| 33 | PID | AF Header | Turbo data | Normal data |
| 34 | PID | | Normal data | |
| 35 | PID | | Normal data | |
| 36 | PID | | Normal data | |
| 37 | PID | AF Header | Turbo data | Normal data |
| 38 | PID | | Normal data | |
| 39 | PID | | Normal data | |
| 40 | PID | | Normal data | |
| 41 | PID | AF Header | Turbo data | Normal data |
| 42 | PID | | Normal data | |
| 43 | PID | | Normal data | |
| 44 | PID | | Normal data | |
| 45 | PID | AF Header | Turbo data | Normal data |
| 46 | PID | | Normal data | |
| 47 | PID | | Normal data | |
| 48 | PID | | Normal data | |
| 49 | PID | AF Header | Turbo data | Normal data |
| 50 | PID | | Normal data | |
| 51 | PID | | Normal data | |
| 52 | PID | | Normal data | |

FIG. 21A

| A | SYNC | PID | Turbo Data | | | |
|---|------|-----|------------|---|---|---|
|   | 1    | 3   | 184        |   |   |   |

| B | SYNC | PID | AF Header | Stuffing | Stuffing | Normal Data |
|---|------|-----|-----------|----------|----------|-------------|
|   | 1    | 3   | 2         | S        | N        | 182-S-N     |

| C | SYNC | PID | AF Header | SRS | Turbo Data | Normal Data |
|---|------|-----|-----------|-----|------------|-------------|
|   | 1    | 3   | 2         | S   | N          | 182-S-N     |

FIG. 21B

| SYNC | PID | AF Header | SRS | Turbo Data  |
|------|-----|-----------|-----|-------------|
| SYNC | PID | AF Header | SRS | Normal Data |
| SYNC | PID | AF Header | SRS | Normal Data |
| SYNC | PID | AF Header | SRS | Normal Data |
| 1    | 3   | 2         | S   | 182-S       |

FIG. 21C

| SYNC | PID | AF Header | SRS | Turbo Data |
|------|-----|-----------|-----|------------|
| SYNC | PID | AF Header | SRS | Turbo Data |
| SYNC | PID | AF Header | SRS | Normal Data |
| SYNC | PID | AF Header | SRS | Normal Data |
| 1 | 3 | 2 | S | 182-S |

FIG. 21D

| 1 | 3 | 2 | S | N | 182-S-N |
|---|---|---|---|---|---------|
| SYNC | PID | AF Header | SRS | Turbo Data | |
| SYNC | PID | AF Header | SRS | Turbo Data | Normal Data |
| SYNC | PID | AF Header | SRS | Normal Data | |
| SYNC | PID | AF Header | SRS | Normal Data | |
| 1 | 3 | 2 | S | 182-S | |

FIG. 21E

| | 3 bytes | 2 bytes | 1 | 1 | 1 | 1 | 1 | 1 | {4.14.21} | 128 bytes | 182-128 bytes |
|---|---|---|---|---|---|---|---|---|---|---|---|
| 1 | PID | AF Header | | | | | | | | SRS | Turbo Data | Normal Data |
| 2 | PID | AF Header | | | | | | | | SRS | Normal Data |
| 3 | PID | AF Header | | | | | | | | SRS | Normal Data |
| 4 | PID | AF Header | | | | | | | | SRS | Normal Data |
| 5 | PID | AF Header | | | | | | | | SRS | Turbo Data | Normal Data |
| 6 | PID | AF Header | | | | | | | | SRS | Normal Data |
| 7 | PID | AF Header | TDC | | | | | | | SRS | Normal Data |
| 8 | PID | AF Header | TDC | | | | | | | SRS | Normal Data |
| 9 | PID | AF Header | TDC | | | | | | | SRS | Turbo Data | Normal Data |
| 10 | PID | AF Header | TDC | | | | | | | SRS | Normal Data |
| 11 | PID | AF Header | | | | | | | | SRS | Normal Data |
| 12 | PID | AF Header | SRS | TDC | | | | | | SRS | Normal Data |
| 13 | PID | AF Header | SRS | TDC | TDC | | | | | SRS | Turbo Data | Normal Data |
| 14 | PID | AF Header | SRS | TDC | TDC | TDC | | | | SRS | Normal Data |
| 15 | PID | AF Header | reserved for PCR | | | | | | | SRS | Normal Data |
| 16 | PID | AF Header | | | | | | | | SRS | Normal Data |
| 17 | PID | AF Header | | | | | | | | SRS | Turbo Data | Normal Data |
| 18 | PID | AF Header | | | | | | | | SRS | Normal Data |
| 19 | PID | AF Header | TDC | | | | | | | SRS | Normal Data |
| 20 | PID | AF Header | TDC | | | | | | | SRS | Normal Data |
| 21 | PID | AF Header | TDC | | | | | | | SRS | Turbo Data | Normal Data |
| 22 | PID | AF Header | TDC | | | | | | | SRS | Normal Data |
| 23 | PID | AF Header | | | | | | | | SRS | Normal Data |
| 24 | PID | AF Header | SRS | TDC | | | | | | SRS | Normal Data |
| 25 | PID | AF Header | SRS | TDC | TDC | | | | | SRS | Turbo Data | Normal Data |
| 26 | PID | AF Header | SRS | TDC | TDC | TDC | | | | SRS | Normal Data |
| 27 | PID | AF Header | TDC | TDC | TDC | TDC | TDC | | | SRS | Normal Data |
| 28 | PID | AF Header | | | | | | | | SRS | Normal Data |
| 29 | PID | AF Header | | | | | | | | SRS | Turbo Data | Normal Data |
| 30 | PID | AF Header | | | | | | | | SRS | Normal Data |
| 31 | PID | AF Header | TDC | | | | | | | SRS | Normal Data |
| 32 | PID | AF Header | TDC | | | | | | | SRS | Normal Data |
| 33 | PID | AF Header | TDC | | | | | | | SRS | Turbo Data | Normal Data |
| 34 | PID | AF Header | TDC | | | | | | | SRS | Normal Data |
| 35 | PID | AF Header | | | | | | | | SRS | Normal Data |
| 36 | PID | AF Header | SRS | TDC | | | | | | SRS | Normal Data |
| 37 | PID | AF Header | SRS | TDC | TDC | | | | | SRS | Turbo Data | Normal Data |
| 38 | PID | AF Header | SRS | TDC | TDC | TDC | | | | SRS | Normal Data |
| 39 | PID | AF Header | TDC | TDC | TDC | TDC | TDC | | | SRS | Normal Data |
| 40 | PID | AF Header | | | | | | | | SRS | Normal Data |
| 41 | PID | AF Header | | | | | | | | SRS | Turbo Data | Normal Data |
| 42 | PID | AF Header | | | | | | | | SRS | Normal Data |
| 43 | PID | AF Header | TDC | | | | | | | SRS | Normal Data |
| 44 | PID | AF Header | TDC | | | | | | | SRS | Normal Data |
| 45 | PID | AF Header | TDC | | | | | | | SRS | Turbo Data | Normal Data |
| 46 | PID | AF Header | TDC | | | | | | | SRS | Normal Data |
| 47 | PID | AF Header | | | | | | | | SRS | Normal Data |
| 48 | PID | AF Header | SRS | TDC | | | | | | SRS | Normal Data |
| 49 | PID | AF Header | SRS | TDC | TDC | | | | | SRS | Turbo Data | Normal Data |
| 50 | PID | AF Header | SRS | TDC | TDC | TDC | | | | SRS | Normal Data |
| 51 | PID | AF Header | TDC | TDC | TDC | TDC | TDC | | | SRS | Normal Data |
| 52 | PID | AF Header | | | | | | | | SRS | Normal Data |

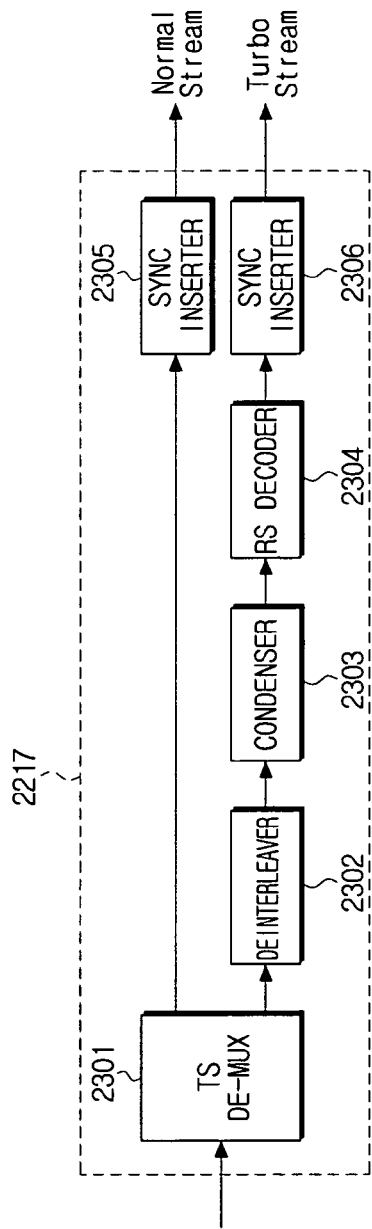
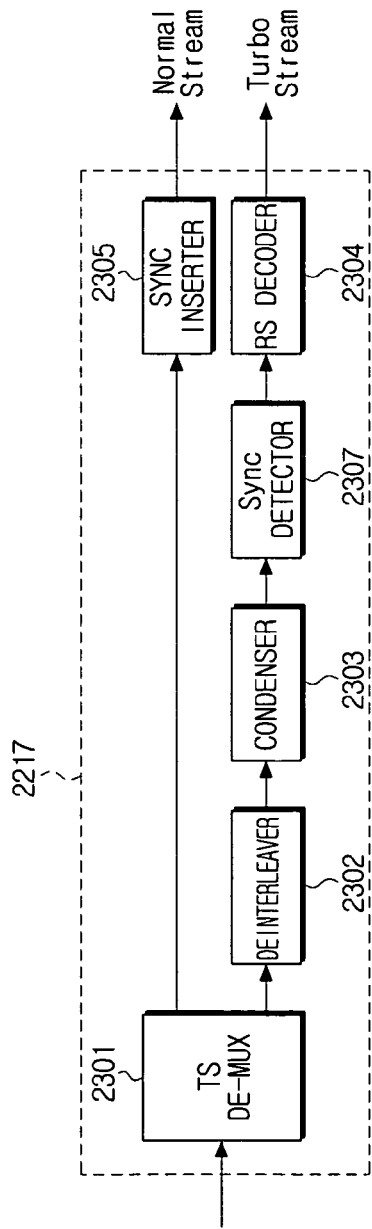

ial-wave digital television (DTV) broadcasting system in the U.S., is a single-carrier system that transmits a field sync signal for each unit of 312 data segments. Therefore, reception performance of the ATSC VSB system is not good on weak channels, specifically, on a Doppler-fading channel.

US 7,680,108 B2

DIGITAL BROADCASTING TRANSMISSION AND RECEPTION SYSTEMS FOR STREAM INCLUDING NORMAL STREAM AND TURBO STREAM AND METHODS THEREOF

CROSS-REFERENCE TO RELATED APPLICATIONS

This application claims the benefit of U.S. Provisional Application No. 60/728,777, filed on Oct. 21, 2005 U.S. Provisional Application No. 60/734,295, filed on Nov. 8, 2005; U.S. Provisional Application No. 60/738,050, filed on Nov. 21, 2005; and U.S. Provisional Application No. 60/739,448, filed on Nov. 25, 2005, the disclosures of which are incorporated herein by reference.

BACKGROUND OF THE INVENTION

1. Field of the Invention

The present invention generally relates to a method for robustly processing and transmitting a digital broadcasting transport stream (TS), digital broadcasting transmission and reception systems, and signal processing methods thereof. More particularly, the present invention relates to a method for robustly processing and transmitting a digital broadcasting transport stream (TS) to enhance reception performance of a terrestrial-wave digital television (DTV) broadcasting system in the U.S. in accordance with the Advanced Television System Committee (ATSC) vestigial sideband (VSB) scheme, through information exchange and mapping with respect to a dual transport stream (TS) which includes a normal stream and a turbo stream, and digital broadcasting transmission and reception systems.

2. Description of the Related Art

The Advanced Television System Committee (ATSC) vestigial sideband (VSB) system, which is a terrestrial-wave digital television (DTV) broadcasting system in the U.S., is a single-carrier system that transmits a field sync signal for each unit of 312 data segments. Therefore, reception performance of the ATSC VSB system is not good on weak channels, specifically, on a Doppler-fading channel.

FIG. 1 is a block diagram of a typical ATSC VSB system including a digital broadcasting transmitter and a digital broadcasting receiver. The digital broadcasting transmitter as shown in FIG. 1, is configured in accordance with the enhanced VSB (E-VSB) system proposed by Philips, and is constructed to generate and transmit a dual stream in which robust or turbo data is added to normal data of the existing ATSC VSB system.

As shown in FIG. 1, the digital broadcasting transmitter includes a randomizer 11 which randomizes the dual stream; a Reed-Solomon (RS) encoder 12 which is a concatenated coder type for adding a parity byte to the transport stream (TS) to correct error occurring due to the channel characteristics in the transmission; an interleaver 13 which interleaves the RS-encoded data in a predetermined pattern; and a trellis encoder 14 which trellis-encodes the interleaved data at ⅔ rate with respect to the interleaved data and maps to 8-level symbols. With this structure, the digital broadcasting transmitter performs error correction coding with respect to the dual stream.

The digital broadcasting transmitter includes a multiplexer 15 and a modulator 16. The multiplexer 15 inserts a field synchronization (sync) and a segment synchronization (sync) to the data which passed through the error correction coding, as shown in accordance with a data format shown in FIG. 2. The modulator 16 inserts a pilot tone by adding a predetermined direct current (DC) value to a data symbol having the inserted segment and field sync signals, performs the VSB modulation by the pulse shaping, up-converts modulated data to a signal of a radio-frequency (RF) channel band, and transmits an up-converted signal.

According to the dual stream scheme which transmits the normal data and the robust (turbo) data through a single channel, the normal data and the robust data is multiplexed (not shown) and fed to the randomizer 11. The input data is randomized at the randomizer 11, the randomized data is outer-coded at the RS encoder 12 which is an outer encoder, and the coded data is spread at the interleaver 13. The interleaved data is inner-coded by a unit of 12 symbols at the trellis encoder 14. After the inner-coded data is mapped to 8-level symbols, the field sync signal and the segment sync signal are inserted in the mapped data. Next, the data is VSB-modulated by inserting the pilot tone, converted to an RF signal, and transmitted.

Meanwhile, the digital broadcasting receiver as shown in FIG. 1, includes a tuner (not shown) which converts the RF signal received through the channel to a baseband signal; a demodulator 21 which performs the sync detection and demodulation with respect to the converted baseband signal; an equalizer 22 which compensates channel distortion occurring by multi-path (multiple transmission paths) with respect to the demodulated signal; a Viterbi decoder 23 which corrects error of the equalized signal and decodes the error-corrected signal to symbol data;, a deinterleaver 24 which rearranges the symbol data spread by the interleaver 13 of the digital broadcasting transmitter; a RS decoder 25 which corrects error; and a derandomizer 26 which outputs an MPEG-2 (Moving Picture Experts Group) transport stream (TS) by derandomizing the data corrected by the RS decoder 25.

Accordingly, the digital broadcasting receiver, as shown in FIG. 1, restores the original signal by down-converting the RF signal to the baseband signal in a reverse operation of the digital broadcasting transmitter, shown in FIG. 1, demodulating and equalizing the down-converted signal, and performing the channel decoding to obtain the original signal.

FIG. 2 shows an example VSB data frame of an ATSC VSB system, in which a segment sync signal and a field sync signal are inserted. As shown in FIG. 2, one frame consists of 2 fields, and one field consists of a field sync segment, which is the first segment, and 312 data segments. In the VSB data frame, one segment corresponds to one MPEG-2 packet, and one segment consists of a 4-symbol segment sync signal and 828 data symbols.

In FIG. 2, the sync signals, which are the segment sync signal and the field sync signal, are used for the synchronization and the equalization at the digital broadcasting receiver, as shown in FIG. 1. That is, the field sync signal and the segment sync signal are known to the digital broadcasting transmitter and the digital broadcasting receiver of the terrestrial-wave digital broadcasting system shown in FIG. 1, and used as reference signals when the digital broadcasting receiver performs equalization.

The U.S. terrestrial-wave digital broadcasting system as shown in FIG. 1, which is constructed to generate and transmit the dual stream by adding the robust (turbo) data to the normal data of the existing ATSC VSB system, transmits the existing normal data together with the robust (turbo) data.

However, the U.S. terrestrial-wave digital broadcasting system as shown in FIG. 1 can not improve the poor reception performance in multi-path channels according to the existing normal data stream transmission although the dual stream is transmitted with the added robust (turbo) data. That is, the U.S. terrestrial-wave digital broadcasting system is disadvantageous in that the reception performance is not improved at all according to the improved normal stream. Moreover, the turbo stream does not improve the reception performance greatly in the multi-path environment either.

SUMMARY OF THE INVENTION

Several aspects and example embodiments of the present invention provide a method for robustly processing and transmitting a digital broadcasting transport stream (TS), digital broadcasting transmission and reception systems, and signal processing methods thereof, which aim to improve reception performance of a terrestrial-wave digital television (DTV) system in the U.S., in accordance with the Advanced Television System Committee (ATSC) vestigial sideband (VSB) through information exchange and mapping with respect to a dual transport stream (TS) including a normal stream and a turbo stream.

Additional aspects and/or advantages of the invention will be set forth in part in the description which follows and, in part, will be obvious from the description, or may be learned by practice of the invention.

In accordance with an embodiment of the present invention, a digital broadcasting transmission signal processing method comprises: (a) encoding a dual transport stream (TS) which is multiplexed from a normal steam and a turbo stream; (b) interleaving the encoded dual transport stream (TS); (c) turbo-processing by detecting the turbo stream from the interleaved dual transport stream (TS), encoding the detected turbo stream, stuffing the encoded turbo stream into the dual transport stream (TS), and compensating a parity corresponding to the encoded turbo stream; and (d) trellis-encoding the turbo-processed dual transport stream (TS).

According to an aspect of the present invention, the digital broadcasting transmission signal processing method may further include generating the dual transport stream (TS) by multiplexing the normal stream and the turbo stream. Such a dual transport stream (TS) may then be randomized before interleaving.

According to an aspect of the present invention, the dual transport stream (TS) may be generated by providing a parity insertion region with respect to the turbo stream; and multiplexing the turbo stream having the parity insertion region, and the normal stream. In addition, Reed-Solomon (RS) encoding may be performed with respect to a turbo stream received from the outside; and interleaving may be provided with respect to the turbo stream.

According to an aspect of the present invention, the operation (c) may include (c1) detecting the turbo stream from the dual transport stream (TS) which is interleaved in the operation (b); (c2) outer-encoding the detected turbo stream by inserting a parity for the detected turbo stream to the parting insertion region; (c3) interleaving the outer-encoded turbo stream; (c4) reconstructing the dual transport stream (TS) by inserting the interleaved turbo stream to the dual transport stream (TS); and (c5) regenerating and adding a parity of the reconstructed dual transport stream (TS) to the dual transport stream (TS).

According to an aspect of the present invention, the operation (c) may further include converting the dual transport stream (TS) interleaved in the operation (b) from the byte to the symbol; and converting the dual transport stream (TS) constructed in the operation (c5) from the symbol to the byte.

According to an aspect of the present invention, the digital broadcasting transmission signal processing method may further include adding a sync signal to the trellis-encoded dual transport stream (TS); and transmitting the dual transport stream (TS) having the added sync signal. The transmission of the dual transport stream (TS) may include inserting a pilot to the dual transport stream (TS) having the added sync signal; equalizing the pilot-inserted dual transport stream (TS); VSB-modulating the equalized dual transport stream (TS); and modulating the VSB-modulated dual transport stream (TS) to a signal of RF channel band and transmitting the modulated signal.

According to an aspect of the present invention, the dual transport stream (TS) may include a field where a plurality of packets is connected, and the turbo stream may be arranged in the packet positioned at a preset interval in the field.

According to another aspect of the present invention, the dual transport stream (TS) may include a field where a plurality of packets are connected, and an option field where packet information of a certain type is recorded may be arranged in a packet which is at a position not overlapping with the turbo stream in the field. The option field may include at least one of program clock reference (PCR), original program clock reference (OPCR), splice countdown, transport private data length, and adaptation field extension length.

According to an aspect of the present invention, the dual transport stream (TS) may include a field where a plurality of packets are connected, and the turbo stream and the normal stream may be arranged in the plurality of packets, respectively.

According to an aspect of the present invention, the generation of the dual transport stream (TS) may include receiving and erasure-encoding the turbo stream.

In accordance with another embodiment of the present invention, a digital broadcasting transmission signal processing method comprises: (a) providing a first parity insertion region with respect to a dual transport stream (TS) which is multiplexed from an erasure-encoded turbo stream and a normal stream; (b) interleaving the dual transport stream (TS) having the first parity insertion region; (c) detecting the turbo stream from the interleaved dual transport stream (TS), encoding the detected turbo stream, and stuffing the encoded turbo stream to the dual transport stream (TS); and (d) deinterleaving the dual transport stream (TS) stuffed with the encoded turbo stream.

According to an aspect of the present invention, the digital broadcasting transmission signal processing method may further include generating a dual transport stream (TS) which is multiplexed from an erasure-encoded turbo stream and a normal stream; and randomizing the dual transport stream (TS).

According to an aspect of the present invention, the generation of the dual transport stream (TS) may include receiving and erasure-encoding a turbo stream; providing a second parity insertion region with respect to the erasure-encoded turbo stream; and generating the dual transport stream (TS) by multiplexing the turbo stream having the second parity insertion region and the normal stream. The generation of the dual transport stream (TS) may further include RS-encoding the erasure-encoded turbo stream; and interleaving the turbo stream.

According to an aspect of the present invention, the operation (c) may include (c1) detecting the turbo stream from the interleaved dual transport stream (TS); (c2) outer-encoding the detected turbo stream by inserting a parity to the second parity insertion region; (c3) interleaving the outer-encoded turbo stream; and (c4) reconstructing the dual transport stream (TS) by stuffing the interleaved turbo stream to the dual transport stream (TS).

According to another aspect of the present invention, the operation (c) may further include converting the interleaved dual transport stream (TS) from the byte to the symbol; and converting the reconstructed dual transport stream (TS) from the symbol to the byte.

According to an aspect of the present invention, the digital broadcasting transmission signal processing method may further include transmitting the deinterleaved dual transport stream (TS). The transmission of the dual transport stream (TS) may include encoding the deinterleaved dual transport stream (TS) by inserting a parity for the deinterleaved dual transport stream (TS) to the first parity insertion region; interleaving the encoded dual transport stream (TS); trellis-encoding the interleaved dual transport stream (TS); adding a sync signal to the trellis-encoded dual transport stream (TS); and channel-modulating and transmitting the dual transport stream (TS) having the added sync signal.

In accordance with yet another embodiment of the present invention, a digital broadcasting transmission signal processing method comprises: (a) receiving a dual transport stream (TS) which is multiplexed from a normal stream and a turbo stream, and inserting a supplementary reference signal (SRS) to a stuffing region in the dual transport stream (TS); (b) encoding the dual transport stream (TS) having the inserted SRS; (c) interleaving the encoded dual transport stream (TS); (d) turbo-processing the dual transport stream (TS) by detecting the turbo stream from the interleaved dual transport stream (TS), encoding the detected turbo stream, stuffing the encoded turbo stream to the dual transport stream (TS), and compensating a parity corresponding to the encoded turbo stream; and (e) trellis-encoded the turbo-processed dual transport stream (TS).

According to an aspect of the present invention, the digital broadcasting transmission signal processing method may further include generating the dual transport stream (TS) by multiplexing the normal stream and the turbo stream; and randomizing the dual transport stream (TS).

According to an aspect of the present invention, the dual transport stream (TS) may be generated by providing a parity insertion region with respect to the turbo stream; and multiplexing the turbo steam having the parity insertion region and the normal steam. The generation of the dual transport stream (TS) may include RS-encoding a turbo stream received from outside; and interleaving the turbo stream.

According to an aspect of the present invention, the operation (d) may include (d1) detecting the turbo stream from the interleaved dual transport stream (TS); (d2) outer-encoding turbo stream by inserting a parity for the detected turbo stream to the parity insertion region; (d3) interleaving the outer-encoded turbo stream; (d4) reconstructing the dual transport stream (TS) by inserting the interleaved turbo stream to the dual transport stream (TS); and (d5) regenerating a parity of the reconstructed dual transport stream (TS) and adding the parity to the dual transport stream (TS).

According to an aspect of the present invention, the operation (d) may further include converting the interleaved dual transport stream (TS) from the byte to the symbol; and converting the dual transport stream (TS) having the regenerated parity from the symbol to the byte.

According to an aspect of the present invention, the digital broadcasting transmission signal processing method may further include adding a sync signal to the trellis-encoded dual transport stream (TS); and transmitting the dual transport stream (TS) having the sync signal. The transmission of the dual transport stream (TS) may include inserting a pilot to the dual transport stream (TS) having the added sync signal; equalizing the pilot-inserted dual transport stream (TS); VSB-modulating the equalized dual transport stream (TS); and modulating the VSB-modulated dual transport stream (TS) to a signal of RF channel band and transmitting the modulated dual transport stream (TS). The generating of the dual transport stream (TS) may include receiving and erasure-encoding the turbo stream.

According to an aspect of the present invention, the operation (e) may include initializing a trellis encoder for performing the trellis-encoding; and compensating a parity of the dual transport stream (TS) using a parity as to an initialization value corresponding to a value pre-stored in the trellis encoder.

In accordance with yet another embodiment of the present invention, a digital broadcasting transmission signal processing method comprises: (a) generating a dual transport stream (TS) which is multiplexed from an erasure-encoded turbo stream and a normal stream; (b) inserting a SRS in a stuffing region in the dual transport stream (TS); (c) providing a first parity insertion region in the SRS-inserted dual transport stream (TS); (d) interleaving the dual transport stream (TS) having the first parity insertion region; (e) turbo-processing the dual transport stream (TS) by detecting the turbo stream from the interleaved dual transport stream (TS), encoding the detected turbo stream, and stuffing the encoded turbo stream to the dual transport stream (TS); and (f) deinterleaving the turbo-processed dual transport stream (TS).

According to an aspect of the present invention, the digital broadcasting transmission signal processing method may further include randomizing the generated dual transport stream (TS).

According to an aspect of the present invention, the operation (a) may include receiving and erasure-encoding a turbo stream; providing a second parity insertion region in the erasure-encoded turbo stream; and generating the dual transport stream (TS) by multiplexing the turbo stream having the second parity insertion region and the normal stream. The operation (a) may include RS-encoding the erasure-encoded turbo stream; and interleaving the turbo stream.

According to an aspect of the present invention, the operation (e) may include (e1) detecting the turbo stream from the interleaved dual transport stream (TS); (e2) outer-encoding the turbo stream by inserting a parity for the detected turbo stream to the second parity insertion region; (e3) interleaving the outer-encoded turbo stream; and (e4) reconstructing the dual transport stream (TS) by stuffing the interleaved turbo stream to the dual transport stream (TS).

According to another aspect of the present invention, the operation (e) may include converting the interleaved dual transport stream (TS) from the byte to the symbol; and converting the reconstructed dual transport stream (TS) from the symbol to the byte.

According to an aspect of the present invention, the digital broadcasting transmission signal processing method may further include transmitting the deinterleaved dual transport stream (TS). The transmission of the dual transport stream (TS) may include encoding the dual transport stream (TS) by inserting a parity for the deinterleaved dual transport stream (TS) to the first parity insertion region; interleaving the encoded dual transport stream (TS); trellis-encoding the interleaved dual transport stream (TS); adding a sync signal to the trellis-encoded dual transport stream (TS); and channel-modulating and transmitting the dual transport stream (TS) having the added sync signal.

According to an aspect of the present invention, the trellis encoding may include initializing a trellis encoder for performing the trellis encoding; and compensating a parity of the dual transport stream (TS) using a parity as to an initialization value corresponding to a value pre-stored to the trellis encoder.

In accordance with an embodiment of the present invention, a digital broadcasting transmission system comprises: a RS encoder for encoding a dual transport stream (TS) which is multiplexed from a normal stream and a turbo stream; an interleaver for interleaving the dual transport stream (TS) encoded at the RS encoder; a turbo processor for detecting a turbo stream from the dual transport stream (TS) interleaved at the interleaver, encoding the detected turbo stream, stuffing the encoded turbo stream to the dual transport stream (TS), and compensating a parity corresponding to the encoded turbo stream; and a trellis encoder block for trellis-encoding the dual transport stream (TS) processed at the turbo processor.

According to an aspect of the present invention, the digital broadcasting transmission system may further include a TS generator which generates the dual transport stream (TS) by multiplexing the normal stream and the turbo stream.

According to an aspect of the present invention, the digital broadcasting transmission system may further include a randomizer which randomizes the dual transport stream (TS) generated at the TS generator, and provides the randomized dual transport stream (TS) to the RS encoder.

According to an aspect of the present invention, the TS generator may include a duplicator for providing a parity insertion region with respect to the turbo stream and a service multiplexer (MUX) for receiving a normal stream and generating the dual transport stream (TS) by multiplexing the normal stream with the turbo stream processed at the duplicator.

According to another aspect of the present invention, the TS generator may include a RS encoder for receiving and RS-encoding a turbo stream, and providing the RS-encoded turbo stream to the duplicator; and an interleaver for interleaving the turbo stream.

According to an aspect of the present invention, the turbo processor may include a turbo stream detector for detecting the turbo stream from the interleaved dual transport stream (TS); an outer encoder for inserting a parity for the detected turbo stream to the parity insertion region; an outer interleaver for interleaving the turbo stream processed at the outer encoder; a turbo stream stuffer for reconstructing the dual transport stream (TS) by inserting the interleaved turbo stream to the dual transport stream (TS); and a parity compensator for regenerating a parity of the reconstructed dual transport stream (TS) and adding the parity to the dual transport stream (TS).

According to an aspect of the present invention, the turbo processor may further include a byte-symbol converter for converting the dual transport stream (TS) interleaved at the interleaver from the byte to the symbol; and a symbol-byte converted for converting the dual transport stream (TS) processed at the parity compensator from the symbol to the byte.

According to an aspect of the present invention, the digital broadcasting transmission system may further include a MUX for adding a sync signal to the trellis-encoded dual transport stream (TS); and a transmitter for transmitting the dual transport stream (TS) having the added sync signal.

According to an aspect of the present invention, the transmitter may include a pilot inserter for inserting a pilot to the dual transport stream (TS) having the added sync signal; a pre-equalizer for equalizing the pilot-inserted dual transport stream (TS): a VSB modulator for VSB-modulating the equalized dual transport stream (TS); and a RF modulator for modulating the VSB-modulated dual transport stream (TS) to a signal of RF channel band.

According to an aspect of the present invention, the TS generator may include an erasure encoder for receiving and erasure-encoding a turbo stream.

In accordance with another embodiment of the present invention, a digital broadcasting transmission system comprises: a TS generator for generating a dual transport stream (TS) by multiplexing an erasure-encoded turbo stream and a normal stream; and an exciter for detecting the turbo stream from the dual transport stream (TS), encoding the detected turbo stream, stuffing the encoded turbo stream to the dual transport stream (TS), and outputting the dual transport stream (TS).

According to an aspect of the present invention, the exciter may include a randomizer for randomizing the dual transport stream (TS) generated at the TS generator; a parity generator for providing a first parity insertion region in the randomized dual transport stream (TS); a first interleaver for interleaving the dual transport stream (TS) having the first parity insertion region; a turbo processor for detecting a turbo stream from the interleaved dual transport stream (TS), encoding the detected turbo stream, and stuffing the encoded turbo stream to the dual transport stream (TS); a deinterleaver for deinterleaving the dual transport stream (TS) stuffed with the encoded turbo stream; and a transmitter for transmitting the deinterleaved dual transport stream (TS).

According to an aspect of the present invention, the TS generator may include an erasure-encoder for receiving and erasure-encoding turbo stream; a duplicator for providing a second parity insertion region with respect to the erasure-encoded turbo stream; and a service MUX for generating the dual transport stream (TS) by multiplexing the turbo stream having the second parity insertion region and the normal stream. The TS generator may further include a first RS encoder for RS-encoding the erasure-encoded turbo stream; and an interleaver for interleaving the RS-encoded turbo stream.

According to an aspect of the present invention, the turbo processor may include a TX demultiplexer (DE-MUX) for detecting the turbo stream from the interleaved dual transport stream (TS); an outer encoder for inserting a parity for the detected turbo stream to the second parity insertion region; an outer interleaver for interleaving the parity-inserted turbo stream; and a TS MUX for reconstructing the dual transport stream (TS) by stuffing the interleaved turbo stream to the dual transport stream (TS). The turbo processor may further include a byte-symbol converter for converting the interleaved dual transport stream (TS) from the byte to the symbol; and a symbol-byte converted for converting the reconstructed dual transport stream (TS) from the symbol to the byte.

According to an aspect of the present invention, the transmitter may include a second RS encoder for encoding the deinterleaved dual transport stream (TS) by inserting a parity for the dual transport stream (TS) to the first parity insertion region; a second interleaver for interleaving the encoded dual transport stream (TS); a trellis encoder for trellis-encoding the interleaved dual transport stream (TS); a MUX for adding a sync signal to the trellis-encoded dual transport stream (TS); and a modulator for channel-modulating the dual transport stream (TS) having the added sync signal and transmitting the channel-modulated dual transport stream (TS).

In accordance with yet another embodiment of the present invention, a digital broadcasting transmission system comprises: a SRS inserter for receiving a dual transport stream (TS) multiplexed from a normal stream and a turbo stream, and inserting a SRS to a stuffing region provided in the dual transport stream (TS); a RS encoder for encoding the dual transport stream (TS) having the inserted SRS; an interleaver for interleaving the encoded dual transport stream (TS); a turbo processor for detecting a turbo stream from the interleaved dual transport stream (TS), encoding the detected turbo stream, stuffing the encoded turbo stream to the dual transport stream (TS), and compensating a parity corresponding to the encoded turbo stream; and a trellis/parity corrector for trellis-encoding the dual transport stream (TS) processed at the turbo processor.

According to an aspect of the present invention, the digital broadcasting transmission system may further include a TS generator for generating the dual transport stream (TS) by multiplexing the normal stream and the turbo stream.

According to an aspect of the present invention, the digital broadcasting transmission system may further include a randomizer for randomizing the dual transport stream (TS) generated at the TS generator and providing the randomized dual transport stream (TS) to the SRS inserter.

According to an aspect of the present invention, the TS generator may include a duplicator for receiving the turbo stream and providing a parity insertion region; and a service MUX for generating the dual transport stream (TS) by multiplexing the turbo stream having the parity insertion region and the normal stream. The TS generator may further include a RS encoder for receiving and encoding the turbo stream and an interleaver for interleaving the encoded turbo stream and providing the interleaved turbo stream to the duplicator.

According to an aspect of the present invention, the turbo processor may include a turbo stream detector for detecting the turbo stream from the interleaved dual transport stream (TS); an outer encoder for inserting a parity for the detected turbo stream to the parity insertion region; an outer interleaver for interleaving the parity-inserted turbo stream; a turbo stream stuffer for reconstructing the dual transport stream (TS) by inserting the interleaved turbo stream to the dual transport stream (TS); and a parity compensator for regenerating a parity of the reconstructed dual transport stream (TS) and adding the parity to the dual transport stream (TS).

According to an aspect of the present invention, the turbo processor may further include a byte-symbol converter for converting the interleaved dual transport stream (TS) from the byte to the symbol; and a symbol-byte converter for converting the dual transport stream (TS) having the reconstructed parity added at the parity compensator from the symbol to the byte.

According to an aspect of the present invention, the digital broadcasting transmission system may further include a MUX for adding a sync signal to the trellis-encoded dual transport stream (TS); and a transmitter for transmitting the dual transport stream (TS) having the added sync signal.

According to an aspect of the present invention, the transmitter may include a pilot inserter for inserting a pilot to the dual transport stream (TS) having the added sync signal; a pre-equalizer for equalizing the pilot-inserted dual transport stream (TS); a VSB modulator for VSB-modulating the equalized dual transport stream (TS); and a RF modulator for modulating the VSB-modulated dual transport stream (TS) to a signal of RF channel band and transmitting the modulated dual transport stream (TS).

According to another aspect of the present invention, the TS generator may include an erasure encoder for receiving and erasure-encoding a turbo stream.

According to an aspect of the present invention, the trellis/parity corrector may perform initialization prior to the encoding of the SRS, and compensate a parity according to value which is changed by the initialization. The trellis/parity corrector may include a trellis encoder block for carrying out the initialization when an external control signal corresponding to an initialization period is received, and outputting a pre-stored value as an initialization value; a RS re-encoder for generating a parity corresponding to the initialization value; and an adder for correcting the parity of the dual transport stream (TS) by adding the parity generated at the RS re-encoder and the dual transport stream (TS).

The trellis/parity corrector may further include a MUX for the dual transport stream (TS) having the parity corrected by the adder, to the trellis encoder block; and a MAP for symbol-mapping and outputting the dual transport stream (TS) trellis-encoded at the trellis encoder block.

According to an aspect of the present invention, the trellis encoder block may further include a plurality of trellis encoders. The trellis encoder may include a plurality of memories storing certain values; a first MUX for receiving and outputting one of two bits positioned before the input of the SRS, selecting and outputting a value stored in a first memory of the plurality of memories when the external control signal is received; a first adder for outputting by adding an output value from the first MUX and the value stored in the first memory, and storing the output value to the first memory; a second MUX for receiving and outputting other of the two bits positioned before the input of the SRS, selecting and outputting a value stored in a second memory of the plurality of memories when the external control signal is received; a second adder for adding an output value of the second MUX and a value stored in the first memory, and storing the resultant value to a third memory of the plurality of memories. The a value pre-stored in the third memory is shifted and stored to the second memory, and a value pre-stored in the first memory and a value pre-stored in the second memory are provided to the RS re-encoder as the initialization value.

In accordance with yet another embodiment of the present invention, a digital broadcasting transmission system comprises: a TS generator for generating a dual transport stream (TS) which is multiplexed from an erasure-encoded turbo stream, and a normal stream; a randomizer for randomizing the dual transport stream (TS); a SRS inserter for inserting a SRS to a stuffing region provided in the randomized dual transport stream (TS); a parity generator for providing a first parity insertion region in the SRS-inserted dual transport stream (TS); an interleaver for interleaving the dual transport stream (TS) having the first parity insertion region; a turbo processor for detecting a turbo stream from the interleaved dual transport stream (TS), encoding the detected turbo stream, and stuffing the encoded turbo stream to the dual transport stream (TS); and a deinterleaver for deinterleaving the dual transport stream (TS) processed at the turbo processor.

According to an aspect of the present invention, the TS generator may include an erasure encoder for receiving and erasure-encoding a turbo stream; a duplicator for providing a second parity insertion region with respect to the erasure-encoded turbo stream; and a service MUX for generating the dual transport stream (TS) by multiplexing the turbo stream having the second parity insertion region and the normal stream. The TS generator may further include a first RS encoder for RS-encoding the erasure-encoded turbo stream; and an interleaver for interleaving the turbo stream.

According to an aspect of the present invention, the turbo processor may include a turbo stream detector for detecting the turbo stream from the interleaved dual transport stream (TS); an outer encoder for inserting a parity for the detected turbo stream to the second parity insertion region; an outer interleaver for interleaving the outer-encoded turbo stream; and a turbo stream stuffer for reconstructing the dual transport stream (TS) by stuffing the interleaved turbo stream to the dual transport stream (TS). The turbo processor may further include a byte-symbol converter for converting the interleaved dual transport stream (TS) from the byte to the symbol; and a symbol-byte converter for converting the reconstructed dual transport stream (TS) from the symbol to the byte.

According to an aspect of the present invention, the digital broadcasting transmission system may further include a transmitter for transmitting the deinterleaved dual transport stream (TS).

According to an aspect of the present invention, the transmitter may include a second RS encoder for encoding the dual transport stream (TS) by inserting a parity for the deinterleaved dual transport stream (TS) to the first parity insertion region; a second interleaver for interleaving the encoded dual transport stream (TS); a trellis encoder block for trellis-encoding the interleaved dual transport stream (TS); a MUX for adding a sync signal to the trellis-encoded dual transport stream (TS); and a modulator for channel-modulating and transmitting the dual transport stream (TS) having the added sync signal.

According to an aspect of the present invention, the trellis/parity corrector may perform initialization before encoding the SRS, and compensate a parity according to a value which is changed by the initialization. The trellis/parity corrector may include a trellis encoder block for performing initialization when an external control signal corresponding to an initialization period is received, and outputting a pre-stored value as the initialization value; a RS re-encoder for generating a parity corresponding to the initialization value; and an adder for correcting a parity of the dual transport stream (TS) by adding the parity generated at the RS re-encoder and the dual transport stream (TS).

According to an aspect of the present invention, the trellis/parity corrector may further include a MUX for providing the dual transport stream (TS) having the parity corrected by the adder, to the trellis encoder block; and a MAP for symbol-mapping and outputting the dual transport stream (TS) which is trellis-encoded at the trellis encoder block.

According to an aspect of the present invention, the trellis encoder block may include a plurality of trellis encoders. The trellis encoder may include a plurality of memories storing certain values; a first MUX for receiving and outputting one of two bits positioned before the input of the SRS, selecting and outputting a value stored in a first memory of the plurality of memories when the external control signal is received; a first adder for outputting a resultant value by adding an output value of the first MUX and the value stored in the first memory, and storing the output value in the first memory; a second MUX for receiving and outputting the other of the two bits positioned before the input of the SRS, selecting and outputting a value stored in a second memory of the plurality of memories when the external control signal is received; and a second adder for adding an output value of the second MUX and the value stored in the first memory and storing the resultant value in a third memory of the plurality of memories. A value pre-stored in the third memory is shifted and stored to the second memory, and a value pre-stored in the first memory and a value pre-stored in the second memory are provided to the RS re-encoder as the initialization value.

In accordance with yet another embodiment of the present invention, a trellis encoding apparatus comprises: a trellis encoder block having a plurality of memories, for trellis-encoding a transport stream (TS) using a value stored in the memory and performing initialization when an external control signal is input; a RS re-encoder for generating a parity corresponding to a value which is pre-stored in a memory of the trellis encoder block when the initialization is preformed; and an adder for correcting a parity of the transport stream (TS) by adding the parity generated at the RS re-encoder and the transport stream (TS).

According to an aspect of the present invention, the trellis encoding apparatus may further include a MUX for providing the transport stream (TS) having the parity corrected by the adder, to the trellis encoder block; and a MAP for symbol-mapping and outputting the transport stream (TS) which is trellis-encoded at the trellis encoder block.

According to an aspect of the present invention, the trellis encoder block may further include a plurality of trellis encoders. The trellis encoder may include a plurality of memories storing certain values; a first MUX for receiving and outputting one of two bits in a certain region of the transport stream (TS), selecting and outputting a value stored in a first memory of the plurality of memories when the external control signal is received; a first adder for outputting the resultant value by adding an output value of the first MUX and the value stored in the first memory, and storing the output value to the first memory; a second MUX for receiving and outputting the other of the two bits in the certain region of the transport stream (TS), selecting and outputting a value stored in a second memory of the plurality of memories when the external control signal is received; and a second adder for adding an output value of the second MUX and the value stored in the first memory, and storing the resultant value to a third memory of the plurality of memories. A value pre-stored in the third memory is shifted and stored to the second memory, and a value pre-stored in the first memory and a value pre-stored in the second memory are provided to the RS re-encoder as the initialization value.

According to an aspect of the present invention, the transport stream (TS) may be a dual transport stream (TS) including a SRS, a normal stream, and a turbo stream. The initialization may be performed just before the trellis encoding of the SRS.

In accordance with yet another embodiment of the present invention, a digital broadcasting reception system comprises: a demodulator for receiving and demodulating a dual transport stream (TS) which includes an erasure-encoded turbo stream and a normal stream; an equalizer for equalizing the demodulated dual transport stream (TS); a first processor for outputting a normal data packet by decoding the normal stream of the equalized dual transport stream (TS); and a second processor for restoring a turbo stream packet by decoding the turbo stream of the equalized dual transport stream (TS), and erasure-decoding the restored turbo stream.

According to an aspect of the present invention, the first processor may include a Viterbi decoder for perform error correction with respect to the normal stream of the equalized dual transport stream (TS), and decoding the error-corrected normal stream; a first deinterleaver for deinterleaving the normal stream decoded by the Viterbi decoder; a first RS decoder for correcting error of the normal stream processed at the first deinterleaver; and a derandomizer for restoring the normal data packet by derandomizing the error-corrected normal stream.

According to an aspect of the present invention, the second processor may include a turbo decoder for turbo-decoding the turbo stream of the equalized dual transport stream (TS); a second deinterleaver for deinterleaving the turbo-decoded turbo stream; a parity eliminator for eliminating parity from the deinterleaved turbo stream; a derandomizer for derandomizing the parity-eliminated turbo stream; a turbo DE-MUX for restoring a turbo stream packet by demultiplexing the derandomized turbo stream; and an erasure decoder for erasure-decoding the restored turbo stream packet.

According to an aspect of the present invention, the turbo decoder may include a trellis decoder for trellis-decoding the turbo stream of the equalized dual transport stream (TS); an outer deinterleaver for deinterleaving the trellis-decoded turbo stream; an outer MAP decoder for decoding the deinterleaved turbo stream; an outer interleaver for interleaving the turbo stream decoded at the outer MAP decoder and providing the interleaved turbo stream to the trellis decoder when soft decision is output from the outer MAP decoder; a frame formatter for frame-formatting a hard decision output value of the outer MAP decoder; and a symbol deinterleaver for converting the frame-formatted turbo stream from the symbol to the byte.

In accordance with another embodiment of the present invention, a digital broadcasting reception system includes a demodulator for receiving and demodulating a dual transport stream (TS) which includes a turbo stream and a normal stream; an equalizer for equalizing the demodulated dual transport stream (TS); a Viterbi decoder for decoding the normal stream of the equalized dual transport stream (TS); a turbo decoder for decoding the turbo stream of the equalized dual transport stream (TS); a turbo inserter for inserting the turbo stream decoded at the turbo decoder to the dual transport stream (TS); a deinterleaver for deinterleaving the dual transport stream (TS) which is processed at the turbo inserter; a RS decoder for RS-decoding the deinterleaved dual transport stream (TS); a derandomizer for derandomizing the RS-decoded dual transport stream (TS); and a turbo DE-MUX for restoring a normal stream packet and a turbo stream packet by demultiplexing the dual TS.

According to an aspect of the present invention, the turbo decoder may include a trellis decoder for trellis-decoding the turbo stream of the equalized dual transport stream (TS); an outer deinterleaver for deinterleaving the trellis-decoded turbo stream; an outer MAP decoder for decoding the deinterleaved turbo stream; an outer interleaver for interleaving the turbo stream decoded at the outer MAP decoder and providing the interleaved turbo stream to the trellis decoder when soft decision is output from the outer MAP decoder; a frame formatter for frame-formatting a hard decision output value of the outer MAP decoder; and a symbol deinterleaver for converting the frame-formatted turbo stream from the symbol to the byte and providing the converted turbo stream to the turbo inserter.

According to an aspect of the present invention, the turbo DE-MUX may include a TS DE-MUX for outputting the normal stream and the turbo stream by demultiplexing the dual transport stream (TS); a first SYNC inserter for inserting a sync signal to the normal stream output from the TS DE-MUX and outputting the normal stream; a deinterleaver for deinterleaving the turbo stream output from the TS DE-MUX; a condenser for removing an empty region in the deinterleaved turbo stream; a RS decoder for RS-decoding the turbo stream from which the empty region is removed; and a second SYNC inserter for inserting a sync signal to the RS-decoded turbo stream and outputting the turbo stream.

According to another aspect of the present invention, the turbo DE-MUX may include a TS DE-MUX for outputting the normal stream and the turbo stream by demultiplexing the dual transport stream (TS); a SYNC inserter for inserting a sync signal to the normal stream output from the TS DE-MUX and outputting the normal stream; a deinterleaver for deinterleaving the turbo stream output from the TS DE-MUX; a condenser for removing an empty region in the deinterleaved turbo stream; a SYNC detector for detecting the sync signal from the turbo stream from which the empty region is removed; and a RS decoder for RS-decoding and outputting the turbo stream from the detected sync signal by a certain length.

According to an aspect of the present invention, the digital broadcasting reception system may further include an erasure decoder for erasure-decoding the turbo stream packet restored at the turbo DE-MUX.

In accordance with yet another embodiment of the present invention, a digital broadcasting reception signal processing method comprises: (a) receiving and demodulating a dual transport stream (TS) which includes an erasure-encoded turbo stream and a normal stream; (b) equalizing the demodulated dual transport stream (TS); (c) outputting a normal data packet by decoding the normal stream of the equalized dual transport stream (TS); and (d) restoring a turbo stream packet by decoding the turbo stream of the equalized dual transport stream (TS), and erasure-decoding the restored turbo stream.

According to an aspect of the present invention, the operation (c) may include correcting error of the normal stream of the equalized dual transport stream (TS), and decoding the error-corrected normal stream; deinterleaving the decoded normal stream; RS-decoding to correct error of the deinterleaved normal stream; and restoring the normal data packet by derandomizing the error-corrected normal stream.

According to an aspect of the present invention, the operation (d) may include turbo-decoding the turbo stream of the equalized dual transport stream (TS); deinterleaving the turbo-decoded turbo stream; eliminating a parity from the deinterleaved turbo stream; derandomizing the parity-eliminated turbo stream; restoring a turbo stream packet by demultiplexing the derandomized turbo stream; and erasure-decoding the restored turbo stream packet.

According to an aspect of the present invention, the turbo decoding may include (d1) trellis-decoding the turbo stream of the equalized dual transport stream (TS); (d2) deinterleaving the trellis-decoded turbo stream; (d3) decoding the deinterleaved turbo stream; (d4) frame-formatting a hard decision output value when the hard decision is output in the decoding process; and (d5) converting the frame-formatted turbo stream from the symbol to the byte. The operations (d1) through (d3) are repeated until the hard decision is output in the decoding process.

In accordance with yet another embodiment of the present invention, a digital broadcasting reception signal processing method comprises: (a) receiving and demodulating a dual transport stream (TS) which includes a turbo stream and a normal stream; (b) equalizing the demodulated dual transport stream (TS); (c) Viterbi-decoding the normal stream of the equalized dual transport stream (TS); (d) turbo-decoding the turbo stream of the equalized dual transport stream (TS); (e) inserting the turbo-decoded turbo stream to the Viterbi-decoded dual transport stream (TS); (f) deinterleaving the dual transport stream (TS) having the turbo-decoded turbo stream; (g) RS-decoding the deinterleaved dual transport stream (TS); (h) derandomizing the RS-decoded dual transport stream (TS); and (i) restoring a normal stream packet and a turbo stream packet by demultiplexing the derandomized dual transport stream (TS).

According to an aspect of the present invention, the operation (d) may include (d1) trellis-decoding the turbo stream of the equalized dual transport stream (TS); (d2) deinterleaving the trellis-decoded turbo stream; (d3) decoding the deinterleaved turbo stream; (d4) frame-formatting a hard decision output value when the hard decision is output in the decoding process; and (d5) converting the frame-formatted turbo stream from the symbol to the byte. The operations (d1) through (d3) are repeated until the hard decision is output in the decoding process.

According to an aspect of the present invention, the operation (i) may include separating the normal stream and the turbo stream by demultiplexing the dual transport stream (TS); outputting the normal stream by inserting a sync signal to the separated normal stream; deinterleaving the separated turbo stream; removing an empty region from the deinterleaved turbo stream, and RS-decoding the turbo stream; and outputting the turbo stream by inserting a sync signal to the RS-decoded turbo stream.

According to an aspect of the present invention, the operation (i) may include separating the normal stream and the turbo stream by multiplexing the dual transport stream (TS); outputting the normal stream by inserting a sync signal to the separated normal stream; deinterleaving the separated turbo stream; removing an empty region from the deinterleaved turbo steam and RS-coding the turbo stream; and detecting a sync signal from the turbo stream from which the empty region is removed, RS-decoding the turbo stream from the detected sync signal by a certain length, and outputting the turbo stream.

According to an aspect of the present invention, the digital broadcasting reception signal processing method may further include (j) erasure-decoding the restored turbo stream packet.

In accordance with another embodiment of the present invention, a trellis encoding method of a trellis encoding apparatus which has a plurality of memories and trellis-encodes a transport stream (TS) using values stored in the memories, comprises: performing initialization when an external control signal is input; generating a parity corresponding to a value which is pre-stored in a memory of the trellis encoding apparatus when the initialization is performed; and correcting a parity of the transport stream (TS) by adding the generated parity to the transport stream (TS).

According to an aspect of the present invention, the trellis encoding method may further include trellis-encoding the transport stream (TS) having the corrected parity; and symbol-mapping and outputting the trellis-encoded transport stream (TS).

According to an aspect of the present invention, the trellis encoding may use a plurality of trellis encoders. The trellis encoding may be performed using a trellis encoder which comprises a plurality of memories storing certain values; a first MUX for receiving and outputting one of two bits in a certain region of the transport stream (TS), selecting and outputting a value stored in a first memory of the plurality of memories when the external control signal is received; a first adder for outputting the resultant value by adding an output value of the first MUX and the value stored in the first memory, and storing the output value to the first memory; a second MUX for receiving and outputting the other of the two bits in the certain region of the TS, selecting and outputting a value stored in a second memory of the plurality of memories when the external control signal is received; and a second adder for adding an output value of the second MUX and the value stored in the first memory, and storing the resultant value to a third memory of the plurality of memories.

According to an aspect of the present invention, the generation of the parity may generate a parity which corresponds to values pre-stored in the first and second memories of the trellis encoder.

According to an aspect of the present invention, the transport stream (TS) may be a dual transport stream (TS) which includes a SRS, a normal stream, and a turbo stream. The initialization may be performed just before the trellis encoding of the SRS.

In addition to the example embodiments and aspects as described above, further aspects and embodiments will be apparent by reference to the drawings and by study of the following descriptions.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

FIGS. 16A through 16E are conceptual diagrams for illustrating an example structure of a dual transport stream (TS)

Figure 17:
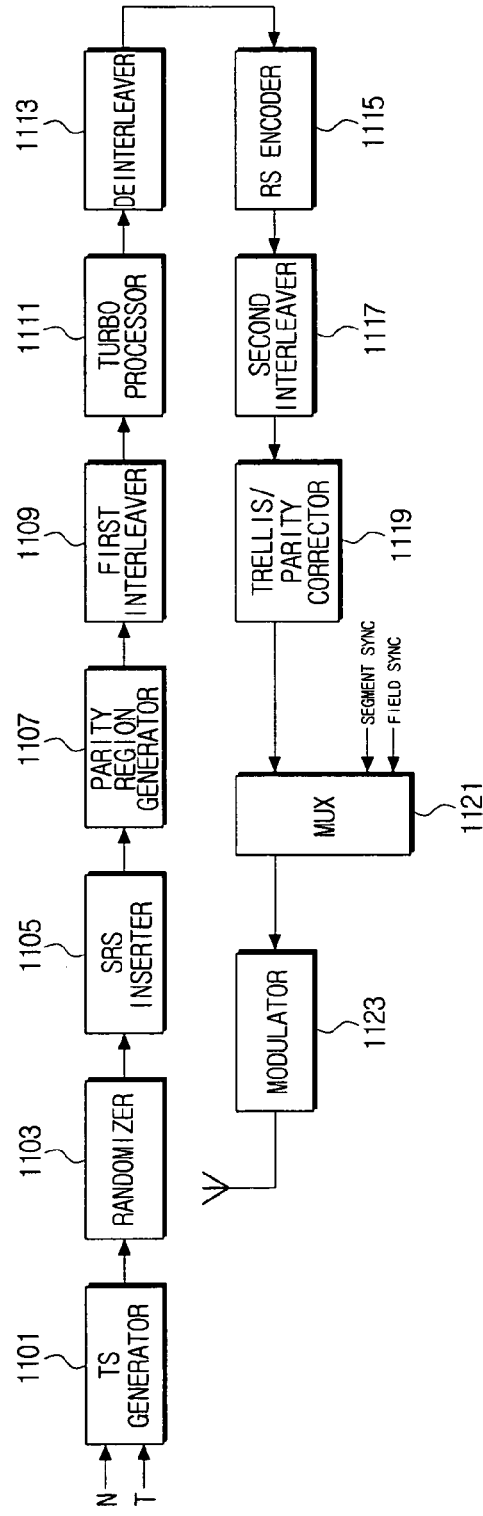
Figure 18:
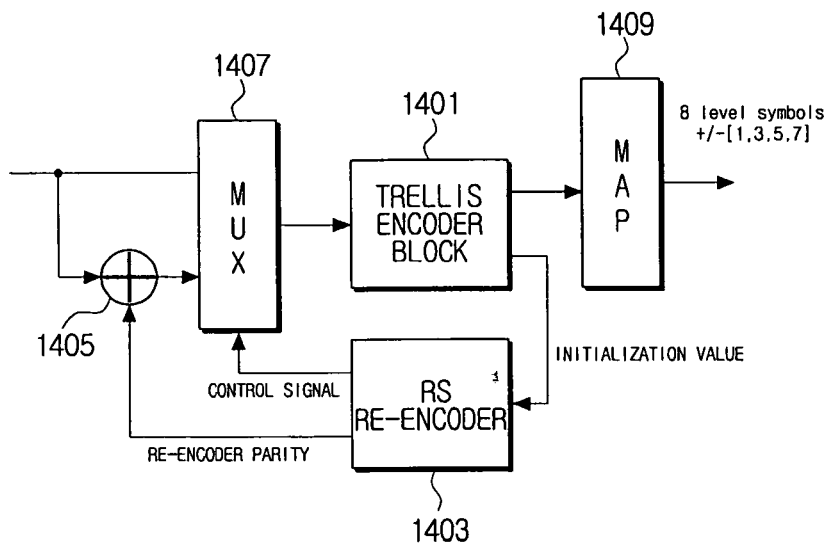
Figure 19:
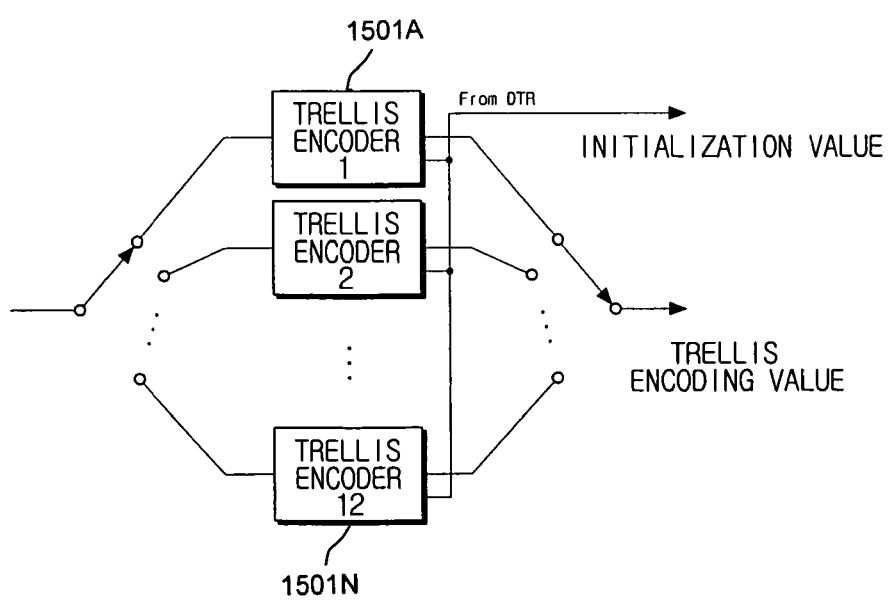
Figure 20:
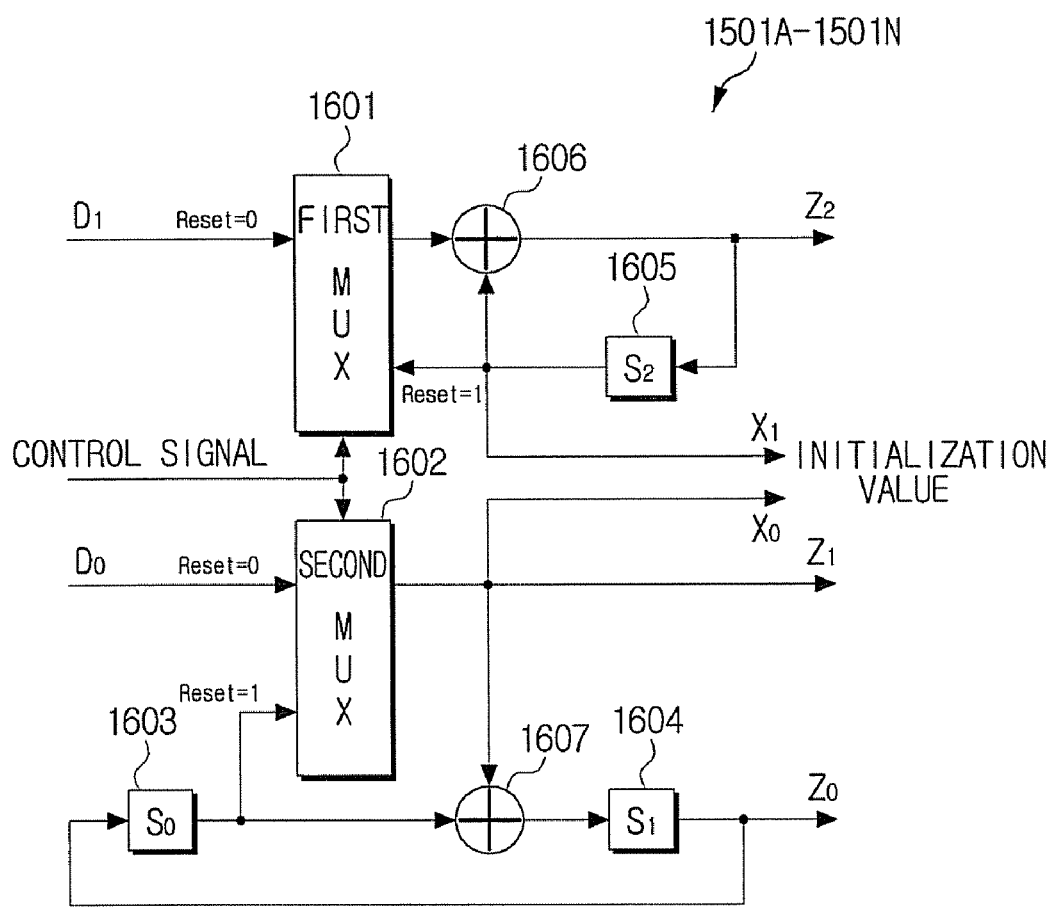
Figure 22:
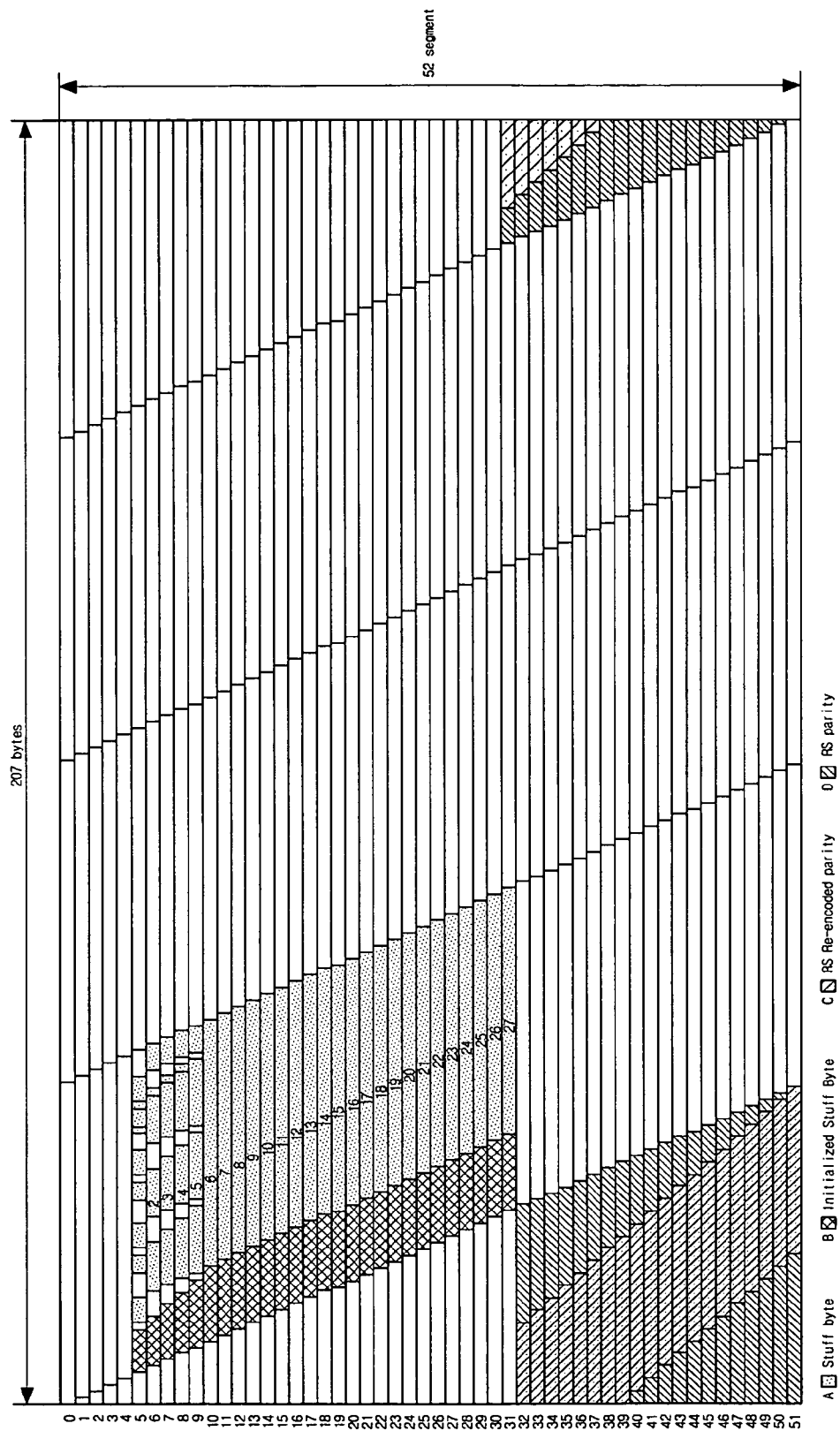
Figure 23:
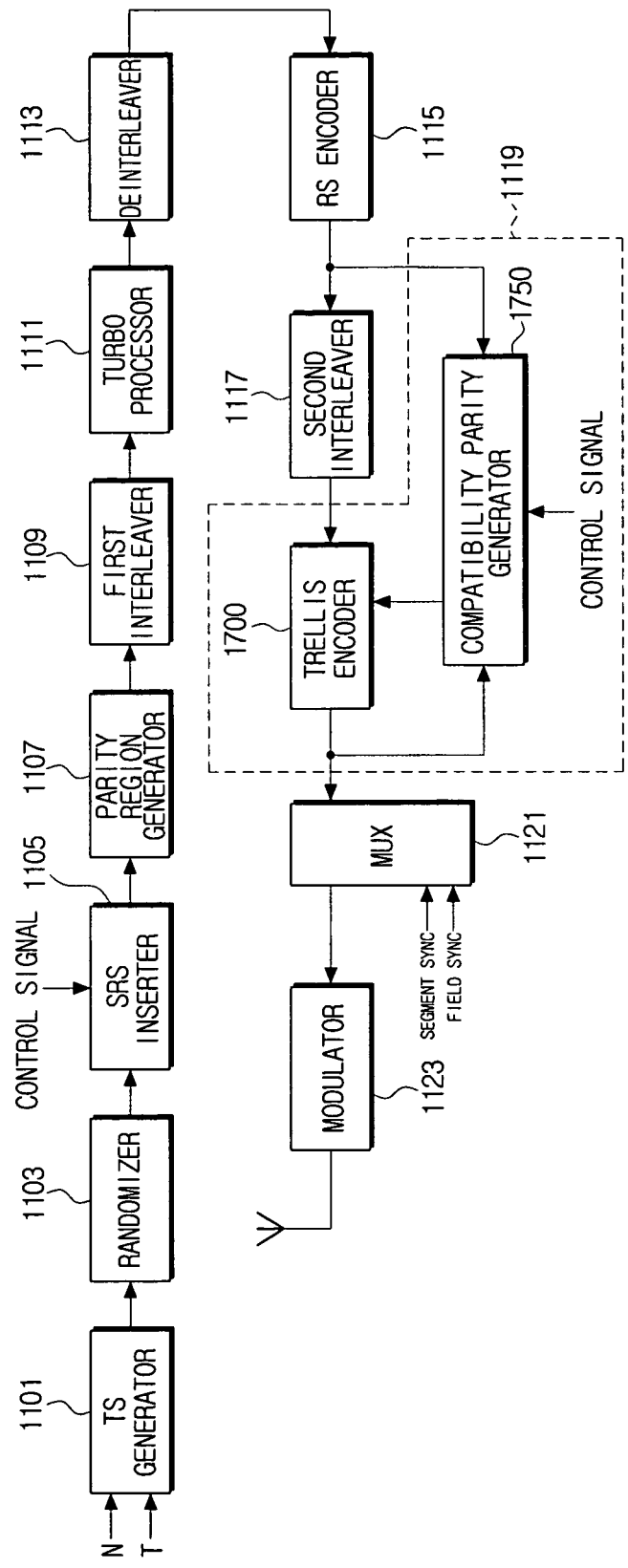
Figure 24:
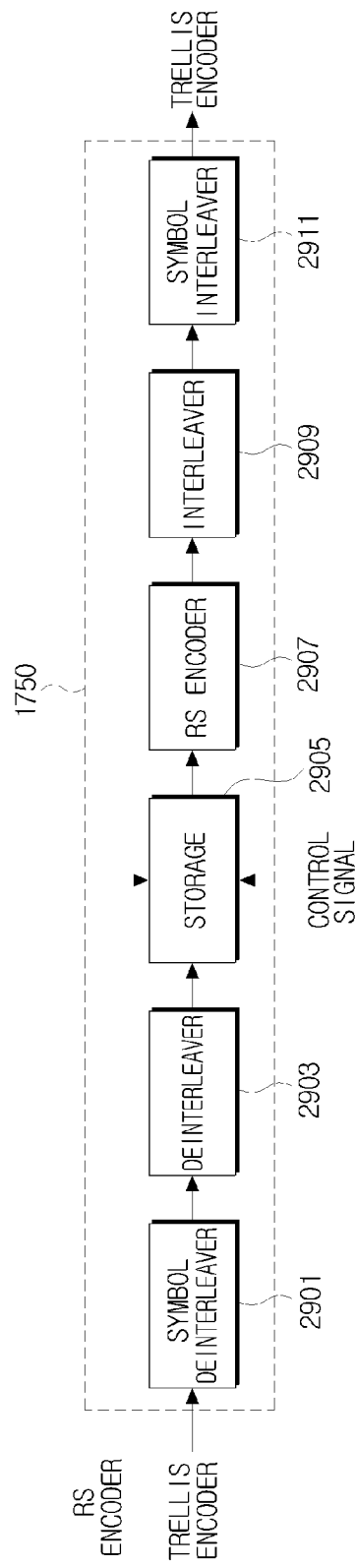
Figure 25:
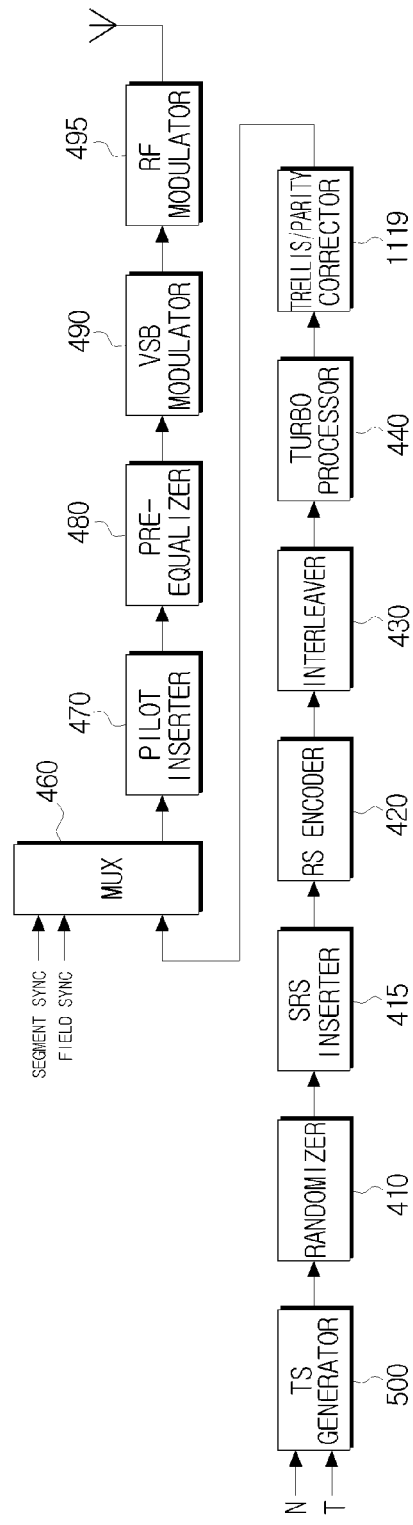
Figure 26:
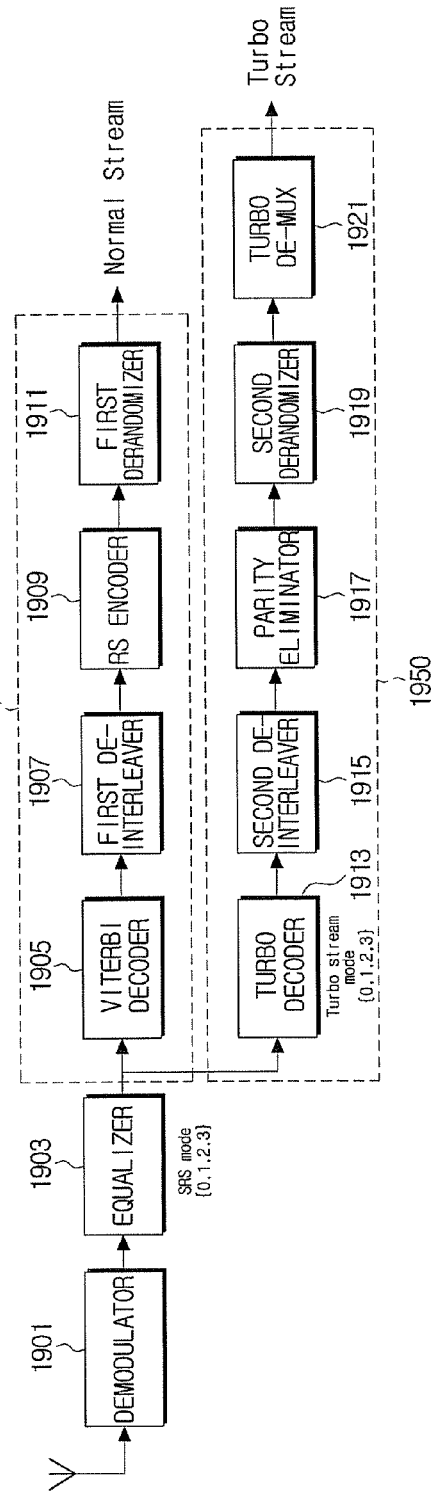
Figure 28:
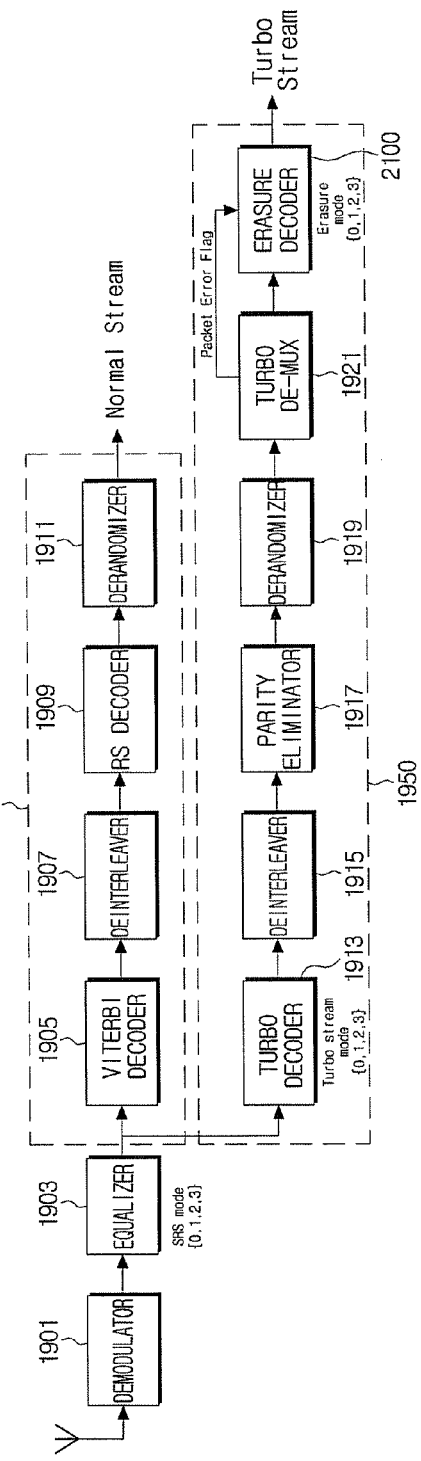
Figure 27:
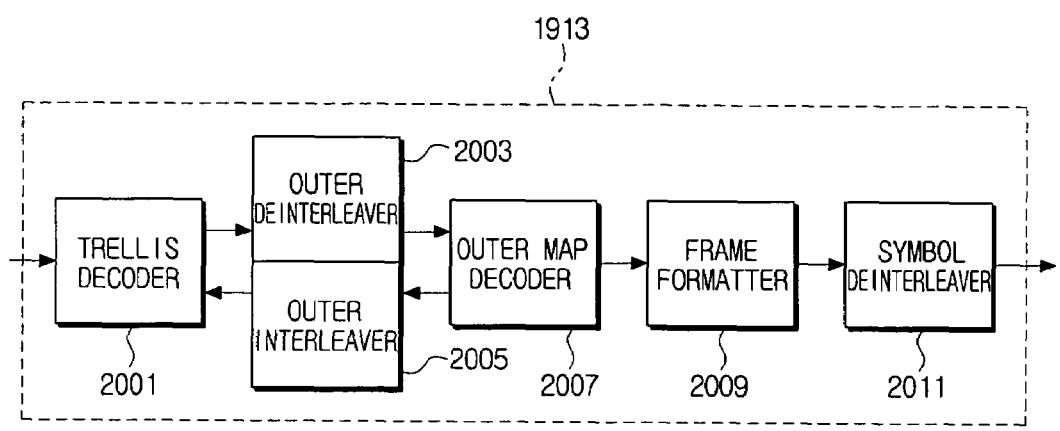
Figure 29:
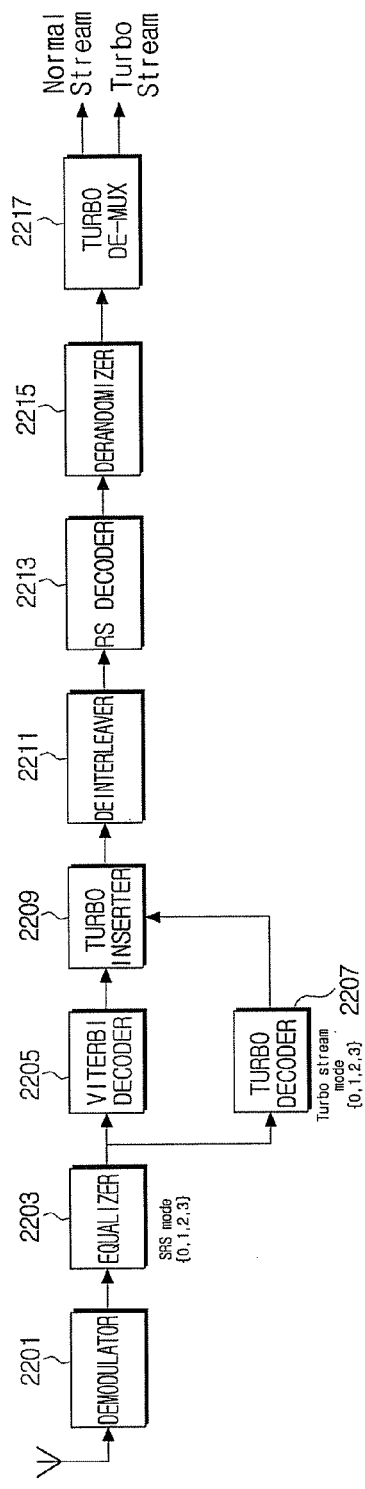
Figure 31:
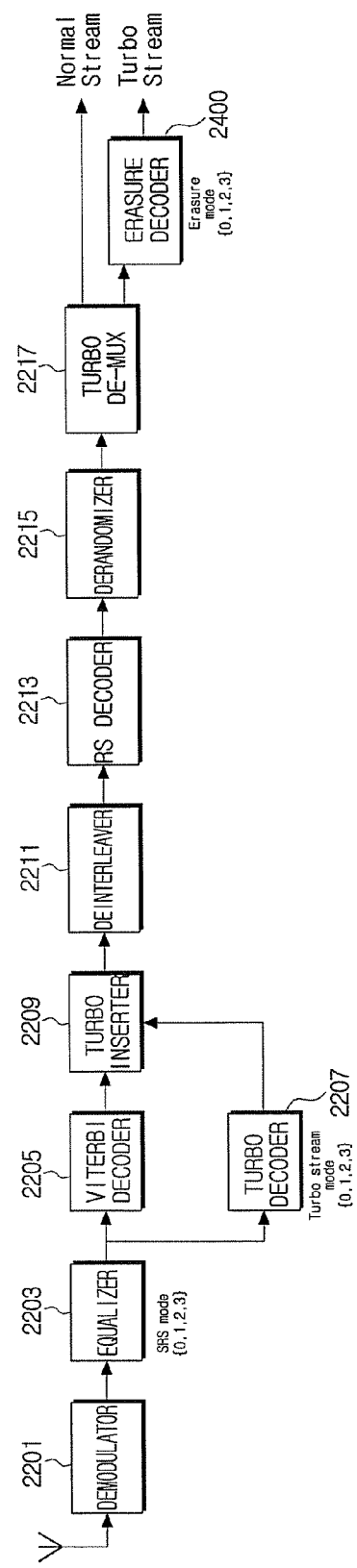
Figure 32:
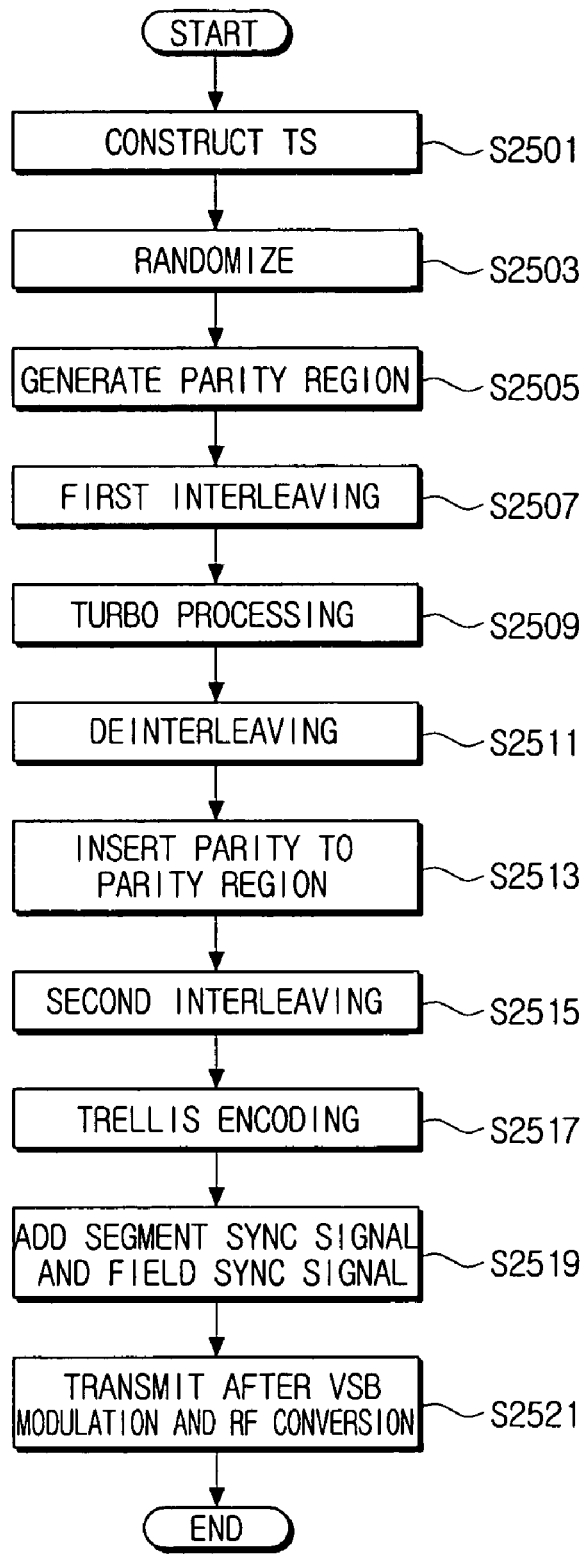
Figure 33:
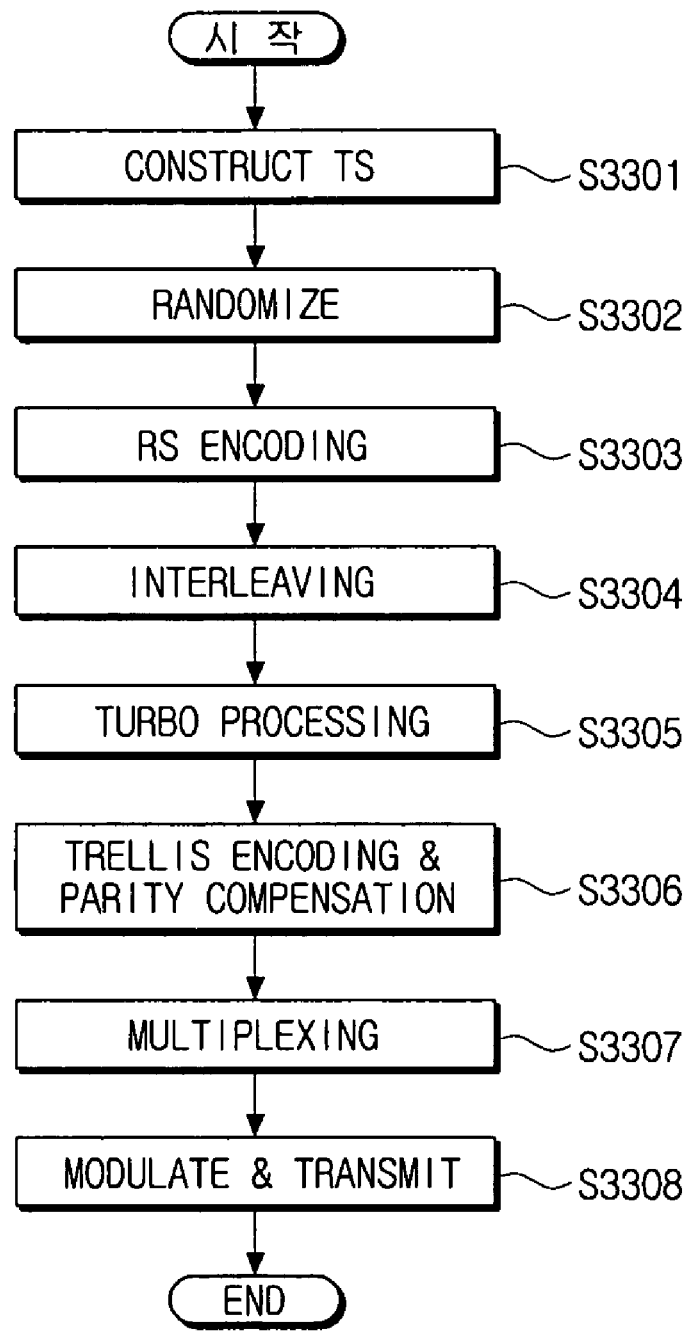
Figure 34:
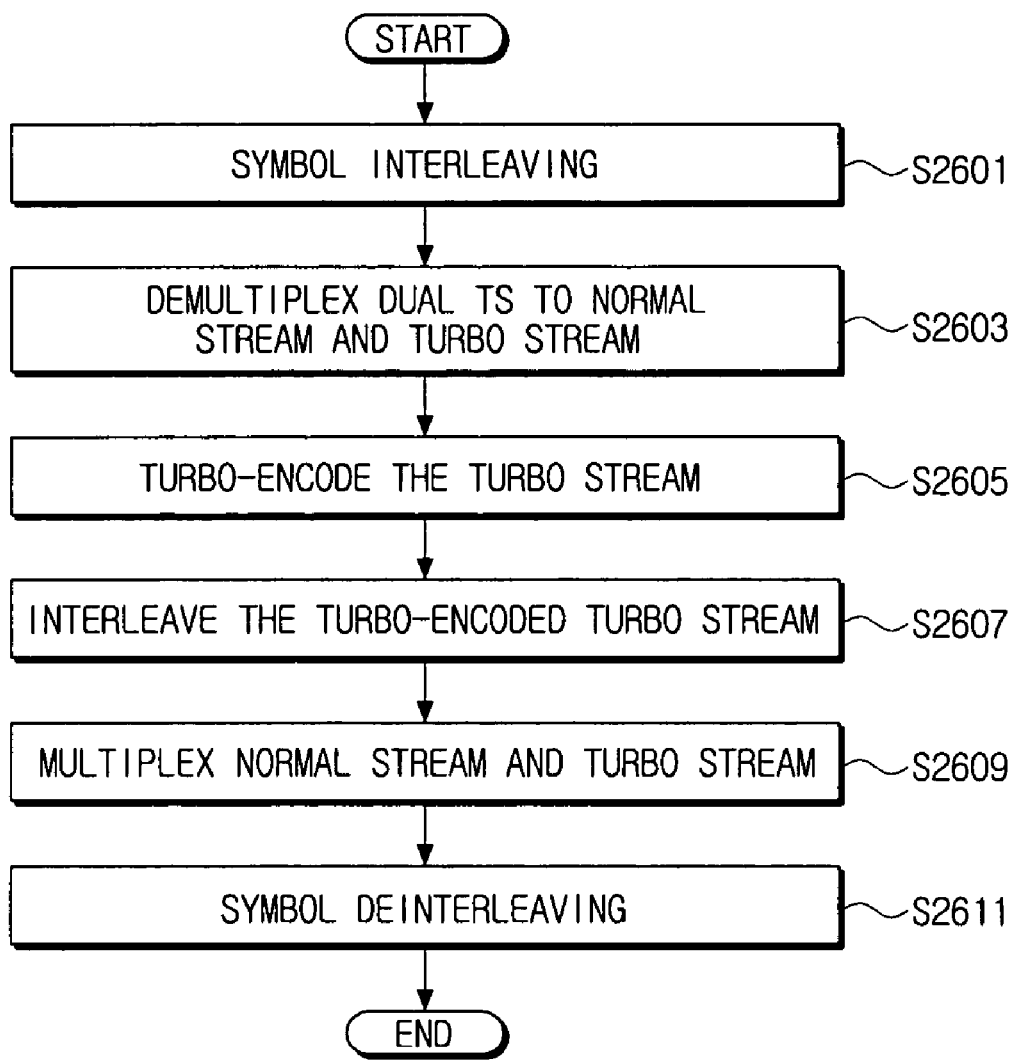
Figure 35:
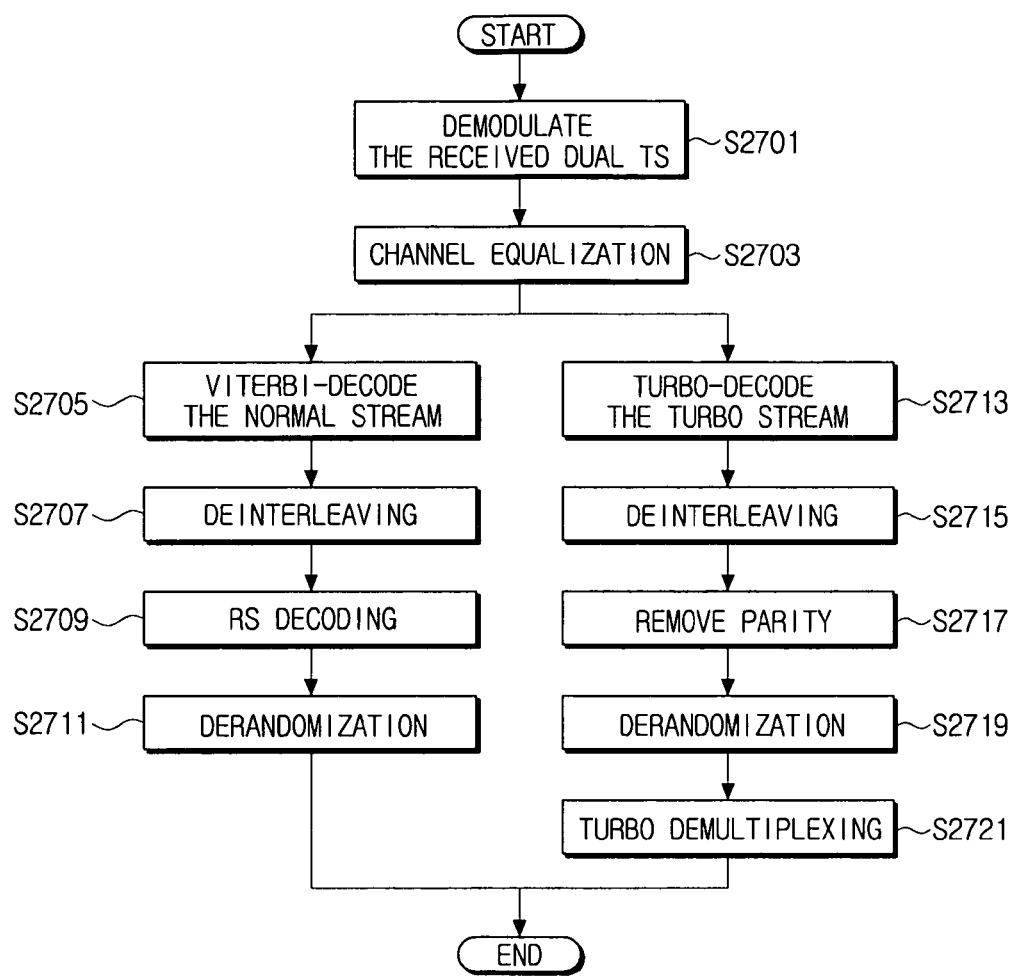
Figure 36:
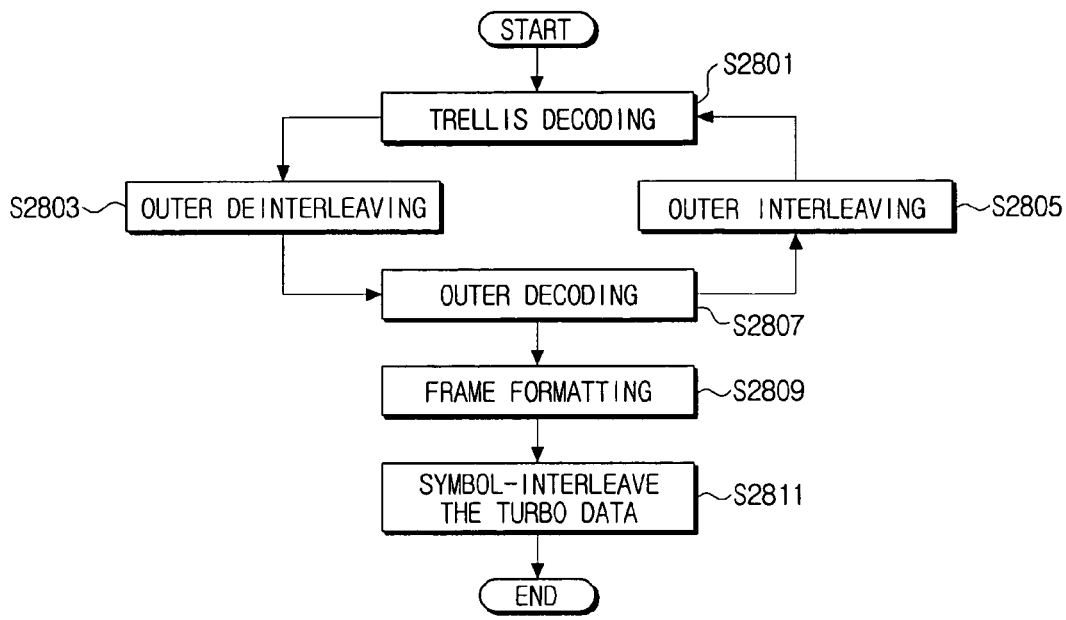
Figure 37:
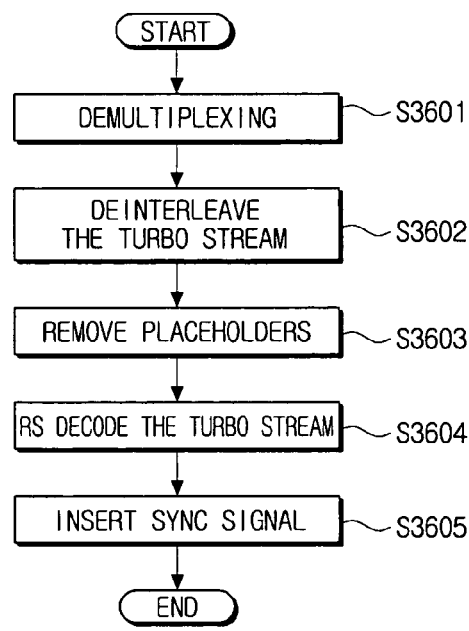

which is transmitted from the digital broadcasting transmission system shown in FIGS. 3, 4, 9 and 14;

FIG. 17 is a block diagram of a digital broadcasting transmission system according to still another embodiment of the present invention;

FIG. 18 is a block diagram of an example trellis/parity corrector according to an embodiment of the present invention;

FIG. 19 is a block diagram of an example trellis encoder block according to an embodiment of the present invention;

FIG. 20 is a block diagram of an example trellis encoder according to an embodiment of the present invention;

FIGS. 21A through 21E are conceptual diagrams for illustrating various structures of a dual transport stream (TS) which is transmitted from the digital broadcasting transmission system shown in FIG. 17;

FIG. 22 is a conceptual diagram for illustrating an interleaving mode of the dual transport stream (TS) according to an embodiment of the present invention;

FIG. 23 is a block diagram of a digital broadcasting transmission system according to yet another embodiment of the present invention;

FIG. 24 is a block diagram of a compatibility parity generator according to an embodiment of the present invention;

FIG. 25 is a block diagram of a digital broadcasting transmission system according to a further embodiment of the present invention;

FIG. 26 is a block diagram of a digital broadcasting reception system according to another embodiment of the present invention;

FIG. 27 is a block diagram of an example turbo decoder according to an embodiment of the present invention;

FIG. 28 is a block diagram of a digital broadcasting reception system according to another embodiment of the present invention;

FIG. 29 is a block diagram of a digital broadcasting reception system according to still another embodiment of the present invention;

FIGS. 30A and 30B are block diagrams of an example turbo demultiplexer (DE-MUX) according to various embodiments of the present invention;

FIG. 31 is a block diagram of a digital broadcasting reception system according to yet another embodiment of the present invention;

FIG. 32 is a flowchart for outlining a digital broadcasting transmission signal processing method according to an embodiment of the present invention;

FIG. 33 is a flowchart for outlining a digital broadcasting transmission signal processing method according to another embodiment of the present invention;

FIG. 34 is a flowchart for outlining a turbo stream processing method according to an embodiment of the present invention;

FIG. 35 is a flowchart for outlining a digital broadcasting reception signal processing method according to an embodiment of the present invention;

FIG. 36 is a flowchart for outlining a turbo stream decoding method according to an embodiment of the present invention; and FIG. 37 is a flowchart for outlining a turbo demultiplexing processing method according to an embodiment of the present invention.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1:
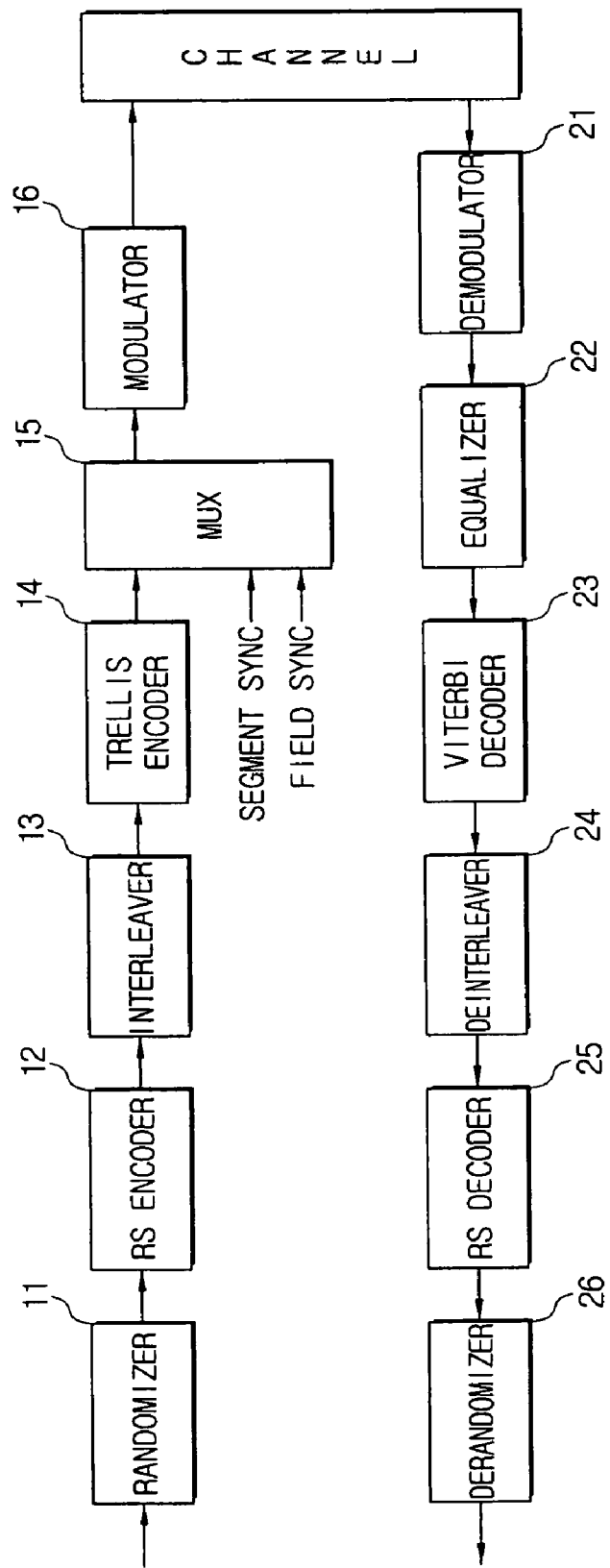
FIG. 1 is a block diagram of a typical digital television (DTV) broadcasting system in the U.S. in accordance with the Advanced Television System Committee (ATSC) vestigial sideband (VSB) scheme.
Figure 2:
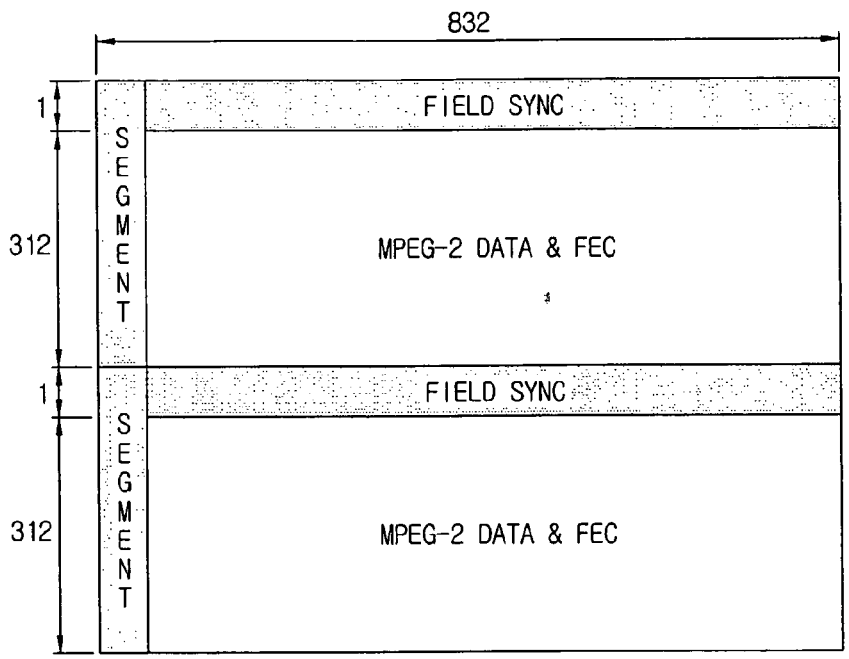
FIG. 2 is a diagram of an example frame structure of ATSC VSB data.
Figure 3:
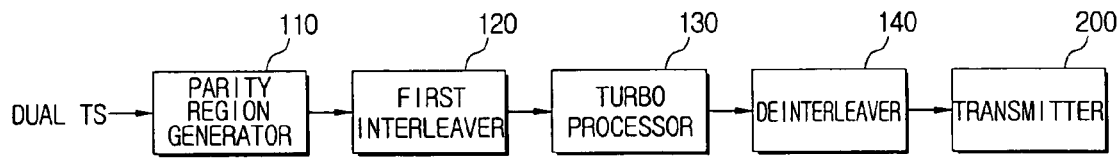
FIG. 3 is a block diagram of a digital broadcasting transmission system according to an embodiment of the present invention.

FIG. 3 is a block diagram of a digital broadcasting transmission system according to an embodiment of the present invention. As shown in FIG. 3, the digital broadcasting transmission system comprises a parity region generator 110, a first interleaver 120, a turbo processor 130, a deinterleaver 140, and a transmitter 150.

The parity region generator 110 is responsible for generating a parity insertion region with respect to a dual transport stream (TS) including a normal stream and a turbo stream. The parity insertion region denotes a region to which a parity bit calculated for the dual transport stream (TS) is inserted, that is, a region to which a parity bit is recorded. To ease the understanding, the parity insertion region provided by the parity region generator 110 is referred to as a "first parity insertion region".

The first interleaver 120 serves to interleave the dual transport stream (TS) having the first parity insertion region generated by the parity region generator 110.

The turbo processor 130 serves to detect only the turbo stream included in the interleaved dual transport stream (TS), perform a robust processing to the detected turbo stream, and stuff the processed turbo stream into the dual transport stream (TS). The robust (turbo) processing implies a process to make data robust by performing encoding, such as convolution encoding, with respect to the turbo stream.

The deinterleaver 140 serves to deinterleave the dual transport stream (TS) output from the turbo processor 130.

The transmitter 200 serves to transmit the dual transport stream (TS) processed at the deinterleaver 140, to the outside. The transmitter 200 will be explained in detail.

In an example embodiment shown in FIG. 3, a turbo stream, which passed through the separate robust processing, is transmitted together with a normal stream. As a result, the reception performance in a multi-path environment or mobile environment can be improved and the compatibility with an existing normal stream transmission and reception stream can be provided.

Figure 4:
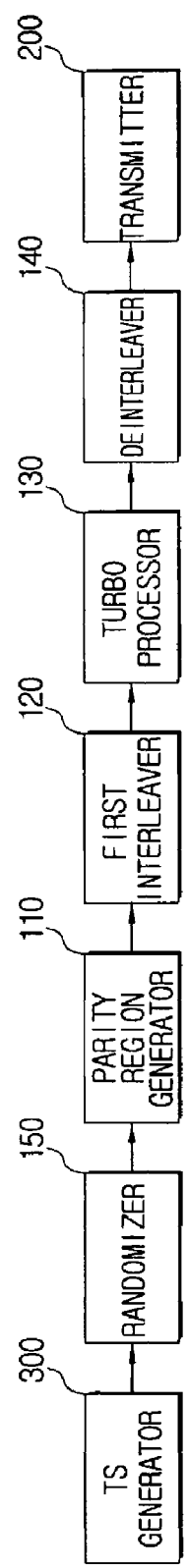
FIG. 4 is a detail block diagram of the digital broadcasting transmission system shown in FIG. 3.

FIG. 4 is a detail block diagram of an example digital broadcasting transmission system shown in FIG. 3. Referring to FIG. 4, the digital broadcasting transmission system further includes a transport stream (TS) generator 300 and a randomizer 150. The TS generator 300 may be referred to as an ATSC emission multiplexer (MUX).

The TS generator 300 generates a dual transport stream (TS) by receiving and multiplexing the normal stream and the turbo stream. The normal stream and the turbo stream can be received from an external module, such as a camera for broadcasting, or various internal modules such as a compressing module (e.g., MPEG 2 module), a video encoder, and an audio encoder.

The randomizer 150 randomizes the dual transport stream (TS) generated at the TS generator 300 and provides the randomized dual transport stream (TS) to the parity region generator 110. Accordingly, the parity region generator 110 generates a parity insertion region with respect to the dual transport stream (TS). Since the elements in FIG. 4, other than the TS generator 300 and the randomizer 150, have same functions with those shown in FIG. 3, their descriptions will be omitted for the sake of brevity.

Figure 5A:
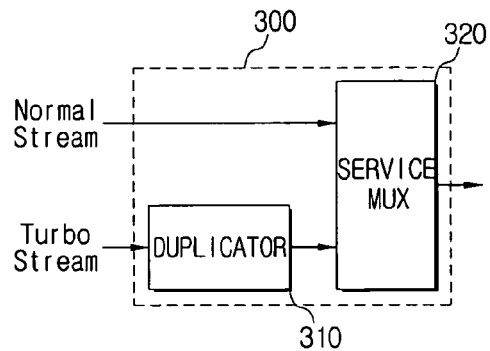
FIGS. 5A, 5B, and 5C are block diagrams of an example transport stream (TS) generator according to various embodiments of the present invention.
Figure 5B:
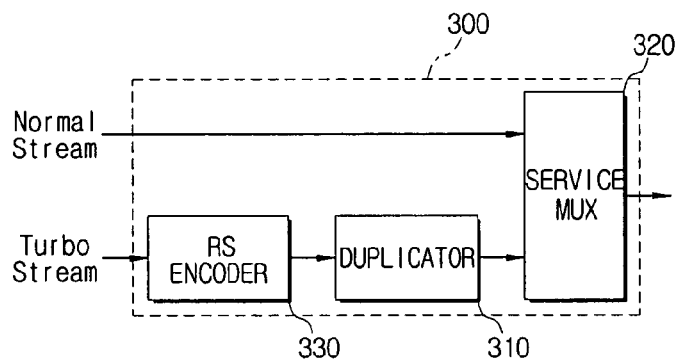
Figure 5C:
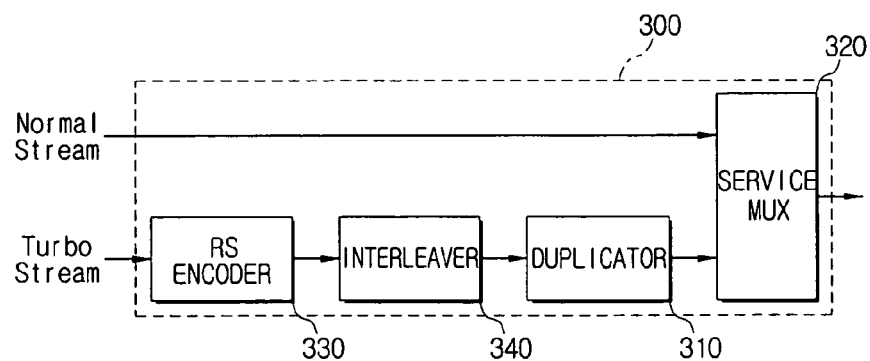

FIGS. 5A, 5B, and 5C are block diagrams of an example TS generator 300 according to various embodiments of the present invention.

Referring first to FIG. 5A, the TS generator 300 can be implemented by a duplicator 310 and a service multiplexer (MUX) 320. The duplicator 310 serves to generate a parity insertion region with respect to the interleaved turbo stream. To ease the understanding, the parity insertion region generated by the duplicator 310 is referred to as a "second parity insertion region". In more detail, to generate the second parity insertion region, bytes, which are constituent units of the turbo stream, are divided to two or four bytes. Each of the divided bytes is filled with part of bit values of the original byte and null data (e.g., 0). The region filled with the null data becomes the parity insertion region.

The operation of the duplicator 310 is described in more detail herein below.

In case of making the input double, provided that bits in one byte is represented to a, b, c, d, e, f, g, h starting from the most significant bit (MSB) and input in that order, the output of the duplicator 310 can be represented to a, a, b, b, c, c, d, d, e, e, f, f, g, g, h, h. It is noted that, starting from the MSB, 2-byte output consisting of 1 byte of a, a, b, b, c, c, d, d and 1 byte of e, e, f, f, g, g, h, h is output in succession.

In case of making the input quadruple, the output of the duplicator 310 can be expressed as a, a, a, a, b, b, b, b, c, c, c, c, d, d, d, d, e, e, e, e, f, f, f, f, g, g, g, g, h, h, h, h. As such, 4 bytes are output. Meanwhile, the duplicator 310 may fill positions other than the designated position, with an arbitrary value, that is, with null data, without having to duplicating the input bits. For instance, when doubling the input, the duplicator 310 may maintain the former part of two successive bits in the original input, and input an arbitrary value in the latter part, such as a, x, b, x, c, x, . . . , instead of a, a, b, b, c, c, . . . . Conversely, the latter part of the original input may be maintained. In case of quadrupling the output, the original input is arranged at one of first, second, third, and fourth positions and other positions are filled with arbitrary values, which will be explained below.

The service MUX 320 multiplexes the normal stream received separately and the turbo stream processed at the duplicator 310. Thus, the dual transport stream (TS) is generated and provided to the randomizer 150.

FIG. 5B is a block diagram for illustrating an example in which a Reed-Solomon (RS) encoder 330 is added to the TS generator 300 shown in FIG. 5A. In FIG. 5B, the RS encoder 330 serves to encode the received turbo stream by adding a parity, and then provides the encoded turbo stream to the duplicator 310. Hence, the duplicator 310 generates the second parity insertion region to the encoded turbo stream. In doing so, the duplicator 310 can generate the second parity insertion region at ½ or ¼ rate.

FIG. 5C is a block diagram for illustrating an example in which an interleaver 340 is added to the TS generator 300 shown in FIG. 5B. In FIG. 5C, the interleaver 340 serves to interleave the turbo stream encoded by the RS encoder 330. To ease the understanding, the interleaver 340 may be called a free-interleaver. Note that positions of the interleaver 340 and the duplicator 310 can be switched in FIG. 5C.

Figure 6:
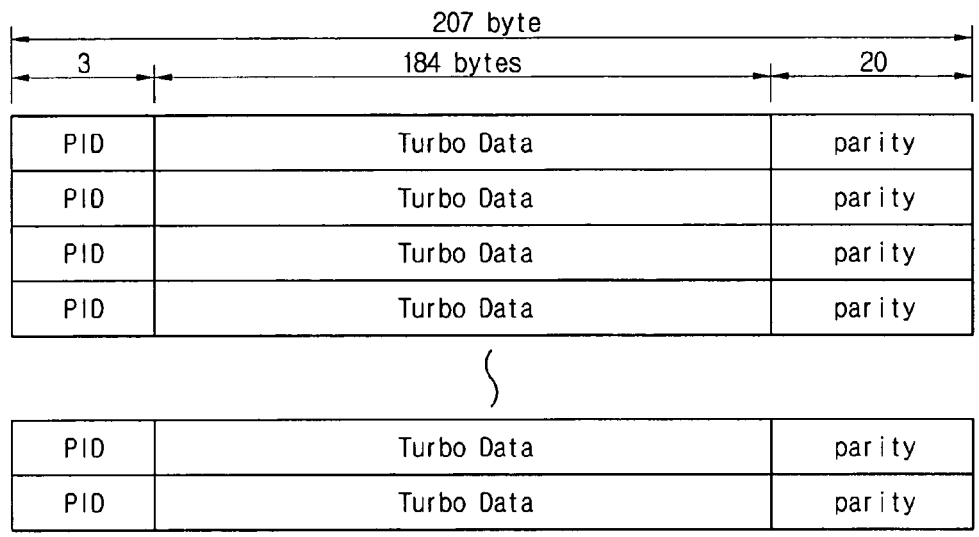
FIG. 6 is a conceptual diagram of an output stream structure of an example RS encoder in the transport stream (TS) generator according to an embodiment of the present invention.

FIG. 6 is a conceptual diagram of a turbo stream structure output from the RS encoder 330 shown in FIGS. 5B and 5C. Referring to FIG. 6, the received turbo stream has 188 bytes, including a 1-byte sync signal (not shown), a 3-byte packet identifier (PID), and 184 bytes of turbo data. The 1-byte sync signal is removed from the 188-byte turbo stream initially received and 20 bytes of parity data is added to the remaining 187 bytes, resulting in a packet stream of 207 bytes in total being output.

Figure 7A:
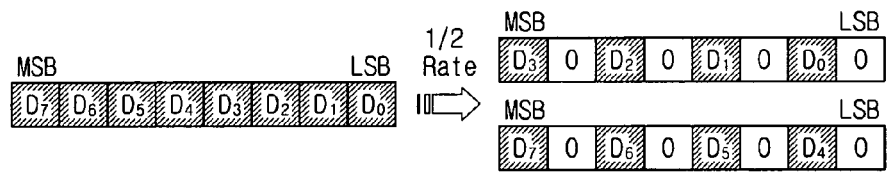
FIGS. 7A and 7B are conceptual diagram for illustrating how a parity insertion region is provided at the transport stream (TS) generator which is applied to the digital broadcasting transmission system shown in FIG. 4.
Figure 7B:
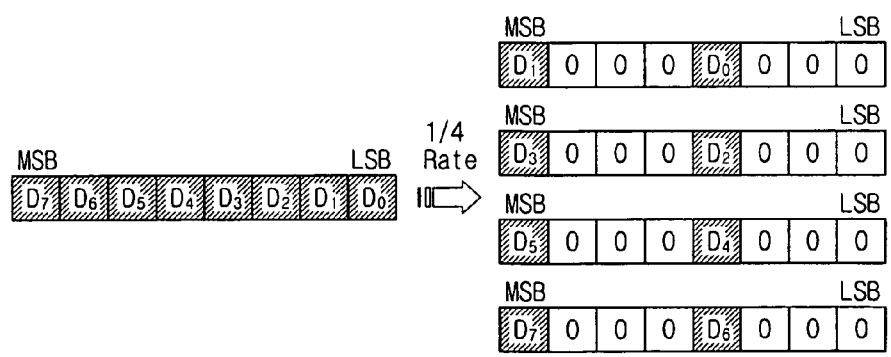

FIGS. 7A and 7B are conceptual diagram for illustrating how a parity insertion region is provided by the duplicator 310 according to an embodiment of the present invention. First, FIG. 7A shows a ½ rate conversion. Referring to FIG. 7A, one byte including D0~D7bits is expanded to a first byte including D0~D3bit and a second byte including D4~D7bit. Bits between the first byte and the second byte are used as the first parity insertion region. In specific, as for the first and second bytes, 2, 4, 6, $8^{th}$ bits are used as the first parity insertion region. It is noted that the position of the first parity insertion region may be changed variously. For instance, 2, 3, 6 and $7^{th}$ bits or 3, 4, 5 and $6^{th}$ bits can be used as the first parity insertion region.

FIG. 7B shows a ¼ rate conversion. In FIG. 7B, one byte including D0~D7bits is expanded to a first byte including D0and D1bits, a second byte including D2and D3bits, a third byte including D4and D5bits, and a fourth byte including the D6and D7bits. Although 2, 3, 4, 6, 7 and $8^{th}$ bits of each byte are used as the first parity insertion region shown in FIG. 7B, this structure is not limited to this example.

Figure 8:
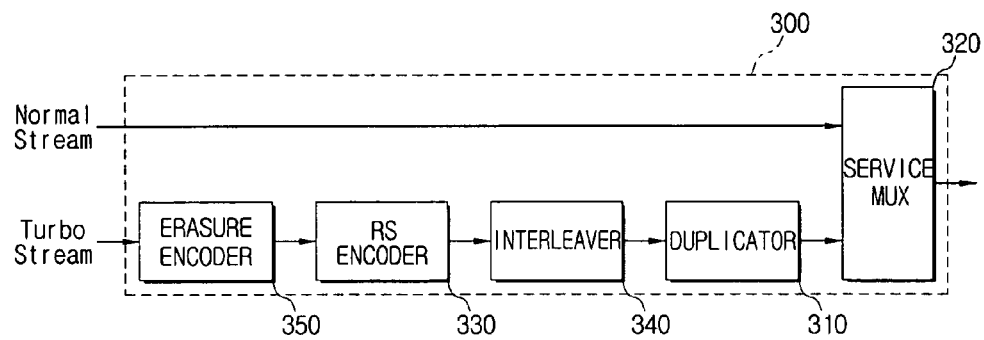
FIG. 8 is a block diagram of an example transport stream (TS) generator including an erasure encoder according to an embodiment of the present invention.

FIG. 8 is another block diagram of an example TS generator 300 according to another embodiment of the present invention. As shown in FIG. 8, the TS generator 300 is further provided with an erasure encoder 350 which is added to the TS generator 300 shown in FIG. 5C.

The erasure encoder 350 functions to perform the erasure encoding to eliminate noise in the received turbo stream. By eliminating the noise of the turbo stream, the reception performance can be far more improved. The RS encoder 330 performs error correction encoding with respect to the turbo stream which has passed through the erasure encoding. The interleaver 340 then interleaves the encoded turbo stream. The duplicator 310 generates a second parity insertion region in the interleaved turbo stream. The service MUX 320 generates a dual transport stream (TS) by multiplexing the turbo stream having the second parity insertion region and the normal stream.

Figure 9:
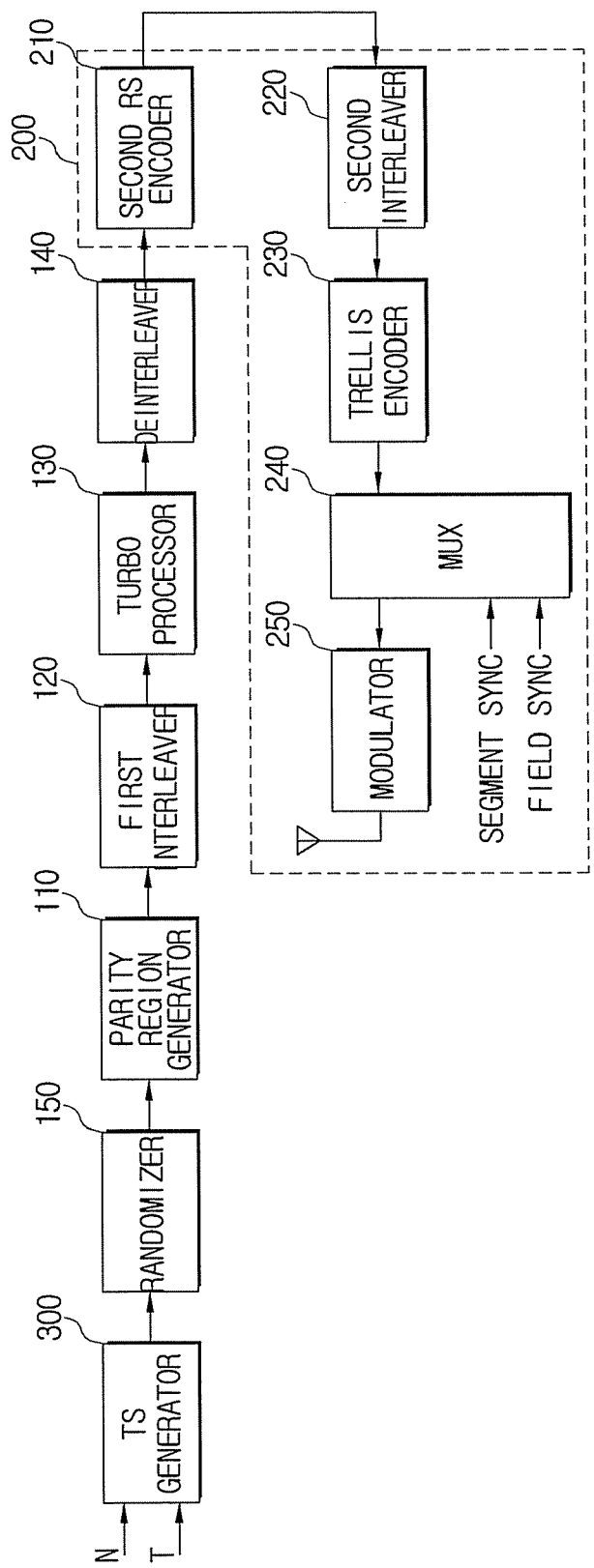
FIG. 9 is a further detail block diagram of the digital broadcasting transmission system shown in FIG. 4.

FIG. 9 is a detailed block diagram of the transmitter 200 of the digital broadcasting transmission system shown in FIG. 4. Referring to FIG. 9, the transmitter 200 includes a second RS encoder 210, a second interleaver 220, a trellis encoder 230, a multiplexer (MUX) 240, and a modulator 250. Since all the elements, except for the transmitter 200, have the same functions as those shown in FIGS. 3 and 4, their detailed descriptions will be omitted for the sake of brevity. In FIG. 9, all of the elements except for the TS generator 300, may be collectively referred to as an "exciter". That is, FIG. 9 may be considered to show a digital broadcasting transmission system including the TS generator 300 and an exciter, wherein the exciter is composed of the randomizer 150, the parity region generator 110, the first interleaver 120, the turbo processor 130, the deinterleaver 140, and the transmitter 200.

The second RS encoder 210 is responsible for encoding the dual transport steam (TS) provided from the deinterleaver 220 by adding the parity. In specific, the second RS encoder 210 inserts the parity, which is calculated with respect to the dual transport stream (TS), into the first parity insertion region generated by the parity region generator 110.

The second interleaver 220 interleaves the parity-inserted dual transport stream (TS). The trellis encoder 230 trellis-encodes the dual transport stream (TS) interleaved by the second interleaver 220. The MUX 240 multiplexes the trellis-encoded dual transport stream (TS) by adding a segment sync signal and a field sync signal.

The modulator 250 modulates channel of the multiplexed dual transport stream (TS), up-coverts the modulated stream to a signal of the RF channel band, and then transmits the converted signal. The dual transport stream (TS) from the modulator 250 is transmitted to various reception systems through the channel.

Although it is not illustrated in FIG. 9, the transmitter 200 may further include typical elements for the signal transmission, such as power amplifier (not shown) for amplifying power of the converted signal and an antenna (not shown).

Figure 10:
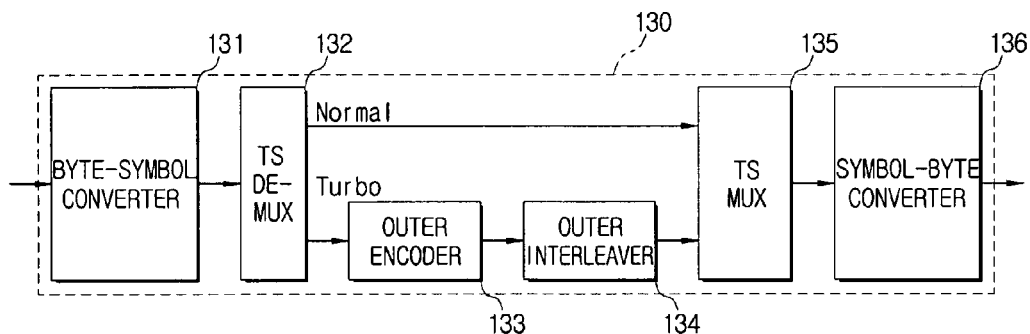
FIG. 10 is a block diagram of an example turbo processor according to an embodiment of the present invention.

FIG. 10 is a block diagram of an example turbo processor 130 which is applied to various embodiments of the digital broadcasting transmission system shown in FIGS. 3, 4 and 9. As shown in FIG. 10, the turbo processor 130 includes a byte-symbol converter 131, a TS demultiplexer (DE-MUX) 132, an outer encoder 133, an outer interleaver 134, a TS multiplexer (MUX) 135, and a symbol-byte converter 136.

Note that the byte-symbol converter 131, the TS DE-MUX 132, the TS MUX 135 and the symbol-byte converter 136 can be omitted and replaced by other elements.

The byte-symbol converter 131 converts the dual transport stream (TS) interleaved by the first interleaver 120 from bytes to symbols. Please refer to table D5.2 of the ATSC DTV Standard (A/53) for detailed descriptions about the conversion from the byte to the symbol, the information of which is incorporated by reference herein.

The TS DE-MUX 132 detects the turbo stream by demultiplexing the dual transport stream (TS) converted to the symbols.

The outer encoder 133 encodes the turbo stream by calculating a parity for the detected turbo stream and inserting the calculated parity into the second parity insertion region. In doing so, the outer encoder 133 encodes the turbo stream by the byte.

The outer interleaver 134 interleaves the convolutionally encoded turbo stream. The outer interleaver 134 performs the interleaving by the bit.

The transport stream (TS) MUX 135 constructs the dual transport stream (TS) by multiplexing the interleaved turbo stream and the normal stream. In specific, the TS MUX 135 constructs the dual transport stream (TS) by stuffing turbo stream to the position prior to the detection of the TS DE-MUX 132. The TS MUX 135 may be referred to as a service multiplexer (MUX).

The symbol-byte converter 136 converts the dual transport stream (TS) from the symbols to the bytes. Please refer to table D5.2 of the ATSC DTV Standard (A/53) for more descriptions about the conversion from the symbol to the byte, the information of which is incorporated by reference herein.

Figure 11:
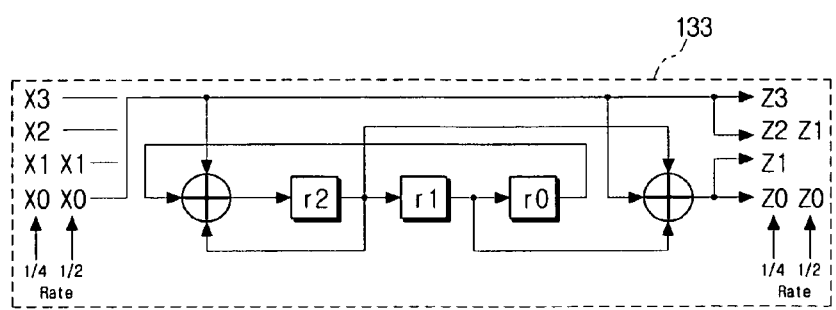
FIG. 11 is a block diagram of an outer encoder which is applied to the turbo processor shown in FIG. 10.

FIG. 11 is a block diagram of an example outer encoder 133 which is applied to the turbo processor 130 shown in FIG. 10. Referring to FIG. 11, the outer encoder 133 includes a shift register r0, r1 and r2, and an adder. Accordingly, the outer encoder 133 can insert the parity into the second parity insertion region by convolutionally encoding in the type of recursive systematic convolutional (RSC) code. The outer encoder 133 is able to encode at ½ rate or ¼ rate. The encoding at the outer encoder 2 is illustrated in reference to FIGS. 12A and 12B.

Figure 12A:
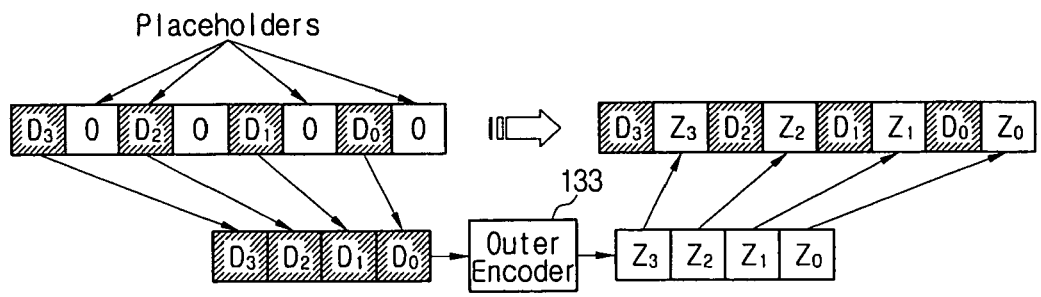
FIGS. 12A and 12B are conceptual diagrams for illustrating an operation of an outer encoder applied to the turbo processor shown in FIG. 10.

FIG. 12A is a conceptual diagram for illustrating at the ½ rate. In FIG. 12A, in one byte including D0~D3bits and null data (e.g., 0), parity bits Z0~Z3 corresponding to D0~D3bits are generated. The generated parity bits are inserted to the position of the null data, that is, the second parity insertion region. As a result, the encoded byte is D3, Z3, D2, Z2, D1, Z1, D0, Z0.

Figure 12B:
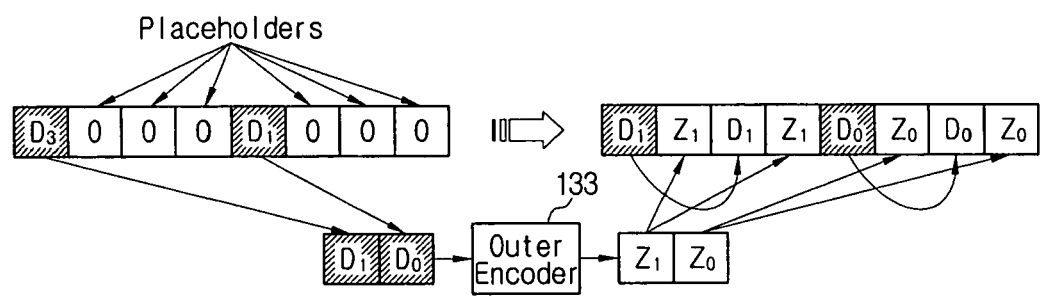

FIG. 12B is a conceptual diagram for illustrating at the ¼ rate. In FIG. 12B, in one byte including D0 and D1 bits and null data, parity bits Z0 and Z1corresponding to D0and D1bits are generated. The generated parity bits are inserted to the position of the null data, that is, the second parity insertion region. Addition to the generated parity bits, D0and D1 bits are re-inserted. Hence, the bits and the parity can be recorded repeatedly. As shown in FIG. 12B, the encoded byte is D1, Z1, D1, Z1, D0, Z0, D0, Z0.

Figure 13:
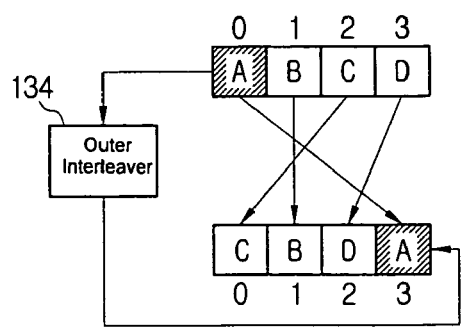
FIG. 13 is a conceptual diagram for illustrating an operation of an outer interleaver applied to the turbo processor shown in FIG. 10.

FIG. 13 is a conceptual diagram for illustrating the interleaving of an example outer interleaver 134 which is applied to the turbo processor 130 shown in FIG. 10. Referring to FIG. 13, the outer interleaver 134 interleaves the convolutionally encoded turbo stream according to a predetermined interleaving rule. For instance, when "ABCD" is input in order while the interleaving rule is {2, 1, 3, 0}, the outer interleaver 134 interleaves to and outputs "CBDA".

Figure 14:
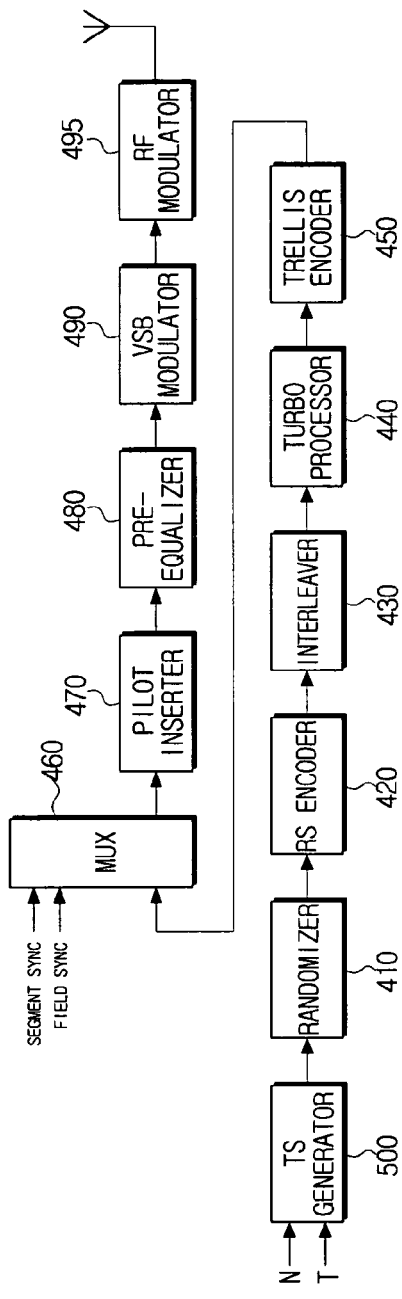
FIG. 14 is a block diagram of a digital broadcasting transmission system according to another embodiment of the present invention.

FIG. 14 is a block diagram of a digital broadcasting transmission system according to another embodiment of the present invention. Referring now to FIG. 14, the digital broadcasting transmission system includes a TS generator 500, a randomizer 410, a RS encoder 420, an interleaver 430, a turbo processor 440, a trellis encoder 450, a MUX 460, a pilot inserter 470, a pre-equalizer 480, a VSB modulator 490, and an RF modulator 495.

The TS generator 500 constructs a dual transport stream (TS) by receiving and multiplexing a normal stream and a turbo stream. In more detail, the turbo stream and the normal stream are received separately. After processing, such as encoding and interleaving, the turbo stream, the processed turbo stream and the normal stream are multiplexed to thus generate the dual transport stream (TS). It is noted that the TS generator 500 may be implemented in the structure similar to the TS generator 300 shown in FIGS. 5A, 5B, 5C and 8.

The randomizer 410 receives and randomizes the dual transport stream (TS) output from the TS generator 500. The RS encoder 420 encodes the randomized dual transport stream (TS) by inserting a parity for error correction. The interleaver 430 interleaves the parity-inserted dual transport stream (TS).

The turbo processor 440 convolutionally encodes the turbo stream included in the interleaved dual transport stream (TS), and interleaves the convolutionally encoded turbo stream. Next, the turbo processor 440 reconstructs the dual transport stream (TS) by inserting the interleaved turbo stream into the dual transport stream (TS).

Meanwhile, in an example embodiment of the digital broadcasting transmission system shown in FIG. 9, the turbo processor 130 is positioned at the front end of the second RS encoder 210. Thus, the parity can be inserted correctly since the parity is re-inserted after the turbo stream, having the inserted parity by the convolutional encoding, is inserted to the dual transport stream (TS). However, in an example embodiment of the digital broadcasting transmission system shown in FIG. 14, the turbo processor 440 is positioned at the back end of the RS encoder 420. Thus, as the parity is inserted by the convolutional encoding of the turbo processor 440, the whole parity of the dual transport stream (TS) is changed. Therefore, the turbo processor 440 corrects the parity by regenerating and inserting the parity with respect to the reconstructed dual transport stream (TS).

The trellis encoder 450 trellis-encodes the turbo-processed dual transport stream (TS). The MUX 460 can multiplex the trellis-encoded dual transport stream (TS) by adding a segment sync signal and a field sync signal.

The pilot inserter 470 inserts a pilot by adding a predetermined direct current (DC) value to the dual transport stream (TS) having the sync signals. The pre-equalizer 480 equalizes the pilot-inserted dual transport stream (TS) to minimize intersymbol interference.

The VSB modulator 490 VSB-modulates the equalized dual transport stream (TS). The RF modulator 495 modulates the VSB-modulated dual transport stream (TS) to a signal of the RF channel band.

The example embodiment of the digital broadcasting transmission system shown in FIG. 14 has the more simplified structure than that shown in FIG. 9, because the elements such as parity region generator 110, the first interleaver 120 and the deinterleaver 140 are omitted.

Figure 15:
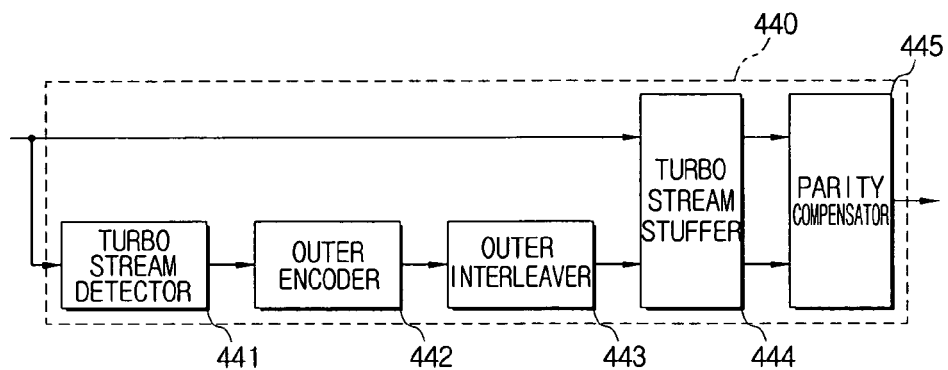
FIG. 15 is a block diagram of an example turbo processor which is applied to the digital broadcasting transmission system shown in FIG. 14.

FIG. 15 is a block diagram of an example turbo processor 440 which is applied to the digital broadcasting transmission system shown in FIG. 14. In FIG. 15, the turbo processor 440 includes a turbo stream detector 441, an outer encoder 442, an outer interleaver 443, a turbo stream stuffer 444, and a parity compensator 445.

The turbo stream detector 441 detects the turbo stream from the dual transport stream (TS). Specifically, the turbo stream detector 441 can be implemented using a demultiplexer (DE-MUX), but is not limited thereto.

The outer encoder 442 encodes the turbo stream by adding the parity to the first parity insertion region in the detected turbo stream. The outer interleaver 443 interleaves the encoded turbo stream. The turbo stream stuffer 444 reconstructs the dual transport stream (TS) by multiplexing the interleaved turbo stream and the normal stream. The turbo stream stuffer 444 can be implemented using a multiplexer (MUX), but is not limited thereto.

The parity compensator 445 compensates the parity error resulting from the turbo stream encoding by regenerating and adding the parity to the reconstructed dual transport stream (TS).

The turbo processor 440 as shown in FIG. 15, may further include a byte-symbol converter (not shown) for converting the dual transport stream (TS) from the bytes to the symbols and providing the converted dual transport stream (TS) to the turbo stream detector 41, and a symbol-byte converter (not shown) for converting the dual transport stream (TS) output from the parity compensator 445 from the symbols to the bytes and outputting the converted dual transport stream (TS).

FIGS. 16A through 16E are conceptual diagrams for illustrating various structures of a dual transport stream (TS) which is transmitted from different embodiments of the digital broadcasting transmission system shown in FIGS. 3, 4, 9 and 14.

Figure 16A:
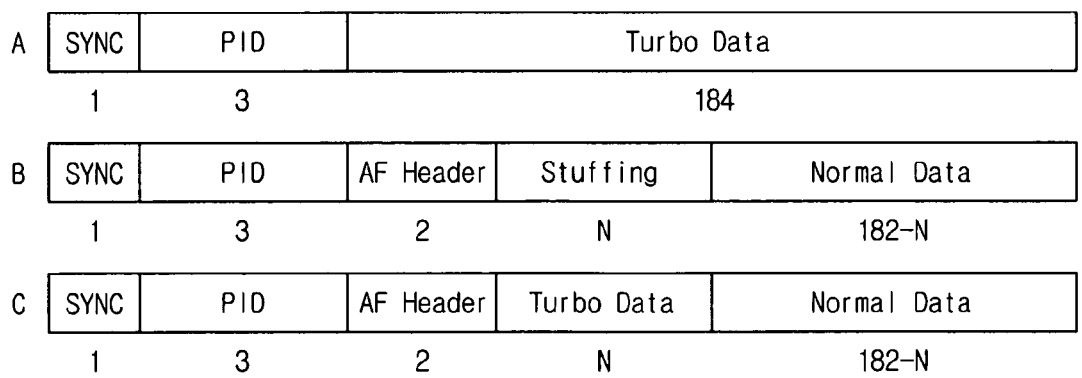

In FIG. 16A, "A" shows the normal stream packet received at the TS generator 300, shown in FIGS. 3, 4, 9, and at the TS generator 500, shown in FIG. 14; "B" shows the turbo stream packet received at the TS generator 300 and 500, and "C" shows the dual transport stream (TS) packet constructed at the TS generator 300 and 500. As shown in FIG. 16A, the turbo stream packet A includes a sync signal, a packet identifier (PID), and a robust data region. More specifically, the whole turbo stream packet can consist of 188 bytes, in which the sync signal is 1 byte, the PID is 3 bytes, and the robust data is 184 bytes.

The normal stream packet B includes a sync signal (SYNC), a PID, an adaptation field (AF) header, a stuffing region, and a normal data region. Specifically, the whole normal stream packet can consist of 188 bytes, in which the SYNC is 1 byte, the PID is 3 bytes, the AF header is 2 bytes, and null data is N bytes, and the normal data is 182-N-S bytes. The AF header is a region where information is recorded to inform position, size and the like of the AF.

In the dual TS packet C, part of the turbo stream packet A is inserted to the stuffing region of the normal stream packet B. Still referring to FIG. 16A, the 188-byte dual TS packet consists of 1-byte SYNC, 3-byte PID, 2-byte AF header, N-byte robust data, and 182-N-byte normal data.

The turbo stream inserted to the dual TS packet C may be part of the turbo stream packet A. In other words, the turbo stream inserted to the dual TS packet C may be at least one of the SYNC, the PID and the robust data.

FIG. 16B shows another example of the dual transport stream (TS) constructed by the TS generator 300 and 500. In FIG. 16B, the dual transport stream (TS) consists of a plurality of successive packets, in which robust data is positioned in specific packets. In more detail, FIG. 16B shows that the turbo stream 78 packets are inserted to 312 packets of the dual TS 1 field. In this case, the dual transport stream (TS) is constructed such that the turbo stream and the normal stream packets are repeated in the ratio of 1:3 by four packets. That is, 1 packet of the turbo stream (188 bytes) and three packets of the normal stream (188 bytes) are connected in succession.

In case that the turbo stream 70 packets are inserted into 312 segments of the dual transport stream (TS), the dual transport stream (TS) can be constructed such that four packets consisting of a turbo stream 1 packet (188 bytes) and normal stream 3 packets (188 bytes) in the ratio of 1:3 are repeatedly arranged for 70 times and the remaining 32 packets consist of the normal stream packet.

FIG. 16C shows still another example of the dual transport stream (TS) constructed by the TS generator 300, as shown in FIGS. 3, 4 and 9, and by the TS generator 500, as shown in FIG. 14. Specifically, FIG. 16C is a conceptual diagram for showing the exemplary dual transport stream (TS) when the turbo stream 88 packets are inserted in a packet of 312 segments of the dual TS 1 field. As shown in FIG. 16C, the dual transport stream (TS) can be constructed such that the turbo stream 2 packets (188 bytes) and the normal stream 2 packets (188 bytes) are repeatedly arranged for 10 times by 4 packets, and that the turbo stream 1 packet (188 bytes) and the normal stream 3 packets (188 bytes) are arranged repeatedly by 4 packets in the ratio of 1:3 with respect to the other segments.

FIG. 16D shows yet another example of the dual transport stream (TS) constructed by the TS generator 300, as shown in FIGS. 3, 4 and 9, and by the TS generator 500, as shown in FIG. 14. FIG. 16D shows the dual transport stream (TS) which is the combination of those of FIGS. 16A and 16B. Specifically, the dual transport stream (TS) is constructed such that turbo stream 1 packet (188 bytes), 1 packet having the turbo stream inserted in part of the AF of the normal stream packet, and normal stream 2 packets are repeatedly arranged by 4 packets.

FIG. 16E is a conceptual diagram of a further example of a dual TS 312-segment packet. Referring to FIG. 16E, packet information together with the turbo stream and the normal stream is included in the dual transport stream (TS). The packet information can be recorded in an option field. In this case, the position of the option field may be designated and fixed so that the position of the option field and the position of the turbo stream may not overlap. In FIG. 16E, m indicates a possible length of the turbo stream (bytes).

Still referring to FIG. 16E, it is noted that a program clock reference (PCR) region is fixed to $15^{th}$. As such, each option field can be fixed to a potion not overlapping with the turbo stream.

By way of example, provided that 312 segments are divided by a unit of 52 segments, the position of the option field can be expressed as follows:

program clock reference (PCR) using 6 bytes: 52n+15, n=0
original program clock reference (OPCR) using 6 bytes: 52n+15, n=1
adaptation field extension length using 2 bytes: 52n+15, n=2
transport private data length using 5 bytes: 52n+15, n=3, 4 5
splice countdown using 1 byte: 52n+15, n=0, 1, 2, 3, 4, 5

Although it is not illustrated in FIG. 16E, it can be seen that "transport private data length" will be positioned in 171, 223 and 275$^{th}$ segments according to the above expressions.

Other than the structures shown in FIGS. 16A through 16E, it is possible to variously construct the dual TS packet in which the turbo stream is inserted in the null data excluding the option field of the adaptation field (AF) header. Additionally, the rate of the turbo stream can be adjusted depending on the structure of the dual TS packet.

Turning now to FIG. 17, a block diagram of a digital broadcasting transmission system having supplementary reference signal (SRS) according to still another embodiment of the present invention is illustrated. As shown in FIG. 17, the digital broadcasting transmission system includes a TS generator 1101, a randomizer 1103, a SRS inserter 1105, a parity region generator 1107, a first interleaver 1109, a turbo processor 1111, a deinterleaver 1113, a RS encoder 1115, a second interleaver 1117, a trellis/parity corrector 1119, a MUX 1121, and a modulator 1123.

The TS generator 1101 can construct a dual TS packet by receiving a normal steam and a turbo stream. In doing so, the TS generator 1101 generates a stuffing region to insert SRS data to each packet of the dual TS stream.

The supplementary reference signal (SRS) is a signal pattern known to both the transmission side and the reception side in common. The reception side can check the channel status and determine the compensation degree by comparing the SRS in the received stream with the known SRS.

The stuffing region is a region generated in part of a packet consisting of header and payload portions for the SRS insertion. In more detail, the packet further includes an adaptation field (AF) header. Part or all of the AF header can be used as the stuffing region. In this situation, the AF header of the packet may additionally include a stuffing region for inserting data for the sake of the initialization of the trellis/parity corrector 1119.

The AF header may include an option field where diverse packet information is recorded. The option field is a program clock reference (PCR) used for the synchronization of a demodulator of the receiver, an original program clock reference (OPCR) used for program recording, timer-recording, and playback at the receiver (e.g., digital broadcasting reception system), four circuit blocks, splice countdown which is the number of succession of macroblocks consisting of a Cr, Cb block respectively, a transport private data length which is the length of text data for teletext, and an adaptation field extension length. It is preferable that the stuffing region and the option field are arranged not to overlap.

Since the TS generator 1101 can be constructed in the manner as shown in FIGS. 5A, 5B, 5C and 8, further descriptions thereof will be omitted for the sake of brevity. In case that the TS generator 1101 has a RS encoder 310 as shown in FIGS. 5B, 5C and 8, the RS encoder can be referred to as a first RS encoder 310 to discriminate from the RS encoder 1115 of an example embodiment of the digital broadcasting transmission system shown in FIG. 17, and the RS encoder 1115 shown in FIG. 17 can be referred to as a second RS encoder 1115.

The randomizer 1103 randomizes the dual transport stream (TS) including the stuffing region. The SRS inserter 1105 inserts a SRS to the stuffing region in the randomized dual transport stream (TS). The SRS can be adopted for the synchronization and/or the channel equalization at the reception side.

The parity region generator 1107 generates a first parity insertion region for inserting parity for the error correction into the dual TS packet having the SRS inserted therein. The first interleaver 1109 interleaves the dual TS packet having the first parity insertion region generated.

The turbo processor 1111 can convolutionally encode the turbo stream included in the interleaved packet, and interleave the convolutionally encoded turbo stream. The turbo processor 1111 can be implemented in the manner as shown in FIG. 10, including, for example, a byte-symbol converter, a TS demultiplexer (DE-MUX), an outer encoder, an outer interleaver, a TS multiplexer (MUX) and a symbol-byte converter. Alternatively, the turbo processor 111 can also be implemented in the manner as shown in FIG. 15, including, for example, a turbo stream detector, an outer encoder, an outer interleaver, a turbo stream stuffer and a parity compensator.

The deinterleaver 1113 can deinterleave the packet output from the turbo processor 1111. The RS encoder 1115 encodes the deinterleaved dual TS packet. More specifically, the RS encoder 1115 is constructed in the type of a concatenated code, to insert the parity for error correction into the first parity insertion region of the packet having the inserted SRS.

The second interleaver 1117 interleaves the dual TS packet having the inserted parity. The trellis/parity corrector 1119 trellis-encodes the packet interleaved by the second interleaver 1117, and corrects the parity.

FIG. 18 is a block diagram of an example trellis/parity corrector 1119 which is applied to an example embodiment of the digital broadcasting transmission system shown in FIG. 17. Referring to FIG. 18, the trellis/parity corrector 1119 includes a trellis encoder block 1401, a RS re-encoder 1403, adder, 1405, a multiplexer (MUX) 1407, and a MAP 1409.

The MUX 1407 can have an operation mode for trellis-encoding the packet interleaved by the second interleaver 1117 (hereinafter, refer to as a "normal mode"), and an operation mode for trellis-encoding the packet added by the adder 1405 (hereinafter, refer to as a "parity correction mode"). The operation mode of the MUX 1407 is determined by a control signal received from the RS re-encoder 1403.

The trellis encoder block 1401 trellis-encodes the packet received from the MUX 1407. The trellis encoder block 1401 is capable of trellis-encoding the packet according to an external control signal. Preferably, the trellis encoder block 1401 is initialized just prior to the trellis-encoding of the SRS data of the packet.

The RS re-encoder 1403 regenerates the parity corresponding to the changed packet during the initialization of the trellis encoder block 1401.

The adder (exclusive OR) 1405 adds the re-encoded parity and the packet fed from the second interleaver 1117, and provides to the MUX 1407. The addition operation is as follows:

A) omitted . . . 10100101011 1001010101011AAAAA . . . omitted

B) omitted . . . 00000000000010000000000BBBBB . . . omitted

C) omitted . . . 10100101011101101010101111CCCCC . . . omitted

A) shows the packet received from the second interleaver 1117; B) shows the RS re-encoded packet; and C) shows the result of the exclusive OR of A) and B) using the adder 1405. When the underlined part in the A) is input to the trellis encoder block 1401, the initialization is conducted. At this time, a value corresponding to a pre-stored value in the trellis encoder block 1401 is provided to the RS re-encoder 1403. The RS re-encoder 1403 outputs the packet B) by adding the parity to the provided value. The underlined part in the packet B) implies a changed value corresponding to the underlined part of the packet A). It is noted that the parity corresponding to the underlined part in the packet B) is re-generated to "BBBBB".

The adder 1405 outputs the packet C) by performing the exclusive OR to the packet A) and the packet B). As one can appreciate, in the packet C), the underlined part in the packet A) initially input is changed to "01" and the pity is also changed from "AAAAA" to "CCCCC".

The MUX 1407 operates in the normal operation mode when the initialization and the parity correction are completed, and provides the dual transport stream (TS) to the trellis encoder block 1401. The MAP 1409 performs the symbol mapping to 8 levels with respect to the trellis-encoded packet, and outputs the mapped packet.

FIG. 19 is a block diagram of an example trellis encoder block 1401 included in the trellis/parity corrector 1119 which is applied to the digital broadcasting transmission system shown in FIG. 17. As shown in FIG. 19, the trellis encoder block 1401 includes a plurality of trellis encoders 1501A-1501N. Specifically, there are twelve (12) trellis encoders arranged in parallel to receive an incoming packet. Accordingly, the trellis encoders 1 through 12 are consecutively selected in order according to the received packet, and output the trellis value, respectively. As mentioned earlier, during the initialization period, a value corresponding to the pre-stored value in a register (not shown) of the trellis encoder is provided to the RS re-encoder 1403 as the initialization value.

FIG. 20 is a block diagram of an example trellis encoder employed in the trellis encoder block 1401 shown in FIG. 19. As shown in FIG. 20, the trellis encoder 1501A-1501N includes two multiplexers (MUXs) 1601 and 1601, three memories 1603, 1604 and 1605, and two adders 1606 and 1607.

The trellis encoder 1501A-1501N carries out the initialization just before the trellis encoding of the SRS in the interleaved dual transport stream (TS). In detail, upon receiving the stream corresponding to the stuffing region generated in the AF for the initialization, the trellis encoder 1501A-1501N, as shown in FIG. 20, performs the initialization. When the initialization period is opened, a control signal is fed to the first and second MUXs 1601 and 1602. The first MUX 1601 selects either the value stored in the third memory (S2) 1605 or D1 depending on the control signal and outputs the selected one to the first adder 1606. The second MUX 1602 selects either the value stored in the first memory (S0) 1603 or D0 depending on the control signal and outputs the selected one to the second adder 1607.

When the control signal "1" is input, the first MUX 1601 selects and outputs the stored value of the third memory (S2) 1605 to the first adder 1606. The first adder 1606 adds the output value of the first MUX 1601 with the stored value of the third memory (S2) 1605. The resultant value is output as Z2 and stored in the third memory (S2) 1605 at the same time. Since the two inputs to the first adder 1606 are the same, the output value of the first adder 1606 is zero (0) all the time. Thus, zero (0) is stored in the third memory S21605 to initialize.

As such, the input value D1 is replaced by the stored value of the third memory (S2) 1605. Accordingly, the parity assigned to the dual transport stream TS including the input value D1 is incorrect. To compensate the parity, the existing value stored in the third memory (S2) 1605 is output as the initialization value X1 and provided to the RS re-encoder 1403.

The second MUX 1602 selects and outputs the stored value of the first memory (S0) 1603 when the control signal is "1". The output value of the second MUX 1602 is output as Z1 and provided to the second adder 1607 at the same time. The output value of the second MUX 1602 is output as the initialization value X as well. The value stored in the first memory (S0) 1603 is fed directly to the second adder 1607. Hence, the second adder 1607 adds two same values and outputs "0". Simultaneously, the existing value stored in the second memory (S1) 1604 is shifted to the first memory (S0) 1603. The existing value stored in the second memory (S1) 1604 is output as Z0.

When the control signal 1 is input again, since the value stored in the second memory (S1) 1604, that is, "0" is shifted to the first memory (S0) 1603, the first memory (S0) 1603 is also initialized. Simultaneously, the second MUX 1602 outputs the current value stored in the first memory (S0) 1603, that is, the value stored in the second memory (S1) 1604 prior to the initialization, is output as X0 value. The X0 value is also provided to the RS re-encoder 1403 together with the X1 value.

As for the non-initialization period, a control signal 0 is input to the first and second MUXs 1601 and 1602. Hence, as D0 and D1 are respectively selected, the trellis encoding is performed. The control signal "0" or "1" can be received from a control signal generator (not shown) separately equipped.

As described, when the initialization is performed, each trellis encoder 1501A-1501N, as shown in FIG. 20, outputs the value corresponding to the internal memory value being pre-stored, stored, as the initialization value.

In the meantime, two memories 1603 and 1604 are disposed at the second MUX 1602, control signal 2 symbols are required to initialize the memories 1603 and 1604. There are eight initialization states (000, 111, 001, 010, 100, 110, 101, 011) that can be generated using all of the three memories 1603, 1604 and 1605. X0 and X1 values corresponding to each initialization state are provided to the RS re-encoder 1403, respectively, to change the parity. The operation of the RS re-encoder 1403 has been explained earlier.

The resetting process of the trellis encoder 1501A-1501 N, as shown in FIG. 20, is specified based on the following table.

TABLE 1

| Reset at t = 0 | (S0, S1, S2), (X0, X1) at t = 0 | (S0, S1, S2), (X0, X1) at t = 1 | (S0, S1, S2) Next Stage at t = 2 | Output Z2 Z1 Z0 |
|---|---|---|---|---|
| 1 | (0, 0, 0), (0, 0) | (0, 0, 0), (0, 0) | (0, 0, 0) | 000 |
| 1 | (0, 0, 1), (0, 1) | (0, 0, 0), (0, 0) | (0, 0, 0) | 000 |
| 1 | (0, 1, 0), (0, 0) | (1, 0, 0), (1, 0) | (0, 0, 0) | 000 |
| 1 | (0, 1, 1), (0, 1) | (1, 0, 0), (1, 0) | (0, 0, 0) | 000 |
| 1 | (1, 0, 0), (1, 0) | (0, 0, 0), (0, 0) | (0, 0, 0) | 000 |
| 1 | (1, 0, 1), | (0, 0, 0), (0, 0) | (0, 0, 0) | 000 |

TABLE 1-continued

| Reset at t = 0 | (S0, S1, S2), (X0, X1) at t = 0 | (S0, S1, S2), (X0, X1) at t = 1 | (S0, S1, S2) Next Stage at t = 2 | Output Z2 Z1 Z0 |
|---|---|---|---|---|
| 1 | (1, 1)<br>(1, 1, 0),<br>(1, 0) | (1, 0, 0), (1, 0) | (0, 0, 0) | 000 |
| 1 | (1, 1, 1),<br>(1, 1) | (1, 0, 0), (1, 0) | (0, 0, 0) | 000 |

In Table 1, the initialization commences when the control signal, that is, the reset signal becomes "1" at t=0, and all of S0, S1 and S2 become 0 after t=2. As such, the initialization is completed during the two-symbol clock period.

FIGS. 21A through 21E are conceptual diagrams for illustrating various structures of a dual transport stream (TS) having a supplementary reference signal (SRS) according to an embodiment of the present invention. Referring to FIG. 21A, the packet A is a turbo stream packet received at the TS generator 1101, the packet B is a normal stream packet having stuffing regions for inserting the SRS data and the turbo stream, and the packet C is a dual TS packet having SRS and the turbo stream inserted in the stuffing regions. In the packet A, the turbo stream packet of 188 bytes consists of a 1-byte SYNC being the header, a 3-byte PID, and a 184-bytes turbo data.

In packet B, the normal stream packet of 188 bytes consists of a 1-byte SYNC being the header, a 3-byte PID, a 2-byte AF header which is the AF, a S-bytes stuffing region for the SRS insertion, a N-bytes stuffing region for the turbo data insertion, and a 182-S-N-byte normal data being the payload.

The packet C is constructed such that SRS data is inserted in the stuffing region S and part of the turbo stream packet is inserted in the stuffing region N of the packet B. As for the packet C, the dual TS packet of 188 bytes consists of a 1-byte SYNC being the header, a 3-byte PID, a 2-byte AF header which is the AF, a S-byte SRS data, a N-byte turbo data, and a 182-S-N-byte normal data being the payload.

FIG. 21B shows another exemplary dual transport stream (TS). In the dual transport stream (TS) as shown in FIG. 21 B, the turbo stream 78 packets are inserted in the packet of 312 segments of the dual TS 1 field. The dual transport stream (TS) is constructed by repeating 4 packets in which one turbo stream packet (188 byte) and three normal stream packets (188 bytes) are arranged in the ratio of 1:3. In case that the turbo stream 70 packets are inserted in the 312 segments of the dual transport stream (TS), the dual transport stream (TS) is constructed by repeating 4 packets in which one turbo stream packet (188 bytes) and three normal stream packets (188 bytes) are arranged in the ratio of 1:3, for 70 times, and arranging the rest 32 packets with the normal stream packets.

FIG. 21C shows still another example of the dual transport stream (TS). In the dual transport stream (TS) as shown in FIG. 21C, the turbo stream 88 packets are inserted in a packet of 312 segments of the dual Ts 1 field. The dual transport stream (TS) is constructed by repeatedly arranging four packets in which the turbo stream 2 packets (188 byte) and the normal stream 2 packets (188 bytes) are arranged, for time times, and four packets in which the turbo stream 1 packet 188 byte and the normal stream 3 packets (188 bytes) are arranged in the ratio of 1:3 as shown in FIG. 21B.

FIG. 21D shows yet another example of the dual transport stream (TS). The dual transport stream (TS) as shown in FIG. 21D is a combination of the packet C shown in FIG. 21A and that shown in FIG. 21B. The dual transport stream (TS) as shown in FIG. 21D is constructed by repeatedly arranging four packets in which the turbo stream 1 packet (188 bytes), the normal stream 1 packet having SRS data and turbo data inserted in part of the AD field, and the normal stream 2 packets are positioned.

FIG. 21E is a conceptual diagram illustrating only 52-segments packet of the dual transport stream (TS) multiplexed as in the packet C shown in FIG. 21A. In FIG. 21E, it is noted that the turbo data, that is, the turbo stream is inserted after the SRS data. Tunneling data channel (TDC) is an empty region to be used by the user if necessary. The TDC can occupy 6 bytes in the stuffing region at maximum. The TDC may be positioned at the front end in the stuffing region where the SRS is recorded, or between the SRS data.

Provided that 312 segments are divided by 52 segments, the position of the option field can be expressed as follows:
PCR using 6 bytes: 52n+15, n=0
OPCR using 6 bytes: 52n+15, n=1
adaptation field extension length using 2 bytes: 52n+15, n=2
transport private data length using 5 bytes: 52n+15, n=3, 4, 5
splice countdown using 1 byte: 52n+15, n=0, 1, 2, 3, 4, 5
By way of example, the PCR denotes that there is PCR at the position at n=0.

The dual TS packet having the SRS data inserted in the stuffing region excluding the option field of the AF can be constructed variously. The rate of the turbo data is adjustable according to the structure of the dual TS packet.

FIG. 22 is a conceptual diagram for illustrating an example stream structure interleaved by the second interleaver 1117. In FIG. 22, "A", which is the stuff byte, indicates the SRS 1 through 27. "B", which is the initialized stuff byte, indicates the region for initializing the trellis/parity corrector 1119. "C", which is the RS re-encoded parity, indicates the region where the parity corresponding to the packet changed by the initialization of the trellis encoder is replaced with the regenerated parity. "D", which is the RS parity, indicates the parity region generated by the RS encoding.

FIG. 23 is a block diagram of a digital broadcasting transmission system according to yet another embodiment of the present invention, which outputs the dual transport stream (TS) having the inserted SRS. As shown in FIG. 23, the digital broadcasting transmission system can be implemented such that a trellis-parity corrector 1119 includes a trellis encoder 1700 and a compatibility parity generator 1750.

The trellis encoder 1700 trellis-encodes the dual transport stream (TS) interleaved by a second interleaver 1117. At this time, the trellis encoder 1700 performs the initialization just before the trellis encoding of the SRS data.

The trellis encoder 1700 operates in one of a normal mode for trellis-encoding the interleaved packet, an initialization mode for initializing the trellis encoder 1700, and a parity exchange mode for inserting the replaced compatibility parity instead of part or all of the parity added by a RS encoder 1115. While operating in the normal mode, when a control signal instructing the initialization mode is received, the trellis encoder 1700 operates in the initialization mode. When receiving a control signal instructing the parity exchange mode, the trellis encoder 1700 operates in the parity exchange mode. The operation mode can be determined according to the control signal fed from a control signal generator (not shown). For doing so, the control signal generator (not shown) needs to be aware of a position where the SRS data is inserted, a position of a value inserted for the initialization of the trellis encoder 1700, and a position for changing the compatibility parity in advance.

A compatibility parity generator 1750 receives the packet having the parity added by the second RS encoder 1115 and the packet encoded by the trellis encoder 1700, generates a compatibility parity based on the received packets, and provides the generated compatibility parity to the trellis encoder 1700. The trellis encoder 1700 compensates the parity by inserting the compatibility parity to the dual transport stream (TS).

A MUX 1121 multiplexes the trellis-encoded packet by adding a segment sync signal and a field sync signal. A modulator 1123 conducts channel modulation with respect to the packet having the added segment sync and field sync signals, up-converts to a signal of the RF channel band, and transmits the up-converted signal.

FIG. 24 is a block diagram of an example compatibility parity generator 1750 which is applied to the digital broadcasting transmission system shown in FIG. 23. As shown in FIG. 24, the compatibility parity generator 1750 includes a symbol deinterleaver 2901, a deinterleaver 2903, a storage 2905, a RS encoder 2907, an interleaver 2909, and a symbol interleaver 2911.

The symbol deinterleaver 2901 receives the packet encoded by the trellis encoder 1700 and performs the symbol interleaving to the symbol-mapped packet by the byte. The deinterleaver 2903 deinterleaves the symbol-deinterleaved packet.

The storage 2905 receives the packet encoded by the RS encoder 1115, replaces at least part of the received packet with the packet deinterleaved at the deinterleaver 2903, and then stores the replaced packet. The storage 2905 may store the packet by replacing only the different part of the encoded packet and the deinterleaved packet. The storage 2905 can be controlled by a control signal received from the control signal generator.

The RS encoder 2907 adds the compatibility parity to the stored packet. The interleaver 2909 interleaves the packet having the added compatibility parity. The symbol interleaver 2911 interleaves the symbols of the byte-wise packet being interleaved and provides the symbol-interleaved packet to the trellis encoder 1700.

FIG. 25 is a block diagram of a digital broadcasting transmissions system according to a further embodiment of the present invention. As shown in FIG. 25, the digital broadcasting transmissions system includes a TS generator 500, a randomizer 410, a SRS generator 415, a RS encoder 420, an interleaver 430, a turbo processor 440, a trellis/parity corrector 1119, a MUX 460, a pilot inserter 470, a pre-equalizer 480, a VSB modulator 490, and a RF modulator 495. The digital broadcasting system of FIG. 25 has the structure in which the SRS generator 1805 is added to the digital broadcasting transmission system of FIG. 14. Accordingly, the dual transport stream (TS) including the SRS signal, the normal stream, and the turbo stream can be transmitted through the transmission system of the more simplified structure.

When the TS generator 500 constructs the dual transport stream (TS) including the stuffing region, the normal stream and the turbo stream, the randomizer 410 randomizes the dual transport stream (TS)(and provides the randomized dual transport stream (TS) to the SRS generator 415. The SRS generator 415 inserts the SRS signal to the whole or part of the stuffing region in the randomized dual transport stream (TS).

The RS encoder 420 encodes the dual transport stream (TS) having the inserted SRS, and the interleaver 430 interleaves the encoded dual transport stream (TS).

The turbo processor 440 convolutionally encodes the turbo stream in the interleaved dual transport stream (TS) and interleaves the convolutionally encoded turbo stream. Next, the turbo processor 440 reconstructs the dual transport stream (TS) by inserting the interleaved turbo stream to the dual transport stream (TS) again.

The dual transport stream (TS) reconstructed at the turbo processor 440 is trellis-encoded by the trellis/parity corrector 1119. The trellis/parity corrector 1119 performs the initialization prior to the SRS encoding and compensates the parity according to the value changed by the initialization. Specifically, the trellis/parity corrector 1119 can be implemented in the manner as shown in FIG. 18. Since the operation of the trellis/parity corrector 1119 has been described in detail in reference to FIGS. 17 and 18, further description thereof will be omitted for the sake of brevity.

The trellis-encoded dual transport stream (TS) is multiplexed with the segment sync signal and the field sync signal by the MUX 460. Operations the pilot inserter 470, the pre-equalizer 480, the VSB modulator 490, and the RF modulator 495 are the same as those in the FIGS. 14, and their detailed description will be omitted for brevity.

FIG. 26 is a block diagram of a digital broadcasting reception system according to an embodiment of the present invention. Referring to FIG. 26, the digital broadcasting reception system includes a demodulator 1901, an equalizer 1903, a first processor 1900, and a second processor 1950.

The demodulator 1901 detects the synchronization according to the sync signals added to the baseband signal of the received dual transport stream (TS), and conducts the demodulation. The equalizer 1903 is responsible to remove the interference of the received symbol by equalizing the demodulated dual transport stream (TS) and compensating the channel distortion due to the channel multi-path.

The first processor 1900 includes a Viterbi decoder 1905, a first deinterleaver 1907, a first RS decoder 1909, and a first derandomizer 1911. The Viterbi decoder 1905 can correct an error in the normal stream of the equalized dual transport stream (TS), decode the error-corrected symbol, and output the symbol packet. The decoded packet can rearrange the packet spread by the first deinterleaver 1915. An error in the deinterleaved packet is corrected through the first RS decoder 1909, and the corrected packet is derandomized by the first derandomizer 1911. Therefore, the normal stream of the dual transport stream (TS) is restored.

The second processor 1950 includes a turbo decoder 1913, a second deinterleaver 1915, a parity eliminator 1917, a second derandomizer 1919, and a turbo DE-MUX 1921.

The turbo decoder 1913 turbo-decodes the turbo stream in the equalized dual transport stream (TS). At this time, the turbo decoder 1913 can detect only the turbo stream by demultiplexing the dual transport stream (TS). The normal stream separated through the demultiplexing can be multiplexed with the normal stream output from the Viterbi decoder 1905 by a MUX (not shown) which is separately provided.

Herein, the turbo decoding implies the trellis encoding with respect to the turbo stream of the equalized dual transport stream (TS).

The second deinterleaver 1915 deinterleaves the turbo-decoded turbo stream. The parity eliminator 1917 eliminates the parity added to the deinterleaved turbo stream. The second derandomizer 1919 derandomizes the turbo stream from which the parity is eliminated. The turbo DE-MUX 1921 restores the turbo data by demultiplexing the derandomized turbo stream.

FIG. 27 is a block diagram of an example turbo decoder 1913 shown in FIG. 26. The turbo decoder 1913 of FIG. 27 includes a trellis decoder 2001, an outer deinterleaver 2003, an outer interleaver 2005, an outer MAP decoder 2007, a frame formatter 2009, and a symbol deinterleaver 2011.

The trellis decoder 2001 trellis-decodes the turbo stream in the equalized dual transport stream (TS) and provides the trellis-decoded turbo stream to the turbo deinterleaver 2003. The turbo deinterleaver 2003 deinterleaves the trellis-decoded turbo stream.

The outer MAP decoder 2005 can convolutionally decode the deinterleaved turbo stream. The outer MAP decoder 2005 outputs a soft decision output value or a hard decision output value depending on the result of the convolution decoding. The soft decision and the hard decision are made according to the metric of the turbo stream. For instance, when the metric of the turbo stream is 0.8, the soft decision output value is output. When the metric of the turbo stream is 1, the hard decision output value is output.

The hard decision output value of the outer MAP decoder 2005 is supplied to the frame formatter 2009. In this situation, the hard decision output value implies the turbo stream.

The frame formatter 2009 formats the hard decision turbo stream convolutionally decoded in accordance with the frame of the dual transport stream (TS).

The symbol deinterleaver 2011 can deinterleave the frame-formatted turbo stream from symbols to bytes. The interleaving from symbols to bytes will not be further explained. Please refer to table D5.2 of the ATSC DTV Standard (A/53), the information of which is incorporated by reference herein. Note that the turbo decoder 1913 is operable without the symbol deinterleaver 2011.

When the soft decision output value is output from the outer MAP decoder 2005, the outer interleaver 2005 interleaves the turbo stream and provides the interleaved turbo stream to the trellis decoder 2001. The trellis decoder 2001 trellis-decodes the interleaved turbo stream again and provides the interleaved turbo stream to the deinterleaver 2003. The outer deinterleaver 2003 re-deinterleaves the interleaved turbo stream and provides the deinterleaved turbo stream to the outer MAP decoder 2007. The trellis decoder 2001, the outer deinterleaver 2003, and the outer interleaver 2005 repeatedly perform these operations until the hard decision output value is output from the outer MAP decoder 2005. Therefore, a reliable decoding value can be acquired.

FIG. 28 is a block diagram of a digital broadcasting reception system according to another embodiment of the present invention. As shown in FIG. 28, an erasure decoder 2100 is further added into the second processor 1950 of the digital broadcasting reception system shown in FIG. 27.

In case that the TS generator 300 or 500 of the digital broadcasting transmission system includes the erasure encoder 350 as shown in FIG. 8, an erasure decoder 2100 can be added to the digital broadcasting reception system accordingly. Hence, after the erasure decoding is conducted for the noise removal, the turbo stream is restored. Since the other elements are the same as in FIG. 27, descriptions thereof will be omitted for the sake of brevity. Meanwhile, in the digital broadcasting reception system of FIGS. 26 and 28, the second processor 1950 may include a RS decoder (not shown) which RS-decode the deinterleaved turbo stream.

FIG. 29 is a block diagram of a digital broadcasting reception system according to still another embodiment of the present invention. As shown in FIG. 29, the digital broadcasting reception system includes a demodulator 2201, an equalizer 2203, a Viterbi decoder 2205, a turbo decoder 2207, a turbo inserter 2209, a deinterleaver 2211, a RS decoder 2213, a derandomizer 2215, and a turbo DE-MUX 2217.

The demodulator 2201 detects the synchronization according to the sync signals added to the baseband signal of the received dual transport stream (TS), and performs the demodulation. The equalizer 2203 compensates the channel distortion due to the channel multipath by equalizing the demodulated dual transport stream (TS). The Viterbi decoder 2205 corrects an error in the equalized dual transport stream (TS) and decodes the error-corrected symbol.

The turbo decoder 2207 turbo-decodes only the turbo stream of the equalized dual transport stream (TS). The turbo decoder 2207 can be implemented in the manner as shown in FIG. 27, and will not be further explained. The turbo inserter 2209 inserts the dual transport stream (TS) turbo-decoded by the turbo decoder 2207 into the Viterbi-decoded dual transport stream (TS). In doing so, the turbo stream can be extracted from the turbo-decoded turbo TS and inserted into a region corresponding to the turbo stream of the Viterbi-decoded dual transport stream (TS). The region corresponding to the turbo stream may be part or all of the packet AF.

The deinterleaver 2211 deinterleaves the dual transport stream (TS) having the inserted turbo stream. The RS decoder 2213 corrects error by decoding the deinterleaved packet. The derandomizer 2215 derandomizes the error-corrected packet. The turbo DE-MUX 2217 restores the normal stream and the turbo stream by demultiplexing the derandomized packet.

FIGS. 30A and 30B are block diagrams of the turbo DE-MUX 2217 according to embodiments of the present invention. As shown in FIG. 30A, the turbo DE-MUX 2217 includes a TS DE-MUX 2301, a deinterleaver 2302, a condenser 2303, a RS decoder 2304, and first and second SYNC inserters 2305 and 2306.

The TS DE-MUX 2301 separates the normal stream and the turbo stream by demultiplexing the derandomized packet. The normal stream demultiplexed at the TS DE-MUX 2301 is restored to the normal stream of 188 bytes by inserting a sync signal by the first SYNC inserter 2305.

The deinterleaver 2302 deinterleaves the demultiplexed turbo stream. The condenser 2303 removes an empty region (placeholder) in the deinterleaved turbo stream. The empty region is generated by the duplicator of the TS generator 300 or 500 in the digital broadcasting transmission system, for inserting the parity in the RS encoding. If the empty region is generated at ¼ or ½ rates, the turbo stream can be reduced by ¼ or ½ rates.

The RS decoder 2304 decodes the turbo stream from which the empty region is removed. The second SYNC inserter 2306 restores the turbo stream of 188 bytes by inserting a sync signal (SYNC) to the decoded turbo stream. As explained earlier in FIG. 6, when the sync signal of the turbo stream is eliminated in the generation of the dual transport stream (TS), it is necessary to insert the sync signal at the second SYNC inserter 2306 to regenerating the turbo stream.

The turbo DE-MUX 2217 of FIG. 30B includes a TS DE-MUX 2301, a deinterleaver 2302, a condenser 2303, a RS decoder 2304, a first SYNC inserter 2305, and a SYNC detector 2307. Differently from FIG. 6, the sync signal of the turbo stream may not be removed in the generation of the dual transport stream (TS). In this situation, since the sync signal for the turbo stream is received together, there is no need to insert the sync signal differently from FIG. 30A.

The SYNC detector 2307 receives the turbo stream from which the empty region is eliminated, checks the sync signal value 0×47 of the received turbo streams, and outputs 187 bytes after the sync signal to the RS decoder 2304. The sync signal value 0×47 represents the value of the sync signal in one packet, and one packet consists of 187 bytes, excluding the 1-byte sync signal, of the 188 bytes. Thus, it is preferred to detect from the sync signal value to the 187 bytes.

The RS decoder 2304 corrects error of the 188-byte turbo stream from which the sync signal is detected, and then restores the turbo stream.

FIG. 31 is a block diagram of a digital broadcasting reception system according to yet another embodiment of the present invention. As shown in FIG. 31, it can be seen that the digital broadcasting reception system is constructed such that an erasure decoder 2400 is additionally added to the digital broadcasting reception system shown in FIG. 29.

In case that the TS generator 300 or 500 of the digital broadcasting transmission system is implemented including the erasure encoder 350 as shown in FIG. 8, an erasure decoder 2400 can be added to the digital broadcasting reception system accordingly. Hence, after the erasure decoding for the noise removal, the turbo stream is restored. Since the other elements are like with those in FIG. 29, descriptions thereof are omitted.

FIG. 32 is a flowchart for outlining a digital broadcasting signal transmission method according to an embodiment of the present invention. Referring to FIG. 32, first, the dual transport stream (TS) is constructed my multiplexing the normal stream and the turbo stream at operation S2501. Specifically, when the turbo stream is received from an internal or external module, after the encoding and/or interleaving is carried out, a second parity insertion region for inserting the parity is generated. At this time, the erasure encoding for the turbo stream may be additionally performed.

Next, the dual transport stream (TS) having the second parity insertion region is randomized at operation S2503. A first parity insertion region for inserting the parity is provided in the randomized dual transport stream (TS) for the error correction at S2505, and the dual transport stream (TS) is interleaved at operation S2507. Next, the turbo processing is conducted to the turbo stream of the interleaved dual transport stream (TS) at operation S2509. After the turbo processing, the dual transport stream (TS) is encoded by inserting the first parity insertion region at operation S2513, and interleaved at operation S2515.

Next, the interleaved dual transport stream (TS) is trellis-encoded at operation S2517. The trellis-encoded dual transport stream (TS), the segment sync signal and the field sync signal are multiplexed at operation S2519. After passing through the VSB modulation and the RF conversion, the dual transport stream (TS) is transmitted at operation S2521.

FIG. 33 is a flowchart for outlining a digital broadcasting transmission signal processing method according to another embodiment of the present invention. As shown in FIG. 33, the dual transport stream (TS) is constructed at operation S3301, randomized at operation S3302, and then RS-encoded at operation S3303.

Next, after interleaving the dual transport stream TS at operation S3304, only the turbo stream passes through the turbo processing at operation S3305. Since the turbo processing has been illustrated already, its description is omitted.

After the dual transport stream (TS) including the turbo-processed turbo stream is trellis-encoded, the parity error due to the turbo processing is compensated at operation S3306. The dual transport stream (TS) is multiplexed to add the sync signal at operation S3307, modulated and transmitted at operation S3308. As shown in FIG. 33, the digital broadcasting signal can be transmitted more simply than the digital broadcasting transmission signal processing method shown in FIG. 32.

FIG. 34 is a flowchart for outlining a turbo processing method according to an embodiment of the present invention. As shown in FIG. 34, after the dual transport stream (TS) is interleaved by the symbol at operation S2601, the turbo stream is detected by demultiplexing the same at operation S2603. Next, the dual transport stream (TS) is turbo-encoded by inserting the parity in the second parity insertion region provided in the detected turbo stream at operation S2605. The encoded turbo stream is interleaved at operation S2607, the dual transport stream (TS) is reconstructed by multiplexing the dual transport stream (TS) at operation S2609. The reconstructed dual transport stream (TS) is deinterleaved by the symbol at operation S2611. In doing so, the symbol interleaving at operation S2601 and the symbol deinterleaving at operation S2611 can be omitted.

FIG. 35 is a flowchart for outlining a digital broadcasting signal reception method according to one embodiment of the present invention. In FIG. 35, when the dual transport stream (TS) is received, the received dual transport stream (TS) is demodulated at operation S2701, and passes through the channel equalization at operation S2703.

Next, the normal stream and the turbo stream are separated and decoded, respectively. In more detail, the normal stream is Viterbi-decoded at operation S2705, deinterleaved at operation S2707, and then RS-decoded at operation S2709. Next, the normal stream packet is restored by derandomizing the RS-decoded normal stream at operation S2711. The normal stream processing method can be performed by using the existing reception system.

The turbo stream is turbo-decoded at operation S2713. The turbo-decoded turbo stream is then deinterleaved at operation S2715. After removing the parity at operation S2717, the turbo steam is derandomized at operation S2719. Next, the turbo stream packet is restored by demultiplexing the derandomized turbo stream at operation S2721.

In case that the erasure encoding is performed in the digital broadcasting signal transmission process, it is possible to additionally conduct the erasure decoding of the restored turbo stream packet.

FIG. 36 is a flowchart for outlining a turbo decoding method according to an embodiment of the present invention. Referring to FIG. 36, the turbo stream of the dual transport stream (TS) is trellis-decoded at operation S2801. The trellis-decoded turbo stream is outer-deinterleaved at operation S2803, and then outer-decoded at operation S2807.

When the hard decision output value is output through the outer decoding, the hard decision turbo stream is formatted in accordance with the frame of the dual transport stream (TS) at operation S2809, and symbol-interleaved at operation S2811.

By contrast, when the soft decision output value is output through the outer decoding, the outer interleaving is performed at operation S2805. The outer-interleaved turbo stream passes through the trellis decoding and the outer deinterleaving at operation S2801 and at operation S2803. Therefore, the reliable hard decision turbo stream can be acquired.

FIG. 37 is a flowchart for outlining a turbo demultiplexing processing method according to one embodiment of the present invention. Referring to FIG. 37, the turbo steam and the normal stream are separated by demultiplexing the dual transport stream (TS) at operation S3601. After deinterleaving the turbo stream at operation S3602, empty regions, that is, placeholders are eliminated at operation S3603.

Next, the turbo stream is RS-decoded at operation S3604, the turbo stream packet is restored by inserting sync signals at operation S3605. As to the demultiplexed normal stream, the normal stream packet is restored by inserting sync signals at operation S3605.

As set forth above, the method for robustly processing and transmitting the digital broadcasting transport stream (TS), the digital broadcasting transmission and reception systems, and the signal processing methods thereof aim to improve reception performance of a terrestrial-wave DTV system in the U.S., in accordance with the ATSC VSB through the information exchange and the mapping with respect to the dual transport stream (TS) including the normal stream and the turbo stream. Therefore, the digital broadcasting transmission system of the present invention can have the compatibility with the existing normal data transmission system and improve the reception performance in diverse reception environments. Turbo stream as described meets the demand of ATSC and offers a robust and independent stream together with the standard normal stream while compatible with the ATSC VSB. As a result, various example embodiments of a digital broadcasting transmission and reception system according to the present invention can advantageously be used in mobile and handheld broadcasting applications requiring a high robustness in the performance without being affected by multi-path fading channels, while remaining backward compatible with the current digital television (DTV) systems.

Various components of the digital broadcasting transmission system, as shown in FIG. 3, FIG. 4, FIG. 9, the digital broadcasting transmission system, as shown in FIG. 14, FIG. 17, FIG. 23 and FIG. 25, and, likewise, various components of the digital broadcast reception system, as shown in FIG. 26, FIG. 28, FIG. 29 and FIG. 31, can be implemented in hardware, such as, for example, an application specific integrated circuit (ASIC); however, where appropriate, software, hardware, or a combination thereof can be utilized. In particular, software modules can be written, via a variety of software languages, including C, C++, Java, Visual Basic, and many others. These software modules may include data and instructions which can also be stored on one or more machine-readable storage media, such as dynamic or static random access memories (DRAMs or SRAMs), erasable and programmable read-only memories (EPROMs), electrically erasable and programmable read-only memories (EE-PROMs) and flash memories; magnetic disks such as fixed, floppy and removable disks; other magnetic media including tape; and optical media such as compact discs (CDs) or digital video discs (DVDs). Instructions of the software routines or modules may also be loaded or transported into the wireless cards or any computing devices on the wireless network in one of many different ways. For example, code segments including instructions stored on floppy discs, CD or DVD media, a hard disk, or transported through a network interface card, modem, or other interface device may be loaded into the system and executed as corresponding software routines or modules. In the loading or transport process, data signals that are embodied as carrier waves (transmitted over telephone lines, network lines, wireless links, cables, and the like) may communicate the code segments, including instructions, to the network node or element. Such carrier waves may be in the form of electrical, optical, acoustical, electromagnetic, or other types of signals.

While there have been illustrated and described what are considered to be example embodiments of the present invention, it will be understood by those skilled in the art and as technology develops that various changes and modifications, may be made, and equivalents may be substituted for elements thereof without departing from the true scope of the present invention. Many modifications, permutations, additions and sub-combinations may be made to adapt the teachings of the present invention to a particular situation without departing from the scope thereof. Accordingly, it is intended, therefore, that the present invention not be limited to the various example embodiments disclosed, but that the present invention includes all embodiments falling within the scope of the appended claims.

The invention claimed is:

1. A digital broadcasting system comprising:
   a transmission system to transmit a processed dual transport stream in the form of packets via a transmission channel, the processed dual transport stream comprising an encoded erasure-encoded turbo stream and an encoded normal stream; and
   a reception system to receive the processed dual transport stream in the form of packets from the transmission channel;
   wherein the transmission system comprises:
      a transport stream generator to generate a dual transport stream by multiplexing an erasure-encoded turbo stream and a normal stream; and
      an exciter to detect the erasure-encoded turbo stream from the dual transport stream, encode the detected turbo stream, stuff the encoded turbo stream into the dual transport stream, process the dual transport stream stuffed with the encoded turbo stream, and transmit the processed dual transport stream.

2. The digital broadcasting system of claim 1, wherein the exciter comprises:
   a randomizer to randomize the dual transport stream;
   a parity region generator to provide a first parity insertion region in the randomized dual transport stream;
   a first interleaver to interleave the dual transport stream having the first parity insertion region;
   a turbo processor to detect the erasure-encoded turbo stream from the interleaved dual transport stream, encode the detected turbo stream, and stuff the encoded turbo stream into the dual transport stream;
   a deinterleaver to deinterleave the dual transport stream stuffed with the encoded turbo stream; and
   a transmitter to process the deinterleaved dual transport stream and transmit the processed dual transport stream.

3. The digital broadcasting system of claim 2, wherein the transport stream generator comprises:
   an erasure encoder to receive an input turbo stream and erasure-encode the input turbo stream to generate the erasure-encoded turbo stream;
   a duplicator to provide a second parity insertion region in the erasure-encoded turbo stream; and
   a service multiplexer to generate the dual transport stream by multiplexing the erasure-encoded turbo stream having the second parity insertion region and the normal stream.

4. The digital broadcasting system of claim 3, wherein the transport stream generator further comprises:
   a first Reed-Solomon (RS) encoder to RS-encode the erasure-encoded turbo stream; and
   an interleaver to interleave the RS-encoded turbo stream and output the interleaved turbo stream to the duplicator.

5. The digital broadcasting system of claim 3, wherein the turbo processor comprises:
   a transmission demultiplexer to detect the erasure-encoded turbo stream from the interleaved dual transport stream;
   an outer encoder to insert a parity for the detected turbo stream into the second parity insertion region of the detected turbo stream;
   an outer interleaver to interleave the turbo stream having the inserted parity; and
   a transmission multiplexer to reconstruct the dual transport stream by stuffing the interleaved turbo stream into the dual transport stream and output the reconstructed dual transport stream to the deinterleaver.

6. The digital broadcasting system of claim 5, wherein the turbo processor further comprises:
a byte-symbol converter to convert the interleaved dual transport stream from bytes to symbols and output the converted interleaved dual transport stream to the transmission demultiplexer; and
a symbol-byte converter to convert the reconstructed dual transport stream from symbols to bytes and output the converted reconstructed dual transport stream to the deinterleaver.

7. The digital broadcasting system of claim 2, wherein the transmitter comprises:
a second Reed-Solomon (RS) encoder to encode the deinterleaved dual transport stream by inserting a parity for the dual transport stream into the first parity insertion region of the deinterleaved dual transport stream;
a second interleaver to interleave the RS-encoded dual transport stream;
a trellis encoder to trellis-encode the interleaved dual transport stream;
a multiplexer to add a sync signal to the trellis-encoded dual transport stream; and
a modulator to modulate the dual transport stream having the added sync signal to a signal in a channel band, and transmit the modulated dual transport stream as the processed dual transport stream.

8. The digital broadcasting system of claim 1, wherein the exciter comprises:
a supplementary reference signal (SRS) inserter to receive the dual transport stream generated by the transport stream generator, and insert an SRS into a stuffing region of the dual transport stream;
a Reed-Solomon (RS) encoder to RS-encode the dual transport stream having the inserted SRS;
an interleaver to interleave the RS-encoded dual transport stream;
a turbo processor to detect the erasure-encoded turbo stream from the interleaved dual transport stream, encode the detected turbo stream, stuff the encoded turbo stream into the interleaved dual trans port stream, and compensate the interleaved dual transport stream stuffed with the encoded turbo stream for a parity error resulting from the encoding of the detected turbo stream; and
a trellis/parity corrector to trellis-encode the parity-compensated dual transport stream.

9. The digital broadcasting system of claim 8, wherein the exciter further comprises a randomizer to randomize the dual transport stream generated by the transport stream generator, and output the randomized dual transport stream to the SRS inserter.

10. The digital broadcasting system of claim 8, wherein the transport stream generator comprises:
a duplicator to receive the erasure-encoded turbo stream and provide a parity insertion region in the erasure-encoded turbo stream; and
a service multiplexer to generate the dual transport stream by multiplexing the erasure-encoded turbo stream having the parity insertion region and the normal stream.

11. The digital broadcasting system of claim 10, wherein the transport stream generator further comprises:
an RS encoder to RS-encode the erasure-encoded turbo stream; and
an interleaver to interleave the RS-encoded turbo stream and output the interleaved turbo stream to the duplicator.

12. The digital broadcasting system of claim 8, wherein the turbo processor comprises:
a turbo stream detector to detect the erasure-encoded turbo stream from the interleaved dual transport stream;
an outer encoder to insert a parity for the detected turbo stream into a parity insertion region of the detected turbo stream;
an outer interleaver to interleave the turbo stream having the inserted parity;
a turbo stream stuffer to reconstruct the interleaved dual transport stream by inserting the interleaved turbo stream into the interleaved dual transport stream; and
a parity compensator to regenerate a parity for the reconstructed dual transport stream and add the regenerated parity to the reconstructed dual transport stream to compensate for the parity error resulting from the encoding of the detected turbo stream.

13. The digital broadcasting system of claim 12, wherein the turbo processor further comprises:
a byte-symbol converter to convert the interleaved dual transport stream from bytes to symbols and output the converted interleaved dual transport stream to the turbo stream detector; and
a symbol-byte converter to convert the reconstructed dual transport stream having the added regenerated parity from symbols to bytes and output the converted reconstructed dual transport stream to the trellis/parity corrector.

14. The digital broadcasting system of claim 8, wherein the exciter further comprises:
a multiplexer to add a sync signal to the trellis-encoded dual transport stream; and
a transmitter to transmit the dual transport stream having the added sync signal.

15. The digital broadcasting system of claim 14, wherein the transmitter comprises:
a pilot inserter to insert a pilot into the dual transport stream having the added sync signal;
a pre-equalizer to equalize the dual transport stream having the inserted pilot;
a vestigial-sideband (VSB) modulator to VSB-modulate the equalized dual transport stream; and
a radio-frequency (RF) modulator to RF-modulate the VSB-modulated dual transport stream to a signal in an RF channel band, and transmit the RF-modulated dual transport stream.

16. The digital broadcasting system of claim 8, wherein the trellis/parity corrector carries out an initialization prior to trellis-encoding the SRS in the parity-compensated dual transport stream, and compensates for a parity error caused by the initialization.

17. The digital broadcasting system of claim 16, wherein the trellis/parity corrector comprises:
a trellis encoder block to trellis-encode the parity-compensated dual transport stream, carry out the initialization when an external control signal corresponding to an initialization period is received, and output a prestored value as an initialization value;
a RS re-encoder to generate a parity corresponding to the initialization value; and
an adder to correct the parity of the parity-compensated dual transport stream by adding the parity generated by the RS re-encoder to the parity-compensated dual transport stream.

18. The digital broadcasting system of claim 17, wherein the trellis/parity corrector further comprises:

a multiplexer to multiplex the parity-compensated dual transport stream from the turbo processor and the parity-compensated dual transport stream having the added parity from the adder, and output a multiplexed parity-compensated dual transport streams to the trellis encoder block to be trellis-encoded by the trellis encoder block; and a map to map the trellis-encoded dual transport stream trellis-encoded by the trellis encoder block to symbols, and output the mapped dual transport stream.

19. The digital broadcasting system of claim 18, wherein the trellis encoder block comprises a plurality of trellis encoders each comprising:

a first memory, a second memory, and a third memory to store values;

a first multiplexer to select and output a value of one of two bits of the parity-compensated dual transport stream positioned before the SRS in the parity-compensated dual transport stream when the external control signal is not received, and select and output the value stored in the first memory when the external control signal is received;

a first adder to add the output value of the first multiplexer and the value stored in the first memory to obtain a first sum value, store the first sum value in the first memory, and output the first sum value;

a second multiplexer to select and output a value of another one of the two bits of the parity compensated dual transport stream positioned before the SRS in the parity-compensated dual transport stream when the external control signal is not received, and select and output the value stored in the second memory when the external control signal is received; and a second adder to add the output value of the second multiplexer and the value stored in the second memory to obtain a second sum value, and store the second sum value in the third memory; and wherein:

the value stored in the third memory is shifted to the second memory and stored in the second memory when the second sum value is stored in the third memory, and the value stored in the first memory and the value stored in the second memory are output to the RS re-encoder as the initialization value.

20. The digital broadcasting system of claim 1, wherein the reception system comprises:

a demodulator to receive the processed dual transport stream from the transmission channel and demodulate the received dual transport stream;

an equalizer to equalize the demodulated dual transport stream, the equalized dual transport stream comprising the encoded erasure-encoded turbo stream and the encoded normal stream;

a first processor to output a normal stream packet by decoding the encoded normal stream of the equalized dual transport stream; and a second processor to output a turbo stream packet by decoding the encoded erasure-encoded turbo stream of the equalized dual transport stream, and erasure-decoding the decoded erasure-encoded turbo stream.

21. The digital broadcasting system of claim 20, wherein the first processor comprises:

a Viterbi decoder to correct errors in the encoded normal stream of the equalized dual transport stream, and decode the error-corrected encoded normal stream;

a first deinterleaver to deinterleave the decoded normal stream decoded by the Viterbi decoder;

a first Reed-Solomon (RS) decoder to correct errors in the deinterleaved normal stream deinterleaved by the first deinterleaver; and a derandomizer to restore the normal stream packet by derandomizing the error-corrected normal stream error-corrected by the first RS decoder.

22. The digital broadcasting system of claim 21, wherein the second processor comprises:

a turbo decoder to turbo-decode the encoded erasure-encoded turbo stream of the equalized dual transport stream;

a second deinterleaver to deinterleave the turbo-decoded turbo stream;

a parity eliminator to eliminate parity from the deinterleaved turbo stream;

a derandomizer to derandomize the turbo stream from which the parity has been eliminated;

a turbo demultiplexer to restore a turbo stream packet by demultiplexing the derandomized turbo stream; and an erasure decoder to erasure-decode the restored turbo stream packet.

23. The digital broadcasting system of claim 22, wherein the turbo decoder comprises:

a trellis decoder to trellis-decode the encoded erasure-encoded turbo stream of the equalized dual transport stream;

an outer deinterleaver to deinterleave the trellis-decoded turbo stream;

an outer map decoder to decode the deinterleaved turbo stream, and output a soft decision output value or a hard decision output value based on a result of the decoding;

an outer interleaver to interleave the decoded turbo stream decoded by the outer map decoder and output the interleaved turbo stream to the trellis decoder when the soft decision output value is output from the outer map decoder;

a frame formatter to frame-format the decoded turbo stream decoded by the outer map decoder when the hard decision output value is output from the outer map decoder; and a symbol deinterleaver to convert the frame-formatted turbo stream from symbols to bytes and output the converted turbo stream to the second deinterleaver as the turbo-decoded turbo stream.

24. The digital broadcasting system of claim 1, wherein the reception system comprises:

a demodulator to receive the processed dual transport stream from the transmission channel and demodulate the received dual transport stream;

an equalizer to equalize the demodulated dual transport stream, the equalized dual transport stream comprising the encoded erasure-encoded turbo stream and the encoded normal stream;

a Viterbi decoder to decode the encoded normal stream of the equalized dual transport stream and output a Viterbi-decoded dual transport stream;

a turbo decoder to turbo-decode the encoded erasure-encoded turbo stream of the equalized dual transport stream;

a turbo inserter to insert the turbo-decoded turbo stream into the Viterbi-decoded dual transport stream;

a deinterleaver to deinterleave the Viterbi-decoded dual transport stream into which the turbo-decoded turbo stream has been inserted;

a Reed-Solomon (RS) decoder to RS-decode the deinterleaved dual transport stream;

a derandomizer to derandomize the RS-decoded dual transport stream; and a turbo demultiplexer to restore a normal stream packet and a turbo stream packet by demultiplexing the derandomized dual transport stream.

25. The digital broadcasting system of claim 24, wherein the turbo decoder comprises:

a trellis decoder to trellis-decode the encoded erasure-encoded turbo stream of the equalized dual transport stream;

an outer deinterleaver to deinterleave the trellis-decoded turbo stream;

an outer map decoder to decode the deinterleaved turbo stream, and output a soft decision output value or a hard decision output value based on a result of the decoding;

an outer interleaver to interleave the decoded turbo stream decoded by the outer map decoder and output the interleaved turbo stream to the trellis decoder when the soft decision output value is output from the outer map decoder;

a frame formatter to frame-format the decoded turbo stream decoded by the outer map decoder when the hard decision output value is output from the outer map decoder; and a symbol deinterleaver to convert the frame-formatted turbo stream from symbols to bytes and output the converted turbo stream to the turbo inserter as the turbo-decoded turbo stream.

26. The digital broadcasting system of claim 24, wherein the turbo demultiplexer comprises:

a transport stream demultiplexer to output a normal stream and a turbo stream by demultiplexing the derandomized dual transport stream;

a first sync inserter to insert a sync signal into the normal stream output from the transport stream demultiplexer and output the normal stream packet;

a deinterleaver to deinterleave the turbo stream output from the transport stream demultiplexer;

a condenser to remove an empty region in the deinterleaved turbo stream;

an RS decoder to RS-decode the turbo stream from which the empty region has been removed; and a second sync inserter to insert a sync signal into the RS-decoded turbo stream and output the restored turbo stream packet.

27. The digital broadcasting system of claim 24, wherein the turbo demultiplexer comprises:

a transport stream demultiplexer to output a normal stream and a turbo stream by demultiplexing the derandomized dual transport stream;

a sync inserter to insert a sync signal into the normal stream output from the transport stream demultiplexer and output the normal stream packet;

a deinterleaver to deinterleave the turbo stream output from the transport stream demultiplexer;

a condenser to remove an empty region in the deinterleaved turbo stream;

a sync detector to detect a sync signal from the turbo stream from which the empty region has been removed; and an RS decoder to RS-decode a portion of the turbo stream having a predetermined length beginning with the detected sync signal and output the restored turbo stream packet.

28. The digital broadcasting system of claim 24, wherein the reception system further comprises an erasure decoder to erasure-decode the turbo stream packet restored by the turbo demultiplexer.

* * * * *